US012720858B2

(12) United States Patent
Lee et al.

(10) Patent No.: US 12,720,858 B2
(45) Date of Patent: Aug. 25, 2026

(54) THREE-DIMENSIONAL SEMICONDUCTOR DEVICE INCLUDING A LOWER CONNECTION STRUCTURE INCLUDING A CONDUCTIVE PATTERN AND A THROUGH CONDUCTIVE PATTERN

(71) Applicant: SAMSUNG ELECTRONICS CO., LTD., Suwon-si (KR)

(72) Inventors: Dongkyu Lee, Suwon-si (KR); Hyungjoo Na, Suwon-si (KR); Jinchan Yun, Suwon-si (KR); Cheoljin Yun, Suwon-si (KR); Kyuman Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 390 days.

(21) Appl. No.: 18/219,875

(22) Filed: Jul. 10, 2023

(65) Prior Publication Data

US 2024/0162228 A1 May 16, 2024

(30) Foreign Application Priority Data

Nov. 14, 2022 (KR) ........................ 10-2022-0151667

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/014* (2025.01); *H10D 30/43* (2025.01);
(Continued)

(58) Field of Classification Search
CPC ........... H01L 23/5286; H01L 23/5283; H10D 64/254; H10D 84/85; H10D 30/014; H10D 30/43
See application file for complete search history.

(56) References Cited

U.S. PATENT DOCUMENTS 9,673,300 B2 6/2017 Ha et al.
10,685,887 B2 6/2020 Smith et al.
(Continued)

FOREIGN PATENT DOCUMENTS

KR 10-2264656 B1 6/2021
KR 20220122889 A 9/2022

*Primary Examiner* — Davienne N Monbleau
*Assistant Examiner* — Emily Farmer
(74) *Attorney, Agent, or Firm* — Muir Patent Law, PLLC

(57) ABSTRACT

A three-dimensional semiconductor device includes a lower connection structure; a device structure; and an upper connection structure sequentially disposed along a first direction, wherein the device structure includes a substrate on the lower connection structure; first and second source/drain patterns on the substrate; a separation pattern adjacent in a second direction to the source/drain patterns, the second direction being parallel to a bottom surface of the substrate; and a through conductive pattern adjacent in a third direction to the separation pattern, the third direction being parallel to the bottom surface of the substrate and intersecting the second direction, the through conductive pattern connects the lower connection structure and the upper connection structure to each other, and the through conductive pattern is connected either through the lower connection structure to the first source/drain pattern or through the upper connection structure to the second source/drain pattern.

20 Claims, 62 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10D 88/00*** | (2026.01) |

(52) U.S. Cl.
CPC ..... *H10D 30/6729* (2025.01); *H10D 30/6735* (2025.01); *H10D 62/121* (2025.01); *H10D 64/017* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 88/01* (2025.01)

(56) References Cited

U.S. PATENT DOCUMENTS

| | | | | |
|---|---|---|---|---|
| 11,056,487 | B2 | 7/2021 | Yang | |
| 11,063,045 | B2 | 7/2021 | Wu et al. | |
| 11,217,676 | B1 | 1/2022 | Wu et al. | |
| 11,296,082 | B2 | 4/2022 | Chuang et al. | |
| 2020/0328210 | A1 | 10/2020 | Wu et al. | |
| 2021/0035975 | A1* | 2/2021 | Kim | H10D 88/00 |
| 2021/0043522 | A1 | 2/2021 | Chanemougame et al. | |
| 2021/0335690 | A1* | 10/2021 | Huang | H10D 1/20 |
| 2022/0037315 | A1* | 2/2022 | Chuang | H01L 21/76224 |
| 2022/0173039 | A1 | 6/2022 | Yang et al. | |
| 2023/0187510 | A1* | 6/2023 | Xie | H10D 30/6735<br>257/369 |

* cited by examiner

D1 D2 D3

SP4 SP3 DSP SP2 SP1 CH2 CH1

E' E

GC CT GI P6 P5 P4 P3 P2 P1 AP ST 100

GE2 GE1 GE

UCS DS LCS

THREE-DIMENSIONAL SEMICONDUCTOR DEVICE INCLUDING A LOWER CONNECTION STRUCTURE INCLUDING A CONDUCTIVE PATTERN AND A THROUGH CONDUCTIVE PATTERN

CROSS-REFERENCE TO RELATED APPLICATION

This U.S. nonprovisional application claims priority under 35 U.S.C. § 119 to Korean Patent Application No. 10-2022-0151667 filed on Nov. 14, 2022, in the Korean Intellectual Property Office, the disclosure of which is hereby incorporated by reference in its entirety.

BACKGROUND

1. Field

Embodiments relate to a three-dimensional semiconductor device and a method of fabricating the same.

2. Description of the Related Art

A semiconductor device may include an integrated circuit including metal oxide semiconductor field effect transistors (MOSFETs). As sizes and design rules of the semiconductor device are gradually decreased, sizes of the MOSFETs may also be increasingly scaled down.

SUMMARY

The embodiments may be realized by providing a three-dimensional semiconductor device including a lower connection structure; a device structure; and an upper connection structure, the lower connection structure, the device structure, and the upper connection structure being sequentially disposed along a first direction, wherein the device structure includes a substrate on the lower connection structure; a first source/drain pattern and a second source/drain pattern that are sequentially disposed along the first direction on the substrate; a separation pattern adjacent in a second direction to the first source/drain pattern and the second source/drain pattern, the second direction being parallel to a bottom surface of the substrate; and a through conductive pattern adjacent in a third direction to the separation pattern, the third direction being parallel to the bottom surface of the substrate and intersecting the second direction, the through conductive pattern connects the lower connection structure and the upper connection structure to each other, and the through conductive pattern is connected either through the lower connection structure to the first source/drain pattern or through the upper connection structure to the second source/drain pattern.

The embodiments may be realized by providing a three-dimensional semiconductor device including a lower connection structure; a device structure; and an upper connection structure, the lower connection structure, the device structure, and the upper connection structure being sequentially disposed along a first direction, wherein the device structure includes a substrate on the lower connection structure; a source/drain pattern on the substrate; a channel pattern connected in a second direction to the source/drain pattern, the second direction being parallel to a bottom surface of the substrate; a gate electrode crossing the channel pattern in a third direction, the third direction being parallel to the bottom surface of the substrate and intersecting the second direction; a separation pattern spaced apart in the second direction from the source/drain pattern; and a through conductive pattern adjacent in the third direction to the separation pattern, the through conductive pattern connects the lower connection structure and the upper connection structure to each other, and the through conductive pattern includes a material the same as at least a portion of a material of the gate electrode.

The embodiments may be realized by providing a three-dimensional semiconductor device including a lower connection structure; a device structure; and an upper connection structure, the lower connection structure, the device structure, and the upper connection structure being sequentially disposed along a first direction, wherein the device structure includes a substrate on the lower connection structure; a plurality of source/drain patterns spaced apart from each other in a second direction and a third direction that are parallel to a bottom surface of the substrate, the second and third directions intersecting each other; a plurality of gate electrodes spaced apart from each other in the second direction and the third direction and between ones of the plurality of source/drain patterns that neighbor each other in the second direction; a plurality of separation patterns spaced apart from each other and between other ones of the plurality of source/drain patterns that neighbor each other in the second direction; and a plurality of through conductive patterns between the separation patterns that neighbor each other in the third direction, and the through conductive patterns connect the lower connection structure and the upper connection structure to each other.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
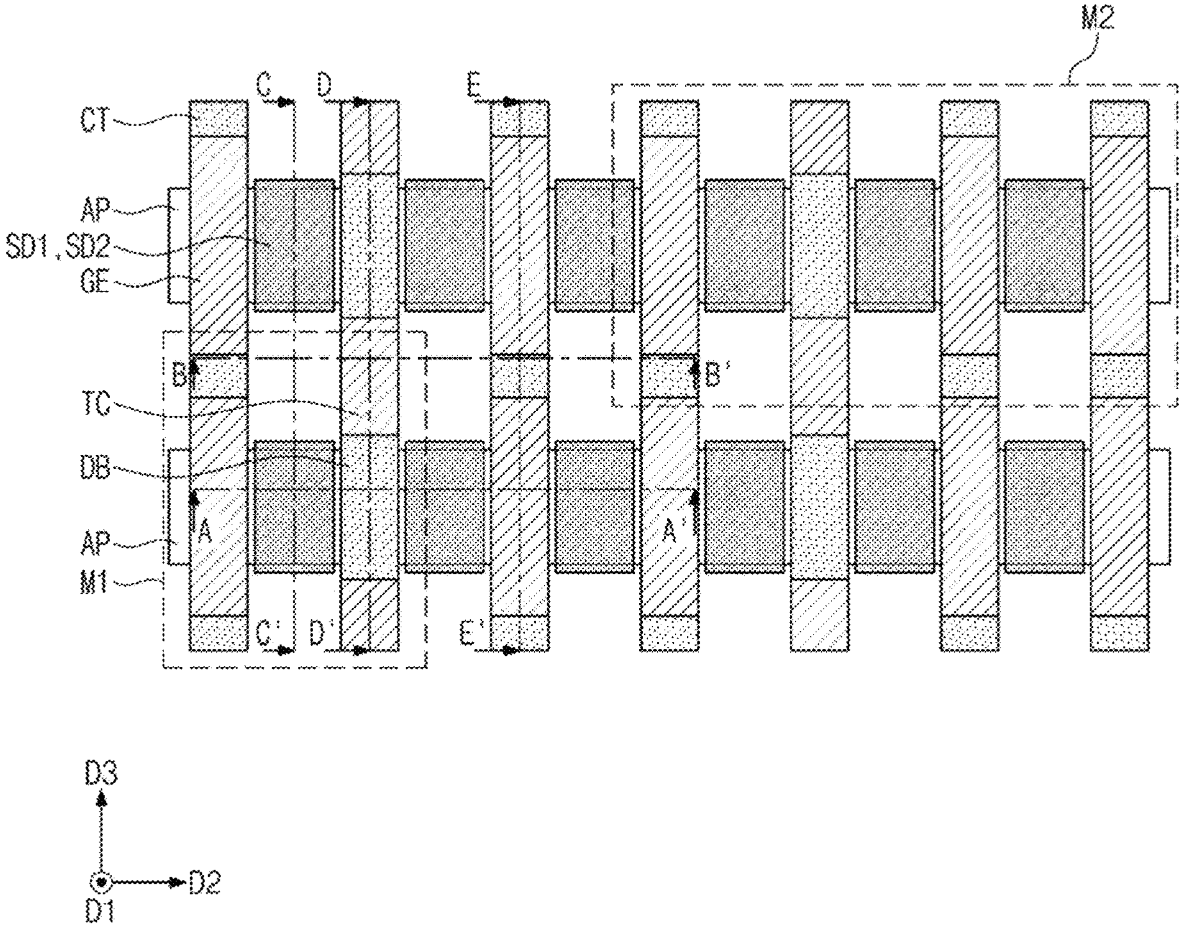
FIG. 1 illustrates a plan view showing a three-dimensional semiconductor device according to some embodiments.

FIG. 1 illustrates a plan view showing a three-dimensional semiconductor device according to some embodiments. FIGS. 2A, 2B, 2C, 2D, and 2E illustrate cross-sectional views respectively taken along lines A-A', B-B', C-C', D-D', and E-E' of FIG. 1, showing a three-dimensional semiconductor device according to some embodiments.

Referring to FIGS. 1 and 2A to 2E, a three-dimensional semiconductor device according to some embodiments may include a lower connection structure LCS, a device structure DS, and an upper connection structure UCS that are sequentially disposed along a first (e.g., vertical) direction D1. In an implementation, the device structure DS may be between the lower connection structure LCS and the upper connection structure UCS. The device structure DS may have a bottom surface in contact with the lower connection structure LCS, and the bottom surface of the device structure DS may be defined as surfaces located at substantially the same level as that of a bottom surface of a substrate 100, which will be discussed below (e.g., the "level" being measured from a same reference point in the first direction D1). The device structure DS may have a top surface in contact with the upper connection structure UCS, and the top surface of the device structure DS may be defined as surfaces located at substantially the same level as that of a top surface of a gate capping pattern GC, which will be discussed below.

The device structure DS may include logic cells. In an implementation, the device structure DS may include logic cells including a stacked transistor. The following will discuss in detail properties of the device structure DS including logic cells and lower and upper connection structures LCS and UCS having the device structure DS therebetween.

The device structure DS may include a substrate 100 on the lower connection structure LCS. The substrate 100 may be a compound semiconductor substrate or a semiconductor substrate including silicon (Si), germanium (Ge), or silicon-germanium (SiGe). In an implementation, the substrate 100 may be a silicon substrate. The substrate 100 may have a bottom surface perpendicular to the first direction D1.

The substrate 100 may be provided thereon with an active pattern AP defined by a device isolation pattern ST. The active pattern AP may be a portion of the substrate 100, e.g., a portion protruding in the first direction D1 of the substrate 100. In this description, the active pattern AP and the substrate 100 will be differently named for descriptive convenience. The active pattern AP may be surrounded by the device isolation pattern ST.

A top surface of the device isolation pattern ST may be located at a level the same as or lower than that of a top surface of the active pattern AP. The device isolation pattern ST may include, e.g., silicon oxide, silicon nitride, or a combination thereof. As used herein, each of "A or B", "at least one of A and B", "at least one A or B", "A, B, or C", "at least one of A, B, and C", and "at least one A, B, or C" are not exclusive terms, and may include one or any possible combination of elements listed in a corresponding one of the expressions mentioned above.

A first active region AR1 and a second active region AR2 may be sequentially provided along the first direction D1 on the substrate 100. One of the first and second active regions AR1 and AR2 may be a PMOSFET region, and the other of the first and second active regions AR1 and AR2 may be an NMOSFET region. The first active region AR1 may be on a bottom tier in the device structure DS. The second active region AR2 may be on a top tier in the device structure DS. PMOS and NMOS field effect transistors of the first and second active regions AR1 and AR2 may be vertically stacked to constitute a three-dimensional stacked transistor.

The PMOS and NMOS field effect transistors of the first and second active regions AR1 and AR2 may be logic transistors included in a logic circuit. In an implementation, an inverter may be constituted by the PMOS and NMOS field effect transistors of the first and second active regions AR1 and AR2. When viewed in plan, the stacked first and second active regions AR1 and AR2 may be positioned between power lines.

The first active region AR1 may include a first channel pattern CH1 and a first source/drain pattern SD1, and each of the first channel pattern CH1 and the first source/drain pattern SD1 may be provided in plural. The first channel pattern CH1 may be between a pair of first source/drain patterns SD1. The pair of first source/drain patterns SD1 may be spaced apart in a second direction D2 from each other across the first channel pattern CH1. The second direction D2 may be parallel to the bottom surface of the substrate 100 (e.g., and perpendicular to the first direction D1). The first channel pattern CH1 may connect the pair of first source/drain patterns SD1 to each other. In an implementation, the first channel pattern CH1 may be connected in the second direction D2 to each of the first source/drain patterns SD1. As used herein, the phrase "A is connected to B" may include not only the meaning that "A is in contact with B", but the meaning that "A is electrically connected to B".

The first channel pattern CH1 may include semiconductor patterns SP1 and SP2 that are stacked along the first direction D1 on the top surface of the active pattern AP. In an implementation, the first channel pattern CH1 may include a first semiconductor pattern SP1 and a second semiconductor pattern SP2 that are sequentially stacked along the first direction D1. In an implementation, three-layered or more multi-layered semiconductor patterns may be stacked. The first and second semiconductor patterns SP1 and SP2 may be spaced apart from each other in the first direction D1. The first and second semiconductor patterns SP1 and SP2 may include, e.g., silicon (Si), germanium (Ge), silicon-germanium (SiGe), or a combination thereof. In an implementation, each of the first and second semiconductor patterns SP1 and SP2 may include crystalline silicon.

The first source/drain pattern SD1 may be on the top surface of the active pattern AP. The first source/drain pattern SD1 may be an epitaxial pattern formed by a selective epitaxial growth (SEG) process. In an implementation, a top surface of the first source/drain pattern SD1 may be at a higher level than that of a top surface of an uppermost one (e.g., the second semiconductor pattern SP2) of the first and second semiconductor patterns SP1 and SP2 of the first channel pattern CH1.

The first source/drain pattern SD1 may be doped with impurities to have a first conductivity type. The first conductivity type may be p-type or n-type. When the first conductivity type is p-type, a transistor on the first active region AR1 may be a PMOSFET. When the first conductivity type is n-type, a transistor on the first active region AR1 may be an NMOSFET. The first source/drain pattern SD1 may include silicon (Si), silicon-germanium (SiGe), or a combination thereof.

Figure 2A:
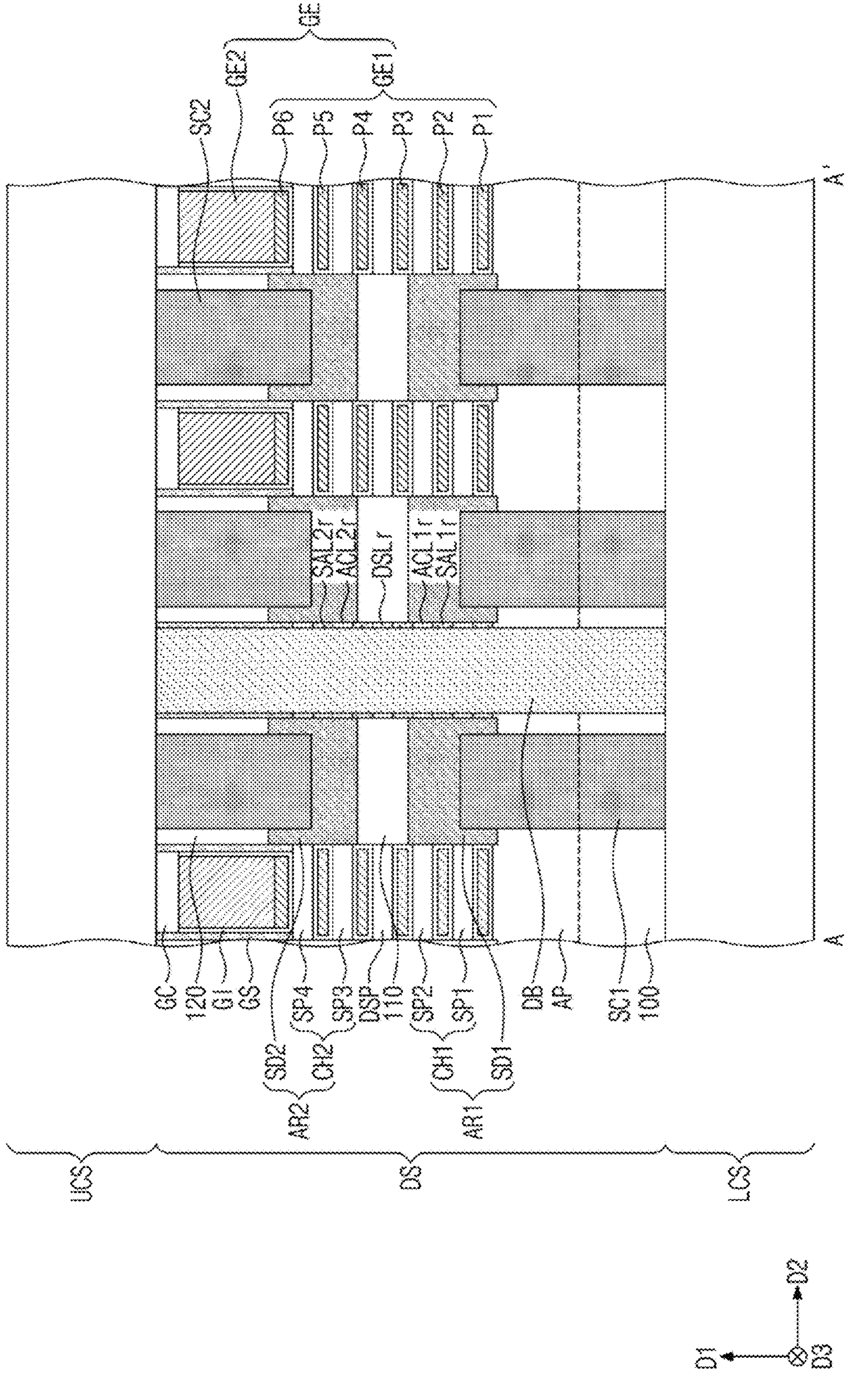
FIGS. 2A, 2B, 2C, 2D, and 2E illustrate cross-sectional views respectively taken along lines A-A', B-B', C-C', D-D', and E-E' of FIG. 1, showing a three-dimensional semiconductor device according to some embodiments.
Figure 2B:
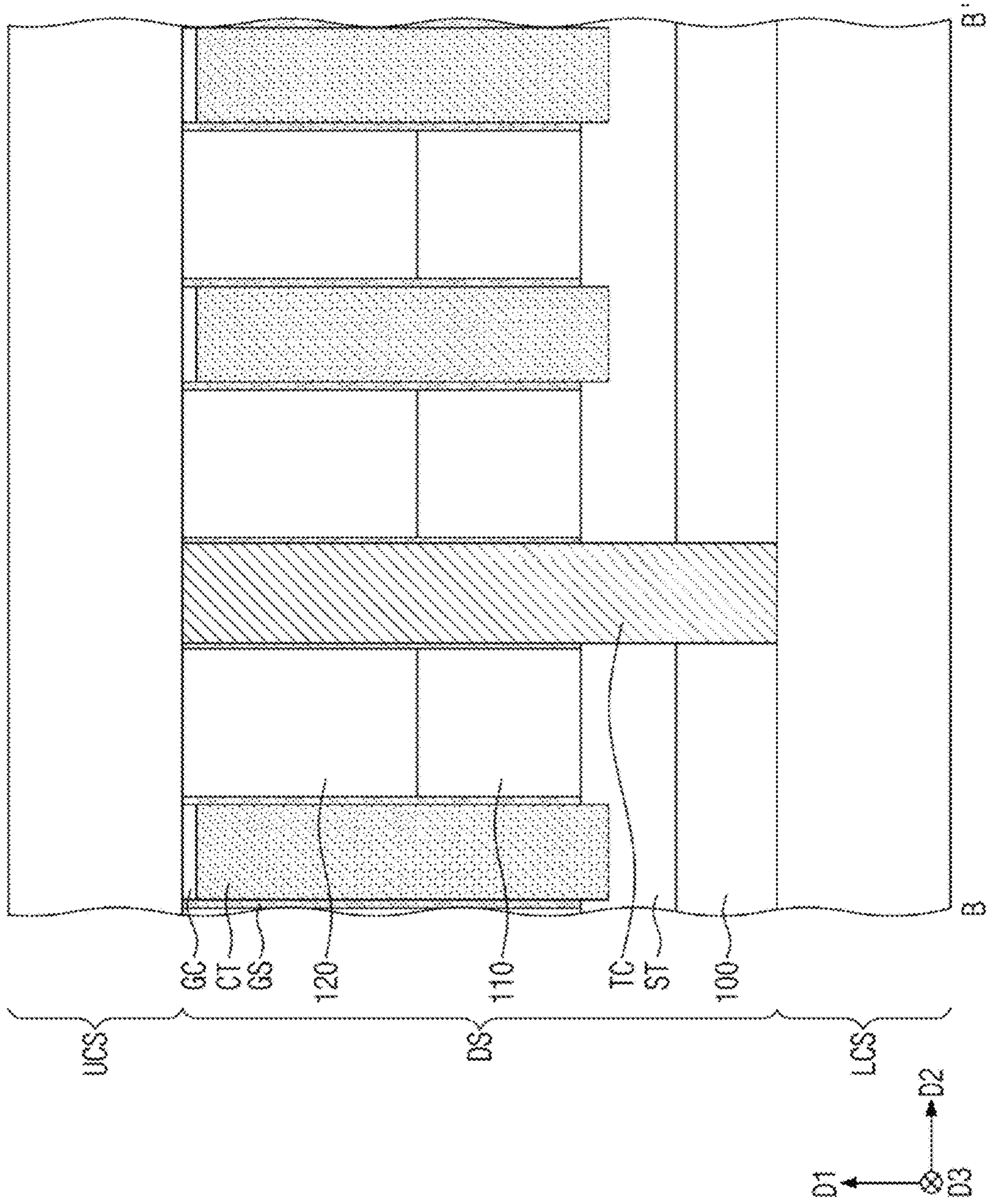
Figure 2C:
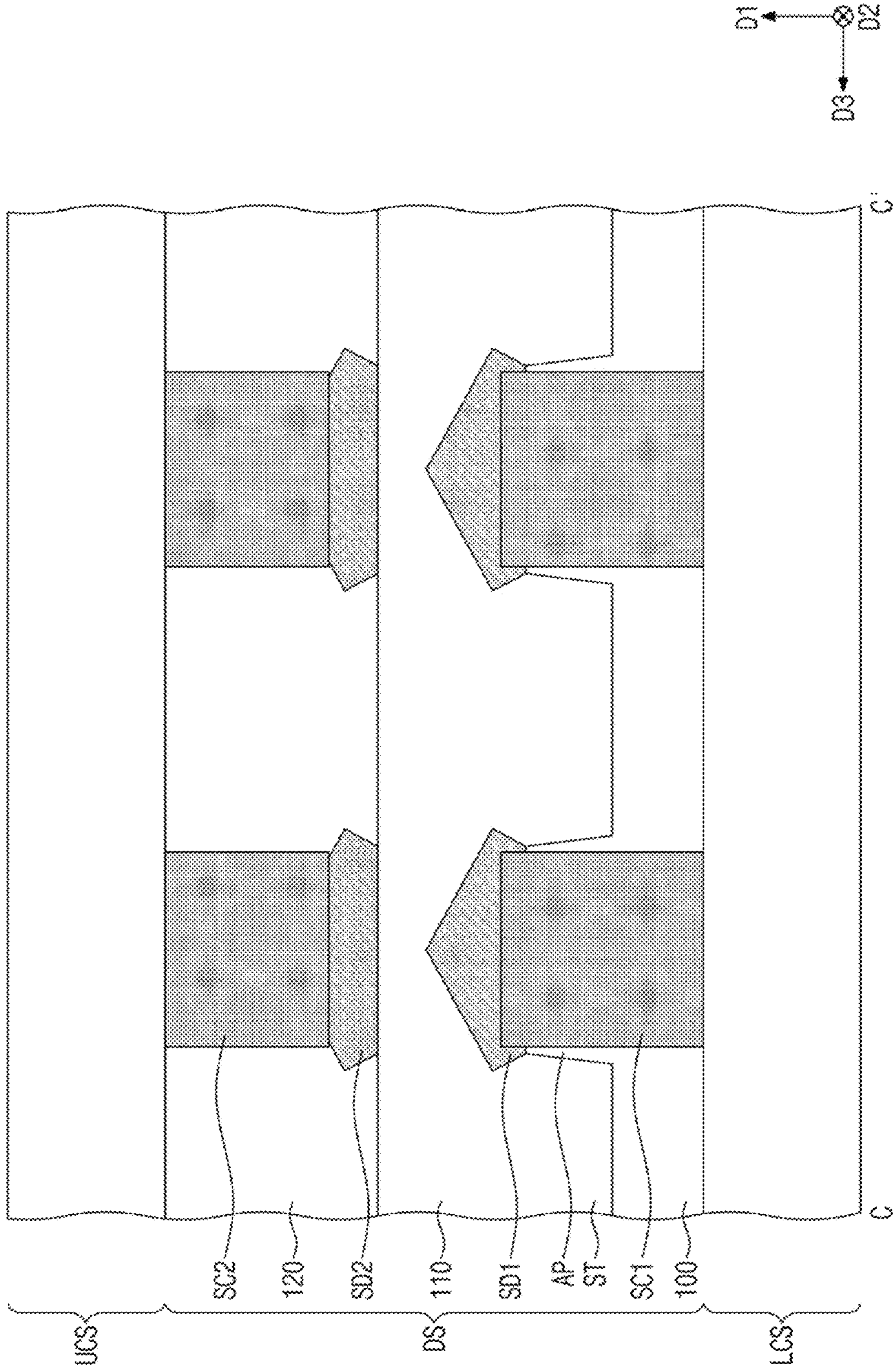

A first conductive contact SC1 may be connected to the first source/drain pattern SD1. In an implementation, as shown in FIG. 2A, the first conductive contact SC1 may be connected to a lower portion of the first source/drain pattern SD1. In an implementation, the first conductive contact SC1 may be connected to the lower connection structure LC S or the upper connection structure UCS. The first conductive contact SC1 may include, e.g., a doped semiconductor, a metal, or a combination thereof. The metal may include, e.g., copper (Cu), aluminum (Al), ruthenium (Ru), cobalt (Co), tungsten (W), or molybdenum (Mo).

The second active region AR2 may include a second channel pattern CH2 and a second source/drain pattern SD2, and each of the second channel pattern CH2 and the second source/drain pattern SD2 may be provided in plural. The second channel pattern CH2 may be between a pair of second source/drain patterns SD2. The pair of second source/drain patterns SD2 may be spaced apart in the second direction D2 from each other across the second channel pattern CH2. The second channel pattern CH2 may connect the pair of second source/drain patterns SD2 to each other. In an implementation, the second channel pattern CH2 may be connected in the second direction to each of the second source/drain patterns SD2.

The second channel pattern CH2 may include semiconductor patterns SP3 and SP4 that are stacked along the first direction D1 on the top surface of the active pattern AP. In an implementation, the second channel pattern CH2 may include a third semiconductor pattern SP3 and a fourth semiconductor pattern SP4 that are sequentially stacked along the first direction D1. In an implementation, three-layered or more multi-layered semiconductor patterns may be stacked. The third and fourth semiconductor patterns SP3 and SP4 may be spaced apart from each other in the first direction D1. Each of the third and fourth semiconductor patterns SP3 and SP4 may include silicon (Si), germanium (Ge), silicon-germanium (SiGe), or a combination thereof. In an implementation, each of the third and fourth semiconductor patterns SP3 and SP4 may include crystalline silicon.

The second source/drain pattern SD2 may be on the first source/drain pattern SD1. The second source/drain pattern SD2 may be an epitaxial pattern formed by a selective epitaxial growth (SEG) process. In an implementation, a top surface of the second source/drain pattern SD2 may be at a higher level than that of a top surface of an uppermost one (e.g., the fourth semiconductor pattern SP4) of the third and fourth semiconductor patterns SP3 and SP4 of the second channel pattern CH2.

The second source/drain pattern SD2 may be doped with impurities to have a second conductivity type. The second conductivity type may be a p-type or n-type conductivity different from the first conductivity type. In an implementation, when the second conductivity type is p-type, a transistor on the second active region AR1 may be a PMOSFET. In this case, the first conductivity type may be n-type, and a transistor on the first active region AR1 may be an NMOSFET. In an implementation, when the second conductivity type is n-type, a transistor on the second active region AR2 may be an NMOSFET. In this case, the first conductivity type may be p-type, and a transistor on the first active region AR1 may be a PMOSFET. The second source/drain pattern SD2 may include silicon (Si), silicon-germanium (SiGe), or a combination thereof.

A second conductive contact SC2 may be connected to the second source/drain pattern SD2. In an implementation, as shown in FIG. 2A, the second conductive contact SC2 may be connected to an upper portion of the second source/drain pattern SD2. In an implementation, the second conductive contact SC2 may be connected to the lower connection structure LC S and/or the upper connection structure UCS. The second conductive contact SC2 may include, e.g., a doped semiconductor, a metal, or a combination thereof. In an implementation, the metal may include, e.g., copper (Cu), aluminum (Al), ruthenium (Ru), cobalt (Co), tungsten (W), or molybdenum (Mo).

A first interlayer dielectric layer 110 may be between the first source/drain pattern SD1 and the second source/drain pattern SD2. The first interlayer dielectric layer 110 may cover the first source/drain pattern SD1. A second interlayer dielectric layer 120 may cover the second source/drain pattern SD2. The first interlayer dielectric layer 110 and the second interlayer dielectric layer 120 may be in contact with each other on the device isolation pattern ST. In an implementation, the first interlayer dielectric layer 110 and the second interlayer dielectric layer 120 may contact each other with no interface therebetween. Each of the first and second interlayer dielectric layers 110 and 120 may include, e.g., silicon oxide, silicon nitride, or a combination thereof.

A dummy semiconductor pattern DSP may be between the first channel pattern CH1 and the second channel pattern CH2. The dummy semiconductor pattern DSP may be spaced apart in the first direction D1 from each of the first channel pattern CH1 and the second channel pattern CH2. The dummy semiconductor pattern DSP may not be in contact with any of the first source/drain pattern SD1 and the second source/drain pattern SD2. The dummy semiconductor pattern DSP may include, e.g., an identical material to that of the first and second channel patterns CH1 and CH2, a different material from that of the first and second channel patterns CH1 and CH2, or a combination of thereof.

A gate electrode GE may cross the first channel pattern CH1 and the second channel pattern CH2. When viewed in plan, the gate electrode GE may have a bar shape that extends (e.g., lengthwise) in a third direction D3. The third direction D3 may be parallel to the bottom surface of the substrate 100 and intersect the second direction D2. The gate electrode GE may be provided in plural. The gate electrode GE may vertically overlap the first and second channel patterns CH1 and CH2.

The gate electrode GE may include a first gate electrode GE1 that crosses the first and second channel patterns CH1 and CH2 and a second gate electrode GE2 on the first gate electrode GE1. In an implementation, the first gate electrode GE1 may include first, second, third, fourth, and fifth parts P1, P2, P3, P4, and P5 between the dummy semiconductor pattern DSP and the first to fourth semiconductor patterns SP1 to SP4 of the first and second channel patterns CH1 and CH2, and may also include a sixth part P6 between the second channel pattern CH2 and the second gate electrode GE2.

The first gate electrode GE1 may include a work-function material that controls a threshold voltage of a transistor. A thickness and composition of the first gate electrode GE1 may be adjusted to achieve a desired threshold voltage of a transistor. The work-function material may include a metal nitride. In an implementation, the work-function material may include nitride of metal, e.g., titanium (Ti), tantalum (Ta), aluminum (Al), tungsten (W), molybdenum (Mo), or a combination thereof. In an implementation, the work-function material may further include carbon (C). The first gate electrode GE1 may be a plurality of stacked work-function material layers.

The second gate electrode GE2 may include a metallic material whose resistance is less than that of the first gate electrode GE1. In an implementation, the metallic material may include tungsten (W), aluminum (Al), titanium (Ti), tantalum (Ta), or a combination thereof.

The gate electrode GE may be on a top surface, a bottom surface, and opposite lateral surfaces of each of the first, second, third, and fourth semiconductor patterns SP1, SP2, SP3, and SP4. In this sense, a transistor according to the present embodiment may be a three-dimensional field effect transistor (e.g., MBCFET or GAAFET) in which the gate electrode GE three-dimensionally surrounds the first and second channel patterns CH1 and CH2.

Gate spacers GS may be on opposite lateral surfaces of the gate electrode GE and on opposite lateral surfaces of a separation pattern DB which will be discussed below. The gate spacers GS may extend in the third direction D3. In an implementation, one of the gate spacers GS may extend in the third direction D3 along the gate electrode GE. In an implementation, another of the gate spacers GS may extend in the third direction D3 along the separation pattern DB and onto opposite lateral surfaces of a through conductive pattern TC which will be discussed below. The other gate spacer GS may be between the through conductive pattern TC and the first interlayer dielectric layer 110 and between the through conductive pattern TC and the second interlayer dielectric layer 120. The gate spacers GS may have their top surfaces higher than that of the gate electrode GE. The top surfaces of the gate spacers GS may be coplanar with that of the second interlayer dielectric layer 120.

In an implementation, the gate spacers GS may be a single or multiple layers including, e.g., SiCN, SiCON, SiN, or a combination thereof.

A gate capping pattern GC may be on the gate electrode GE. The gate capping pattern GC may extend in the third direction D3 along the gate electrode GE. In an implementation, the gate capping pattern GC may include, e.g., SiON, SiCN, SiCON, SiN, or a combination thereof.

A gate dielectric pattern GI may be between the gate electrode GE and each of the first, second, third, and fourth semiconductor patterns SP1, SP2, SP3, and SP4 and between the gate electrode GE and the dummy semiconductor pattern DSP. The gate dielectric pattern GI may cover a top surface, a bottom surface, and opposite lateral surfaces of each of the dummy semiconductor pattern DSP and the first, second, third, and fourth semiconductor patterns SP1, SP2, SP3, and SP4. The gate dielectric pattern GI may cover the top surface of the device isolation pattern ST that underlies the gate dielectric pattern GI.

In an implementation, the gate dielectric pattern GI may include a silicon oxide layer, a silicon oxynitride layer, a high-k dielectric layer, or a combination thereof. The high-k dielectric layer may include a high-k dielectric material whose dielectric constant is greater than that of a silicon oxide layer. In an implementation, the high-k dielectric material may include, e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof.

In an implementation, a three-dimensional semiconductor device may include a negative capacitance field effect transistor (NCFET) that uses a negative capacitor. In an implementation, the gate dielectric pattern GI may include a ferroelectric material layer having ferroelectric properties and a paraelectric material layer having paraelectric properties.

The ferroelectric material layer may have a negative capacitance, and the paraelectric material layer may have a positive capacitance. In an implementation, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, e.g., hafnium oxide, hafnium zirconium oxide, barium strontium titanium oxide, lead zirconium titanium oxide, or a combination thereof. In an implementation, the hafnium zirconium oxide may be a material in which hafnium oxide is doped with zirconium (Zr). In an implementation, the hafnium zirconium oxide may be a compound of hafnium (Hf), zirconium (Zr), and oxygen (O).

The ferroelectric material layer may further include impurities doped therein. In an implementation, the impurities may include, e.g., aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), tin (Sn), or a combination thereof. The type of impurities included in the ferroelectric material layer may be changed depending on what ferroelectric material is included in the ferroelectric material layer.

When the ferroelectric material layer includes hafnium oxide, the ferroelectric material layer may include an impurity, e.g., gadolinium (Gd), silicon (Si), zirconium (Zr), aluminum (Al), yttrium (Y), or a combination thereof.

When the impurities include aluminum (Al), the ferroelectric material layer may include about 3 to 8 atomic percent aluminum. In this description, the ratio of impurities may be a ratio of aluminum to the sum of hafnium and aluminum.

When the impurities include silicon (Si), the ferroelectric material layer may include about 2 to about 10 atomic percent silicon. When the impurities include yttrium (Y), the ferroelectric material layer may include about 2 to about 10 atomic percent yttrium. When the impurities include gadolinium (Gd), the ferroelectric material layer may include about 1 to 7 atomic percent gadolinium. When the impurities include zirconium (Zr), the ferroelectric material layer may include about 50 to about 80 atomic percent zirconium.

The paraelectric material layer may have paraelectric properties. The paraelectric material layer may include, e.g., silicon oxide, a high-k metal oxide, or a combination thereof. In an implementation, the metal oxide included in the paraelectric material layer may include, e.g., hafnium oxide, zirconium oxide, aluminum oxide, or a combination thereof.

The ferroelectric and paraelectric material layers may include the same material. The ferroelectric material layer may have ferroelectric properties, and the paraelectric material layer may not have ferroelectric properties. In an implementation, when the ferroelectric material layer and the paraelectric material layer include hafnium oxide, the hafnium oxide included in the ferroelectric material layer may have a crystal structure different from that of the hafnium oxide included in the paraelectric material layer. The ferroelectric material layer may have a thickness having ferroelectric properties. In an implementation, the thickness of the ferroelectric material layer may range, e.g., from about 0.5 nm to about 10 nm. Ferroelectric materials may have their own critical thickness that exhibits ferroelectric properties, and the thickness of the ferroelectric material layer may depend on ferroelectric material.

In an implementation, the gate dielectric pattern GI may include one ferroelectric material layer. In an implementation, the gate dielectric pattern GI may include a plurality of ferroelectric material layers that are spaced apart from each other. The gate dielectric pattern GI may have a stack structure in which a plurality of ferroelectric material layers are alternately stacked with a plurality of paraelectric material layers.

A gate cutting pattern CT may penetrate through the gate electrode GE. The gate cutting pattern CT may separate from each other the gate electrode GE and another gate electrode that neighbor each other in the third direction D3. In an implementation, a pair of gate cutting patterns CT may be on opposite ends of the gate electrode GE. A series of gate cutting patterns CT may be linearly disposed along the third direction D3 and alternately placed with a series of gate electrodes GE that are linearly located along the third direction D3. The gate cutting patterns CT may include a dielectric material, e.g., silicon oxide, silicon nitride, or a combination thereof.

A separation pattern DB may be between ones of the gate electrodes GE that neighbor each other in the second direction D2. The separation pattern DB may be provided in plural, and the plurality of separation patterns DB may be spaced apart from each other in the second direction D2 and the third direction D3. In an implementation, the separation pattern DB may be between ones of the first source/drain patterns SD1 that neighbor each other in the second direction D2, and between ones of the second source/drain patterns SD2 that neighbor each other in the second direction D2. In this configuration, the gate electrode GE may be between others of the first source/drain patterns SD1 that neighbor each other in the second direction D2, and between others of the second source/drain patterns SD2 that neighbor each other in the second direction D2.

The separation pattern DB may extend in the third direction D3 and parallel to the gate electrodes GE. A distance between the separation pattern DB and the gate electrode GE that are adjacent to each other in the second direction D2 may be the same as a distance between the gate electrodes GE that immediately neighbor each other in the second direction D2. In an implementation, n numbers of gate electrodes GE may be between the separation patterns DB that neighbor each other in the second direction D2 (in which n is a natural number equal to or greater than 1). In an implementation, the gate electrode GE may not be between the separation patterns DB that neighbor each other in the second direction D2.

The separation pattern DB may be spaced apart from its neighboring first source/drain pattern SD1, its neighboring second source/drain pattern SD2, its neighboring first interlayer dielectric layer 110, and its neighboring second interlayer dielectric layer 120. In an implementation, the separation pattern DB may be spaced apart from its neighboring first source/drain pattern SD1 across first residual active layers ACL1*r* and first residual sacrificial layers SAL1*r*. The separation pattern DB may be spaced apart from its neighboring second source/drain pattern SD2 across second residual active layers ACL2*r* and second residual sacrificial layers SAL2*r*. The separation pattern DB may be spaced apart from its neighboring first interlayer dielectric layer 110 across a residual dummy semiconductor layer DSLr. The separation pattern DB may be spaced apart from its neighboring second interlayer dielectric layer 120 across the gate spacer GS.

The separation pattern DB may extend along the first direction D1 and penetrate through the active pattern AP and the first and second interlayer dielectric layers 110 and 120. In an implementation, the separation pattern DB may further extend to the bottom surface of the substrate 100. A bottom surface of the separation pattern DB may be located at a lower level than that of a bottom surface of the gate electrode GE. The separation pattern DB may include a dielectric material, e.g., silicon oxide, silicon oxycarbide, silicon nitride, or a combination thereof.

A through conductive pattern TC may be between the separation patterns DB that neighbor each other in the third direction D3. The through conductive pattern TC may be provided in plural, and the plurality of through conductive patterns TC may be spaced apart from each other in the second direction D2 and the third direction D3. A series of through conductive patterns TC may be linearly disposed along the third direction D3 and alternately placed with a series of separation patterns DB that are linearly located along the third direction D3. In an implementation, the through conductive pattern TC may be between ones of the gate cutting patterns CT that neighbor each other in the second direction D2. In an implementation, the through conductive pattern TC may not be between the first source/drain patterns SD1 that neighbor each other in the second direction D2 or between the second source/drain patterns SD2 that neighbor each other in the second direction D2. In an implementation, as shown in the drawing figures, the through conductive pattern TC may have a bar shape elongated along the third direction D3, and the structure of the through conductive pattern TC may be variously changed.

Figure 2D:
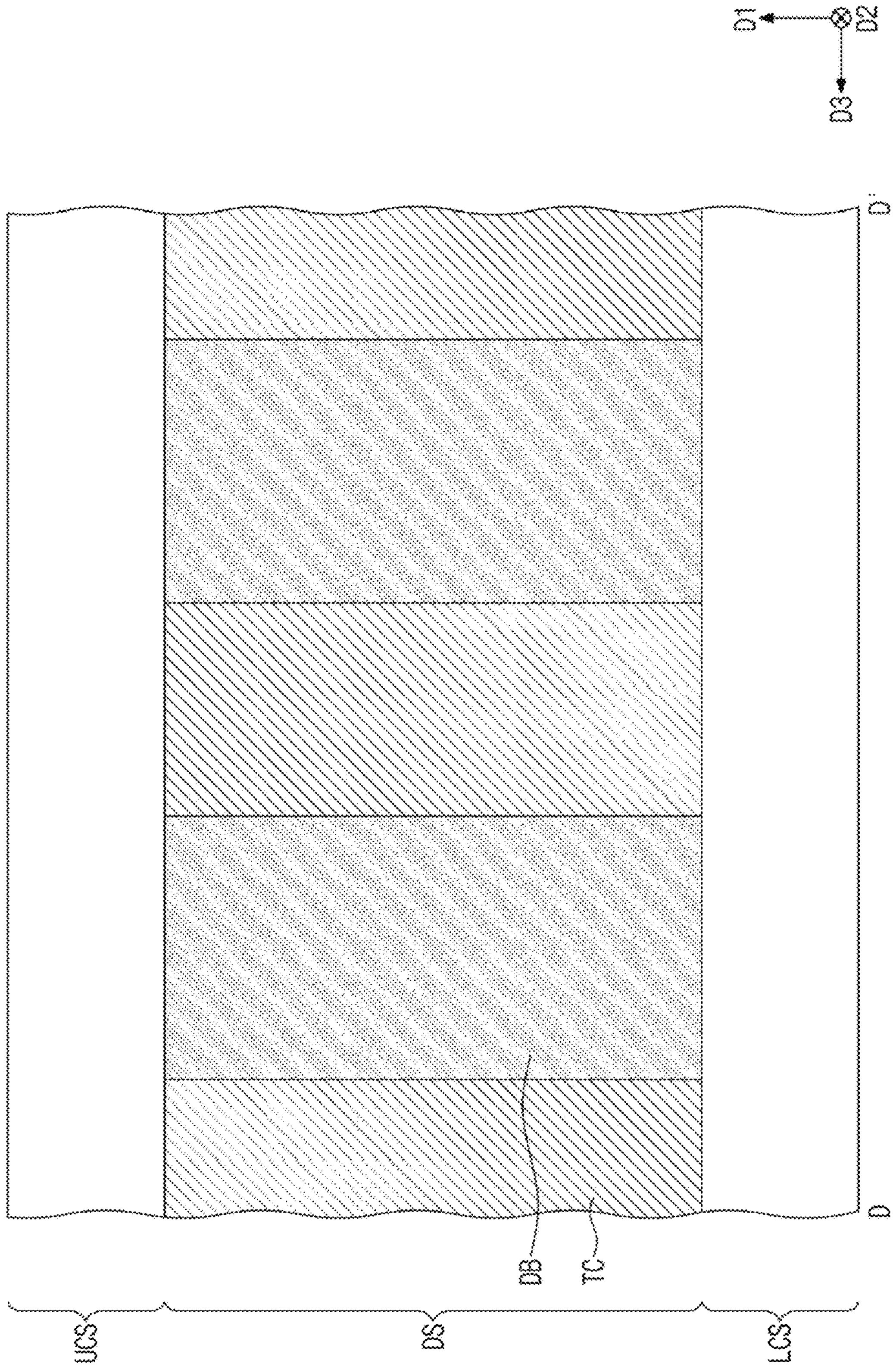
Figure 2E:
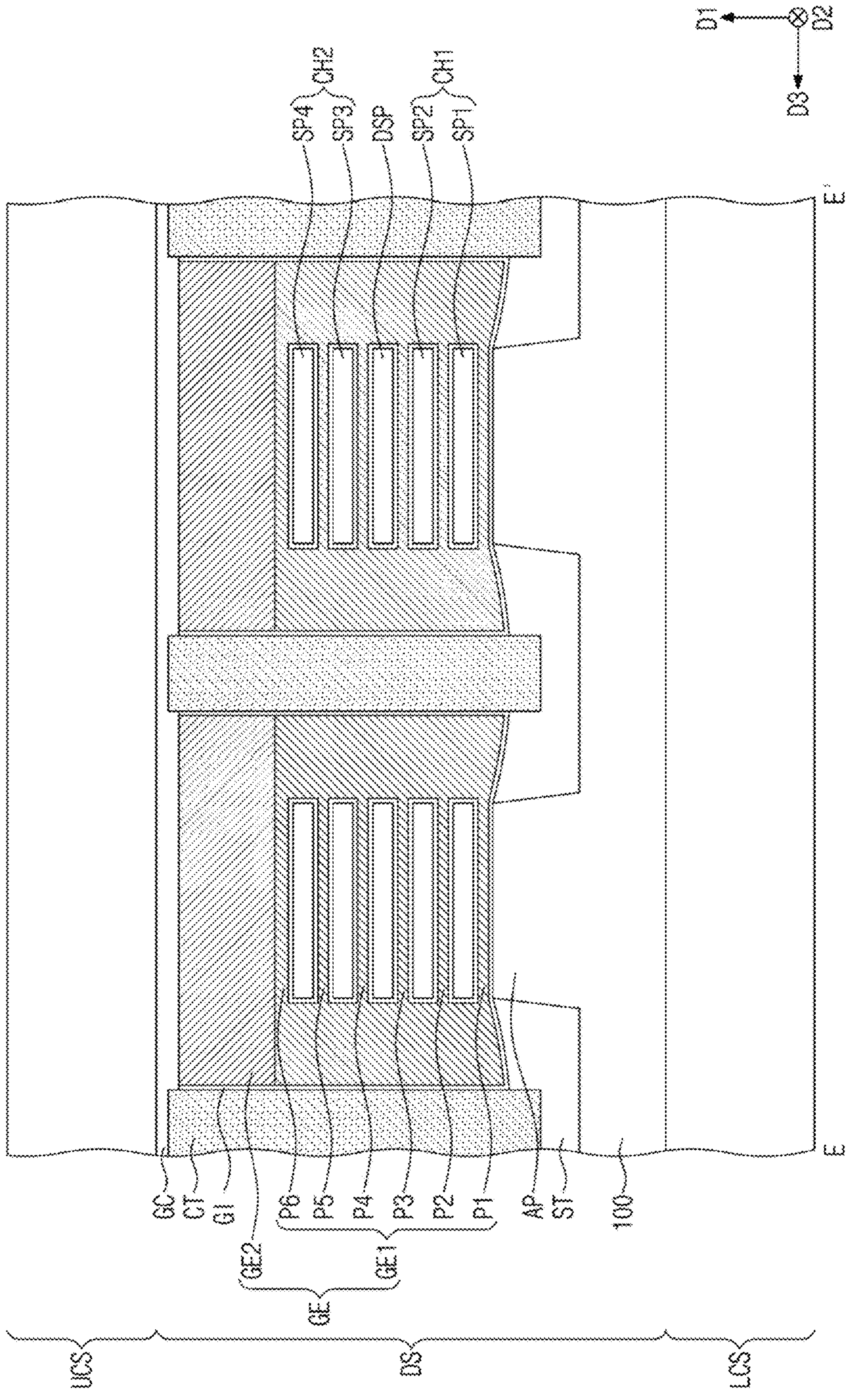

The through conductive pattern TC may extend along the first direction D1 and penetrate through the active pattern AP and the first and second interlayer dielectric layers 110 and 120. In an implementation, the through conductive pattern TC may further extend to the bottom surface of the substrate 100 (or the bottom surface of the device structure DS). A bottom surface of the through conductive pattern TC may be located at a lower level than that of the bottom surface of the gate electrode GE. A top surface of the through conductive pattern TC may be located at a level the same as or different from that of a top surface of the separation pattern DB. In an implementation, as shown in FIG. 2D, the top surface of the through conductive pattern TC may be located at the same level as that of the top surface of the separation pattern DB, or may be coplanar with the top surface of the separation pattern DB. The top surface of the through conductive pattern TC may constitute a portion of the top surface of the device structure DS.

The through conductive pattern TC may include a material that is the same as at least a portion of a material of the gate electrode GE. In an implementation, the through conductive pattern TC may include a material that is the same as at least one of materials included in the second gate electrode GE2 of the gate electrode GE. In an implementation, the through conductive pattern TC may include metal whose resistance is less than that of the first gate electrode GE1. In an implementation, the through conductive pattern TC may include, e.g., tungsten (W), aluminum (Al), titanium (Ti), tantalum (Ta), or a combination thereof.

The through conductive pattern TC may be connected to the lower connection structure LCS and the upper connection structure UCS. The through conductive pattern TC may connect the lower connection structure LCS to the upper connection structure UCS. The through conductive pattern TC may be connected in various ways to the lower connection structure LCS and the upper connection structure UCS. In an implementation, the through conductive pattern TC may be in direct contact with and connected to the lower connection structure LCS or the upper connection structure UCS. In an implementation, the through conductive pattern TC may not be in contact with, but may be connected through one or more separate plugs to the lower connection structure LCS or the upper connection structure UCS.

The first source/drain pattern SD1 may be connected to a corresponding one of the through conductive patterns TC. In an implementation, one of the first source/drain patterns SD1 may be connected to a corresponding one of the through conductive patterns TC. In an implementation, the first source/drain pattern SD1 may be connected to the through conductive pattern TC through the first conductive contact SC1 and the lower connection structure LCS. In addition, the first source/drain pattern SD1 may be connected to the upper connection structure UCS through the first conductive contact SC1, the lower connection structure LCS, and a corresponding through conductive pattern TC.

In an implementation, the second source/drain pattern SD2 may be connected to a corresponding one of the through conductive patterns TC. In an implementation, one of the second source/drain patterns SD2 may be connected to a corresponding one of the through conductive patterns TC. In an implementation, the second source/drain pattern SD2 may be connected to the through conductive pattern TC through the second conductive contact SC2 and the upper connection structure UCS. In an implementation, the second source/drain pattern SD2 may be connected to the lower connection structure LCS through the second conductive contact SC2, the upper connection structure UCS, and a corresponding through conductive pattern TC.

The first source/drain pattern SD1 and the second source/drain pattern SD2 that are stacked in the first direction D1 may be independently connected to the through conductive pattern TC or may not be connected to the through conductive pattern TC. In an implementation, the first source/drain pattern SD1 may be connected to one through conductive pattern TC, and in this case, the second source/drain pattern SD2 may be or may not be connected to another through conductive pattern TC. In an implementation, the first source/drain pattern SD1 may not be connected to any of the through conductive patterns TC, and in this case, the second source/drain pattern SD2 may be or may not be connected to one of the through conductive patterns TC.

Each of the upper and lower connection structure UCS and LCS may include conductive lines and conductive plugs. Each of the upper and lower connection structures UCS and LCS may be connected to a component of the device structure DS through the conductive lines and the conductive plugs. In an implementation, each of the upper and lower connection structures UCS and LCS may have a connection structure in which a plurality of conductive lines are alternately stacked with a plurality of conductive plugs. In an implementation, components in each of the upper and lower connection structures UCS and LCS may be variously changed in shape or arrangement.

In an implementation, one or all of the first and second source/drain patterns SD1 and SD2 that are stacked along the first direction D1 may be connected to the through conductive pattern TC. In an implementation, regardless of whether the first source/drain pattern SD1 is provided thereon with the second source/drain pattern SD2, the first source/drain pattern SD1 may be connected to the upper connection structure UCS. In addition, regardless of whether the second source/drain pattern SD2 is provided thereunder with the first source/drain pattern SD1, the second source/drain pattern SD2 may be connected to the lower connection structure LCS. In an implementation, the first source/drain pattern SD1 may have a minimum area in the third direction D3 for connection to the upper connection structure UCS, and the second source/drain pattern SD2 may have a minimum area in the third direction D3 for connection to the lower connection structure LCS. As a result, the three-dimensional semiconductor device may have increased integration.

Figure 3:
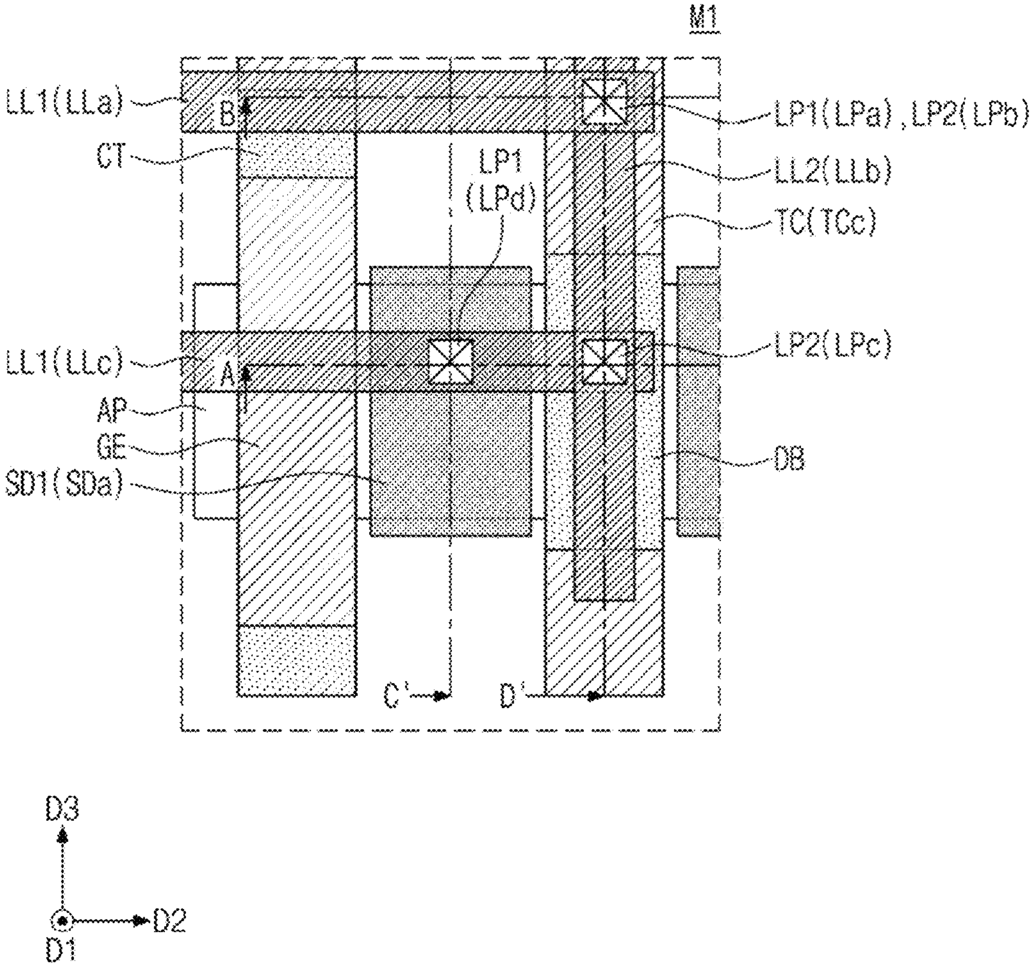
FIG. 3 illustrates an enlarged view of section M1 depicted in FIG. 1, showing a connection relationship between components of a three-dimensional semiconductor device according to some embodiments.
Figure 4A:
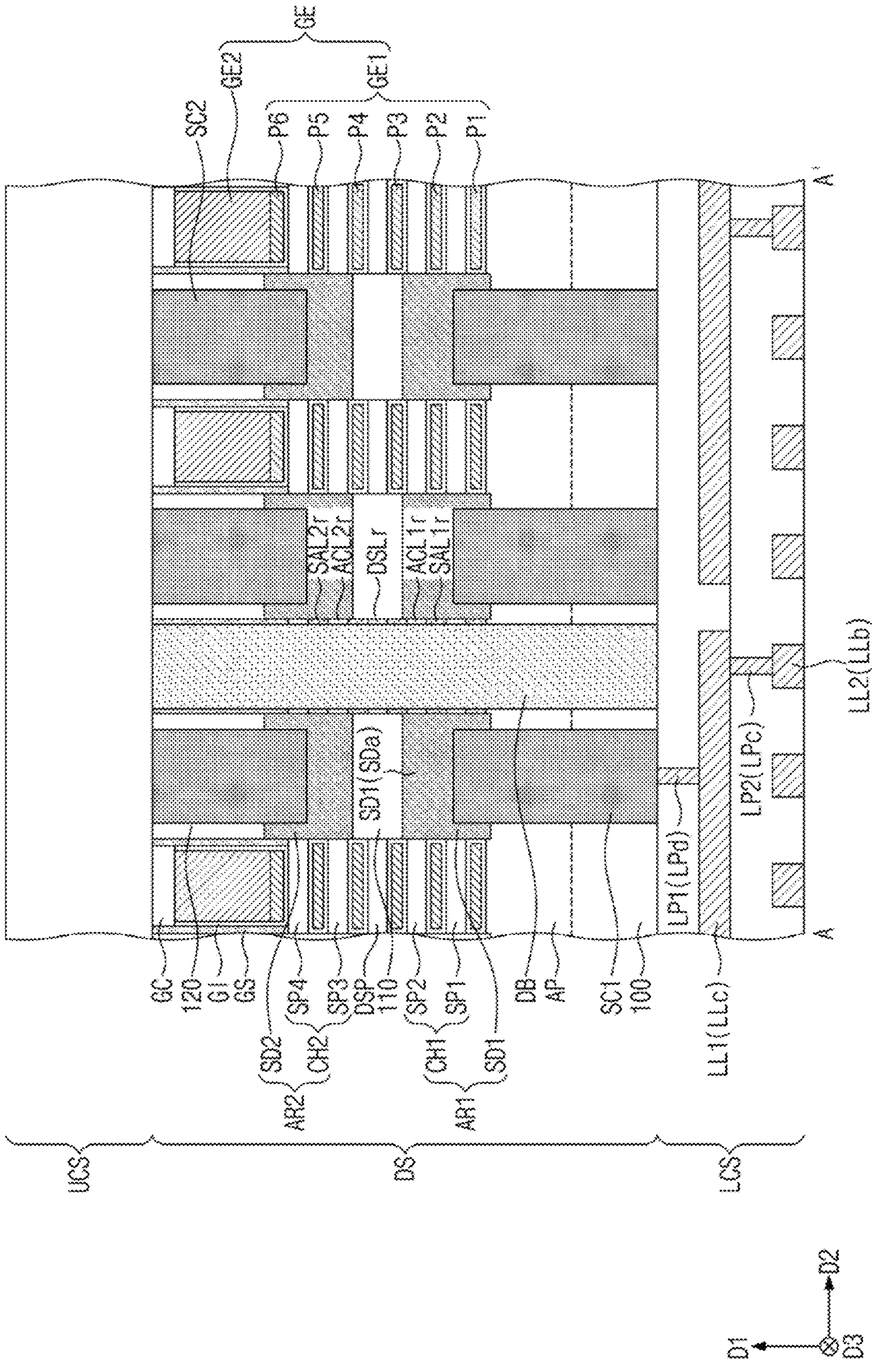
FIGS. 4A, 4B, 4C, 4D, and 4E illustrate cross-sectional views respectively taken along lines A-A', B-B', C-C', D-D', and E-E' of FIG. 1, showing a three-dimensional semiconductor device according to some embodiments.
Figure 4B:
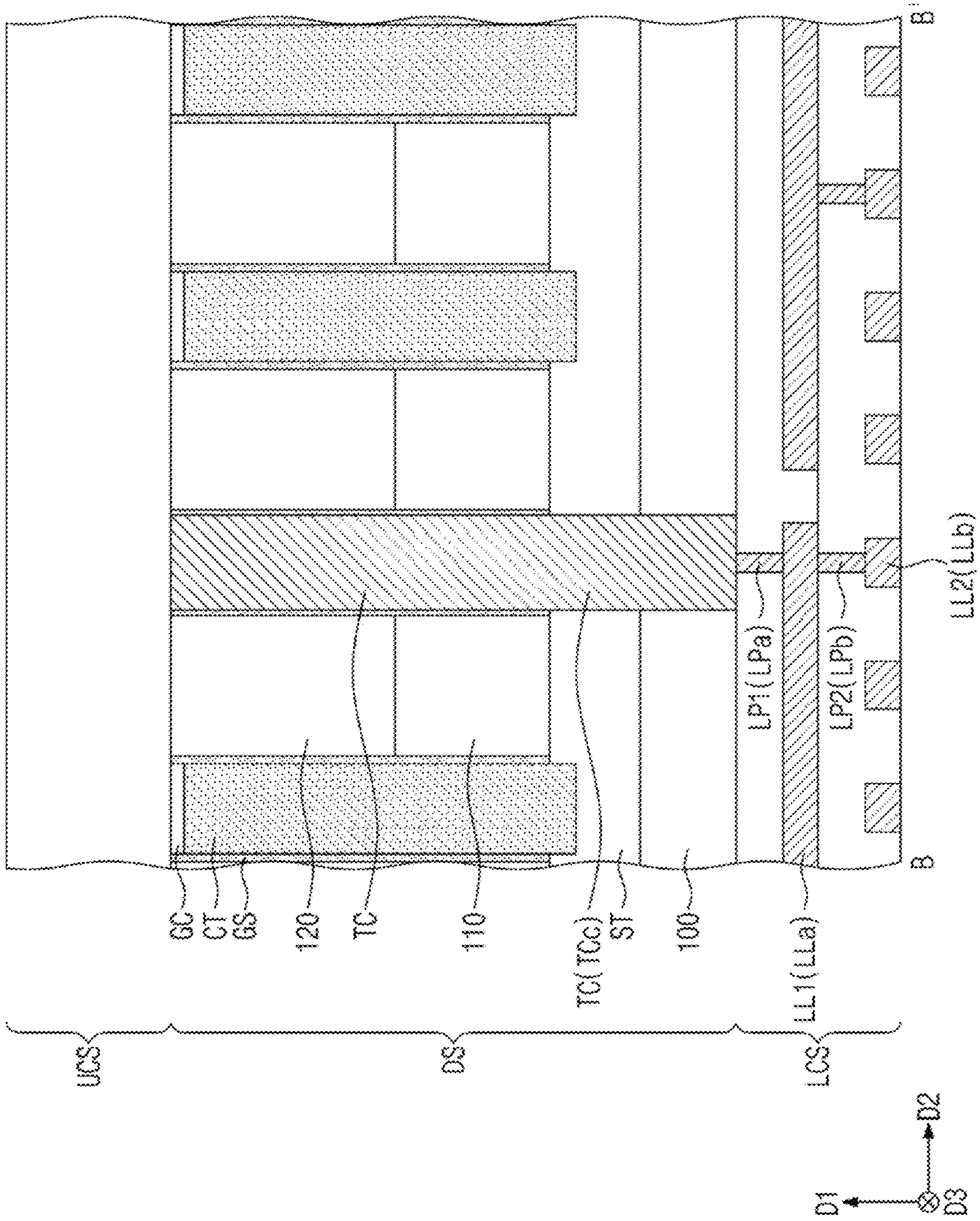
Figure 4C:
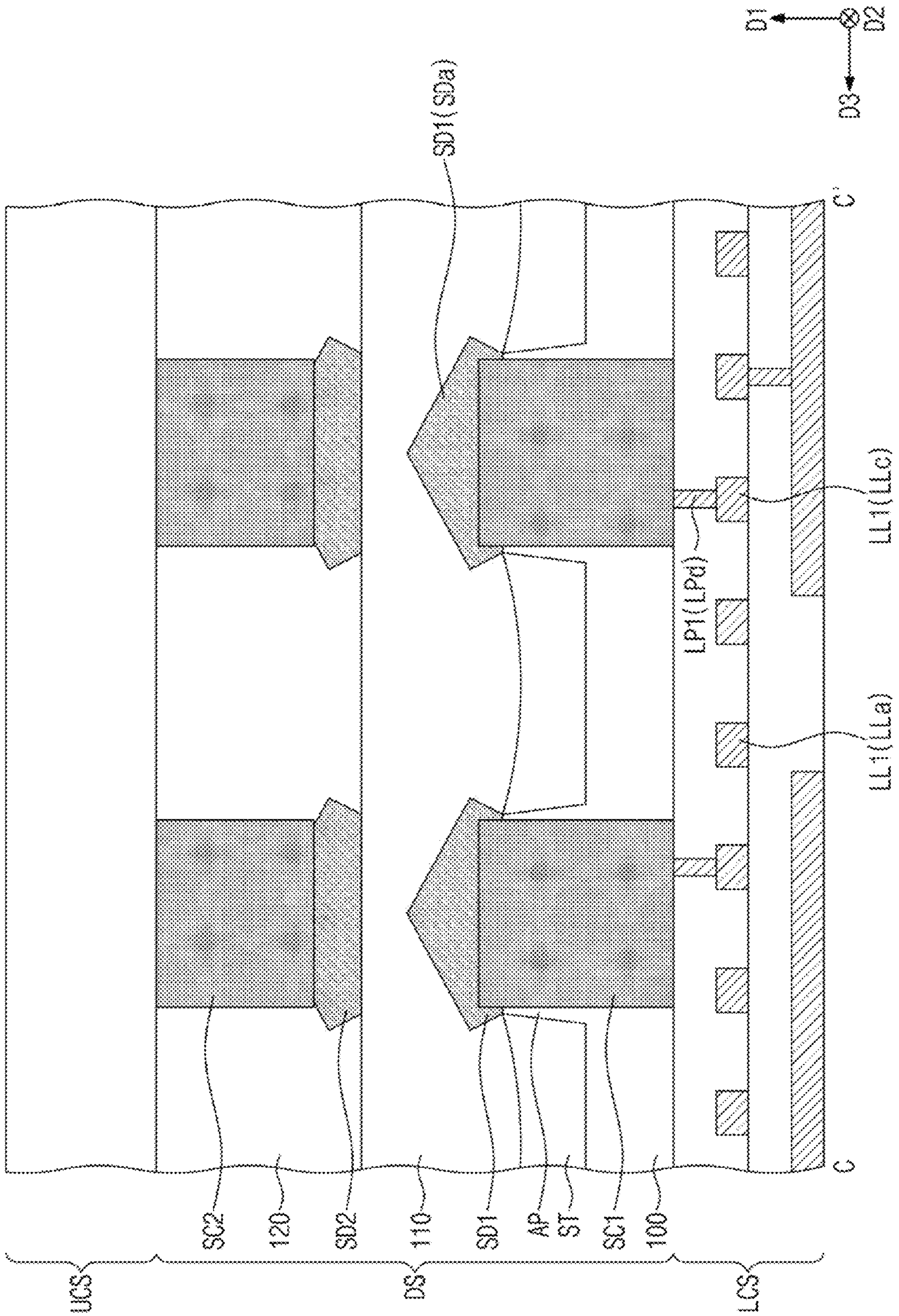
Figure 4D:
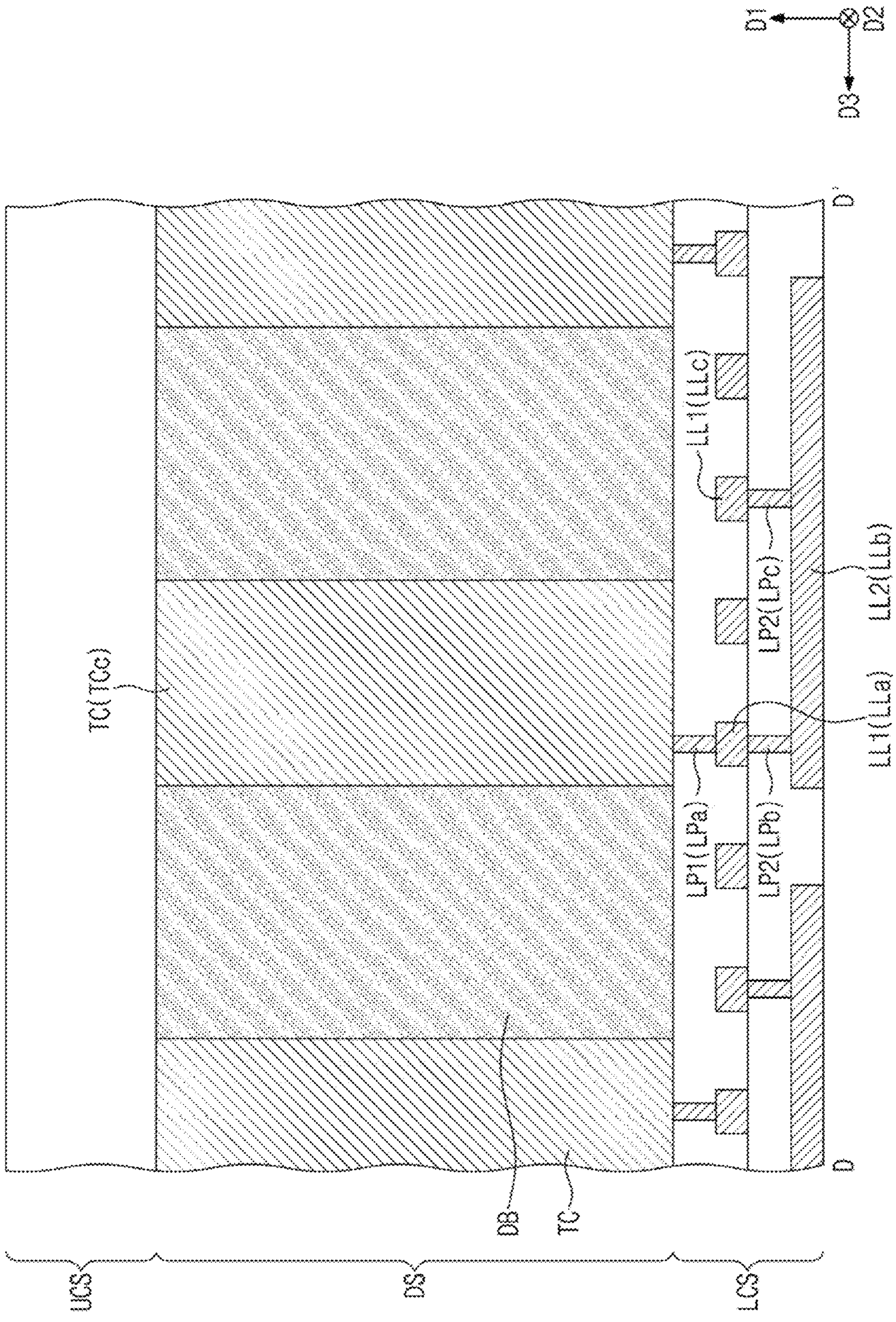
Figure 4E:
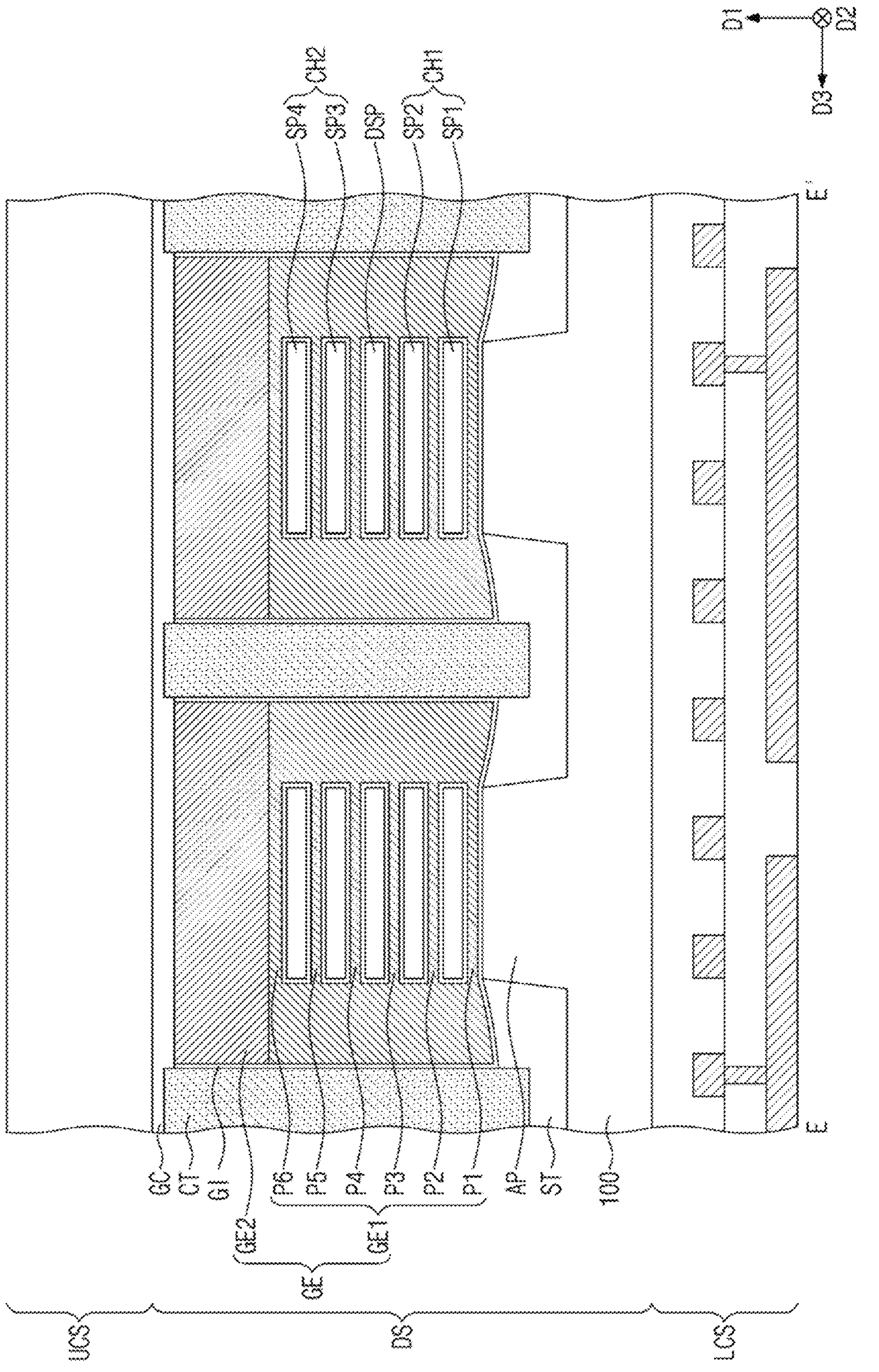

FIG. 3 illustrates an enlarged view of section M1 depicted in FIG. 1, showing a connection relationship between components of a three-dimensional semiconductor device according to some embodiments. FIGS. 4A, 4B, 4C, 4D, and 4E illustrate cross-sectional views respectively taken along lines A-A', B-B', C-C', D-D', and E-E' of FIG. 1, showing a three-dimensional semiconductor device according to some embodiments. With reference to FIGS. 1, 3A, and 4A to 4E, the following will describe an example in which the first source/drain pattern SD1 is connected to the upper connection structure UCS through the lower connection structure LCS and the through conductive pattern TC.

Referring to FIGS. 1, 3, and 4A to 4E, the lower connection structure LCS may include first lower conductive plugs LP1, first lower conductive lines LL1, second lower conductive plugs LP2, and second lower conductive lines LL2 that are sequentially disposed in a downward direction. In the case of FIG. 3, for convenience of description, some or all of components are illustrated in perspective to concurrently show components that overlap each other in the first direction D1. In an implementation, the stacking sequence and actual observable planar structure may be variously changed. The first lower conductive plugs LP1 may extend in the first direction D1, and may connect the device structure DS to the first lower conductive lines LL1. The second lower conductive plugs LP2 may extend in the first direction D1, and may connect the first lower conductive lines LL1 to the second lower conductive lines LL2. Each of the first lower conductive lines LL1 may extend in the second direction D2, and each of the second lower conductive lines LL2 may extend in the third direction D3.

In an implementation, the first lower conductive lines LL1 may include first and third connection lines LLa and LLc, and the second lower conductive lines LL2 may include a second connection line LLb. The first lower conductive plugs LP1 may include first and fourth connection plugs LPa and LPd, and the second lower conductive plugs LP2 may include second and third connection plugs LPb and LPc.

A connection source/drain pattern SDa of the first source/drain patterns SD1 may be connected to a connection through conductive pattern TCc of the through conductive patterns TC. In an implementation, the connection through conductive pattern TCc may be connected through the first connection plug LPa to the first connection line LLa (see FIGS. 4B and 4D). The first connection line LLa may be connected through the second connection plug LPb to the second connection line LLb (see FIGS. 4B and 4D). The second connection line LLb may be connected through the third connection plug LPc to the third connection line LLc (see FIGS. 4A and 4D). The third connection line LLc may be connected to the connection source/drain pattern SDa through the fourth connection plug LPd and the first conductive contact SC1 (see FIGS. 4A and 4C). In an implementation, the connection source/drain pattern SDa may be connected to the upper connection structure UCS through the lower connection structure LCS and the connection through conductive pattern TCc.

Figure 5:
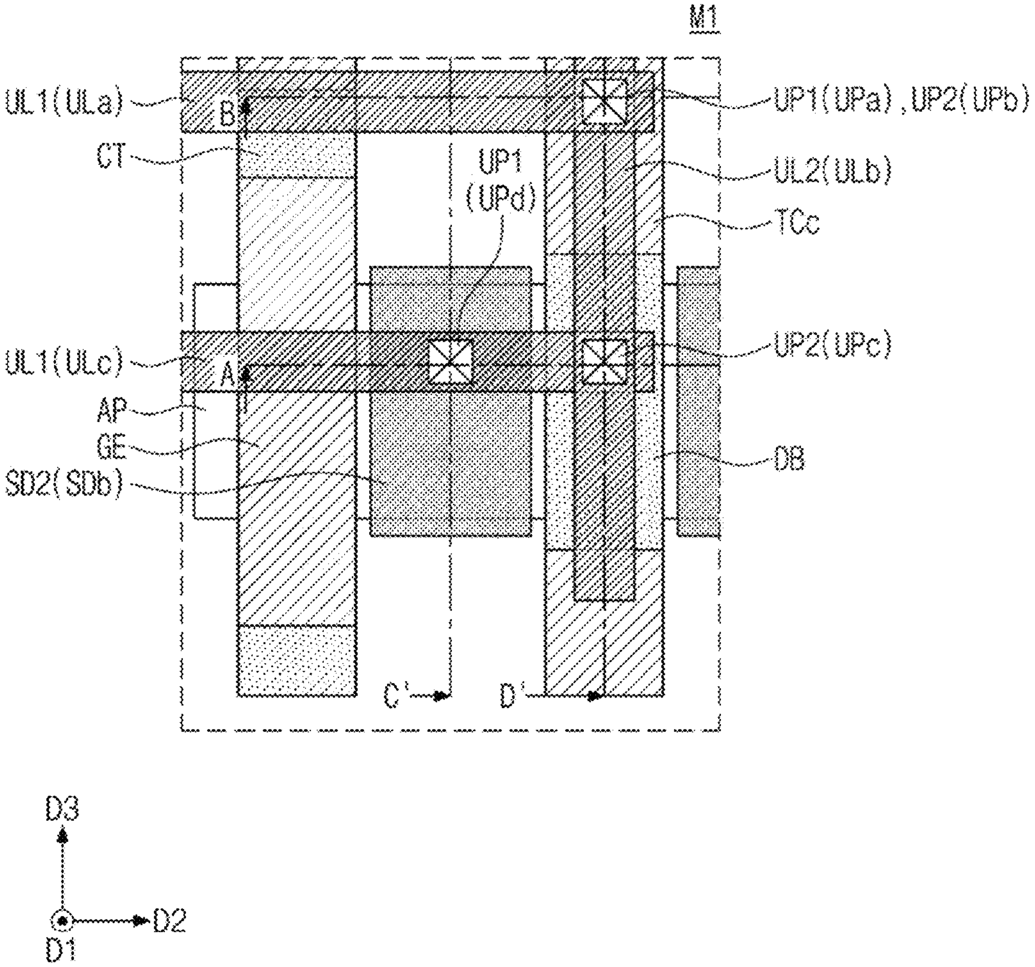
FIG. 5 illustrates an enlarged view of section M1 depicted in FIG. 1, showing a connection relationship between components of a three-dimensional semiconductor device according to some embodiments.
Figure 6A:
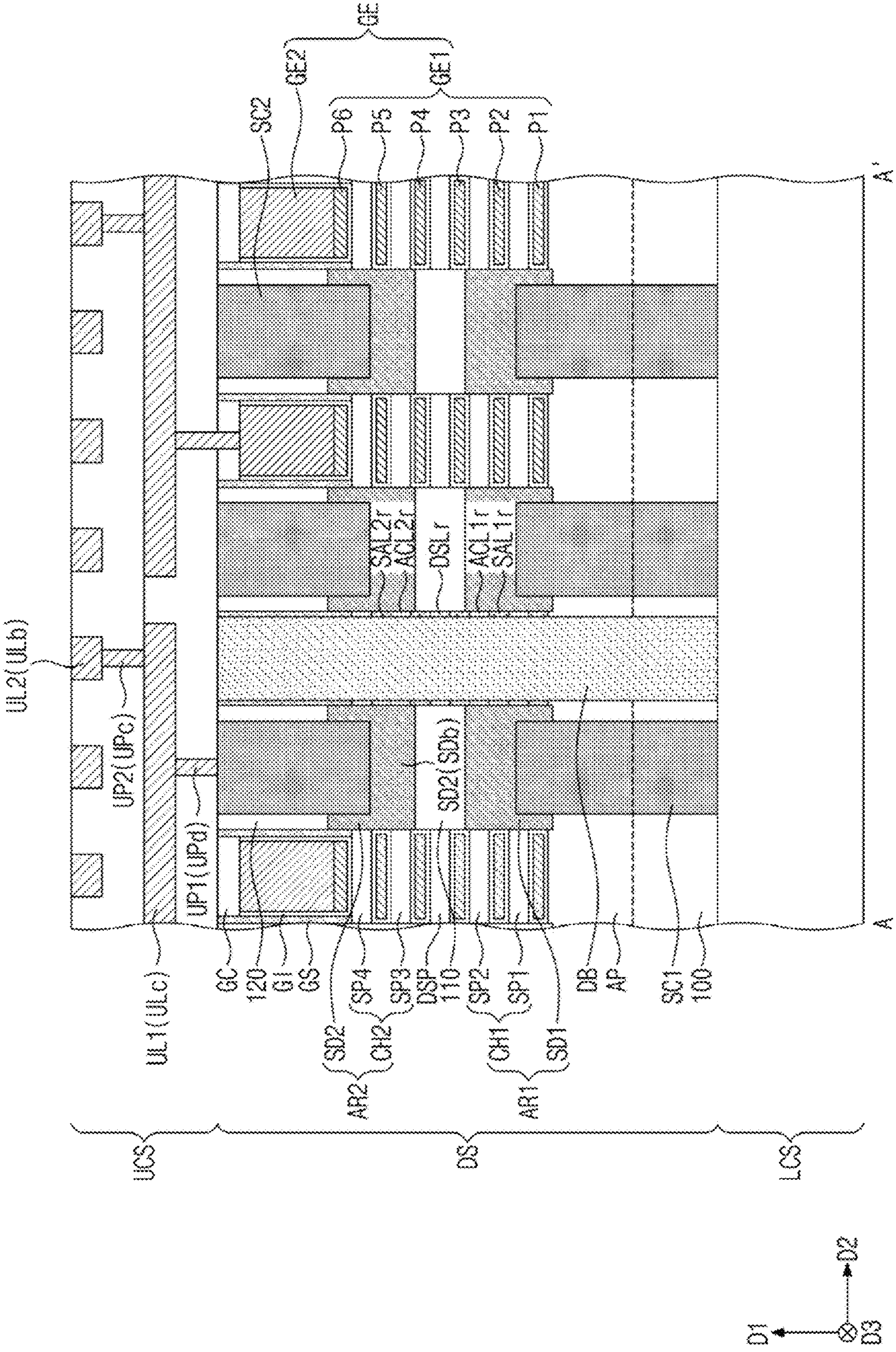
FIGS. 6A, 6B, 6C, 6D, and 6E illustrate cross-sectional views respectively taken along lines A-A', B-B', C-C', D-D', and E-E' of FIG. 1, showing a three-dimensional semiconductor device according to some embodiments.
Figure 6B:
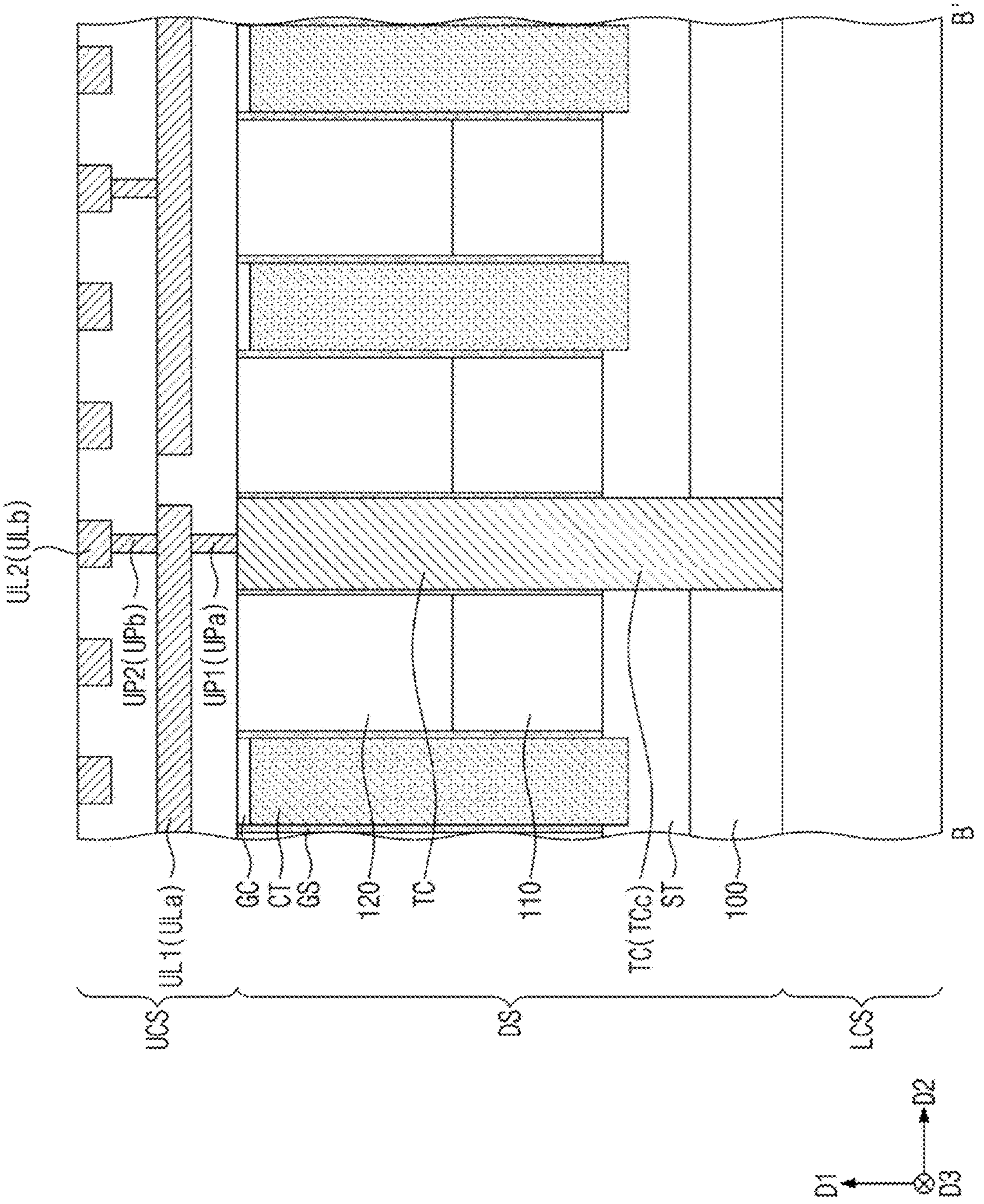
Figure 6C:
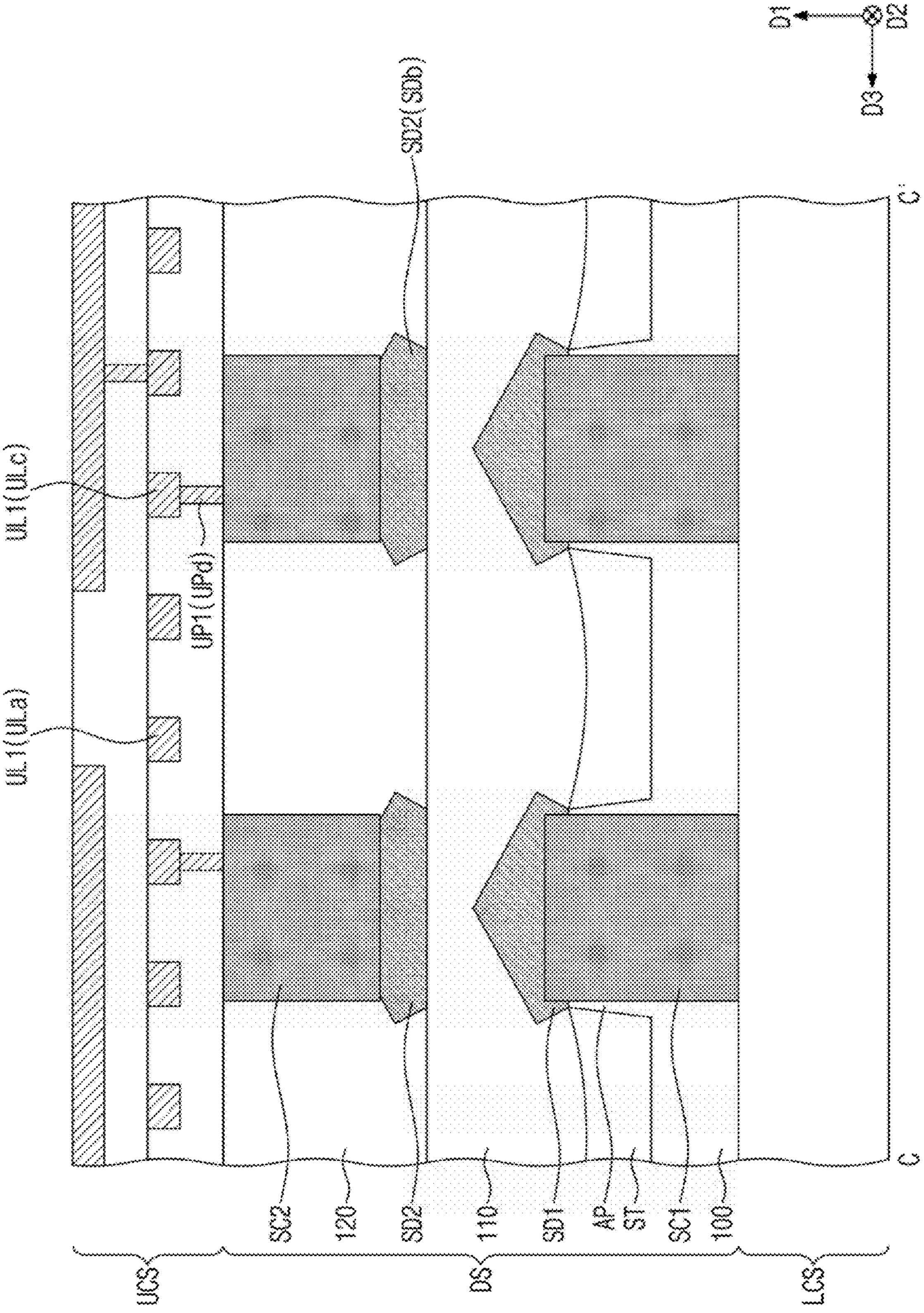
Figure 6D:
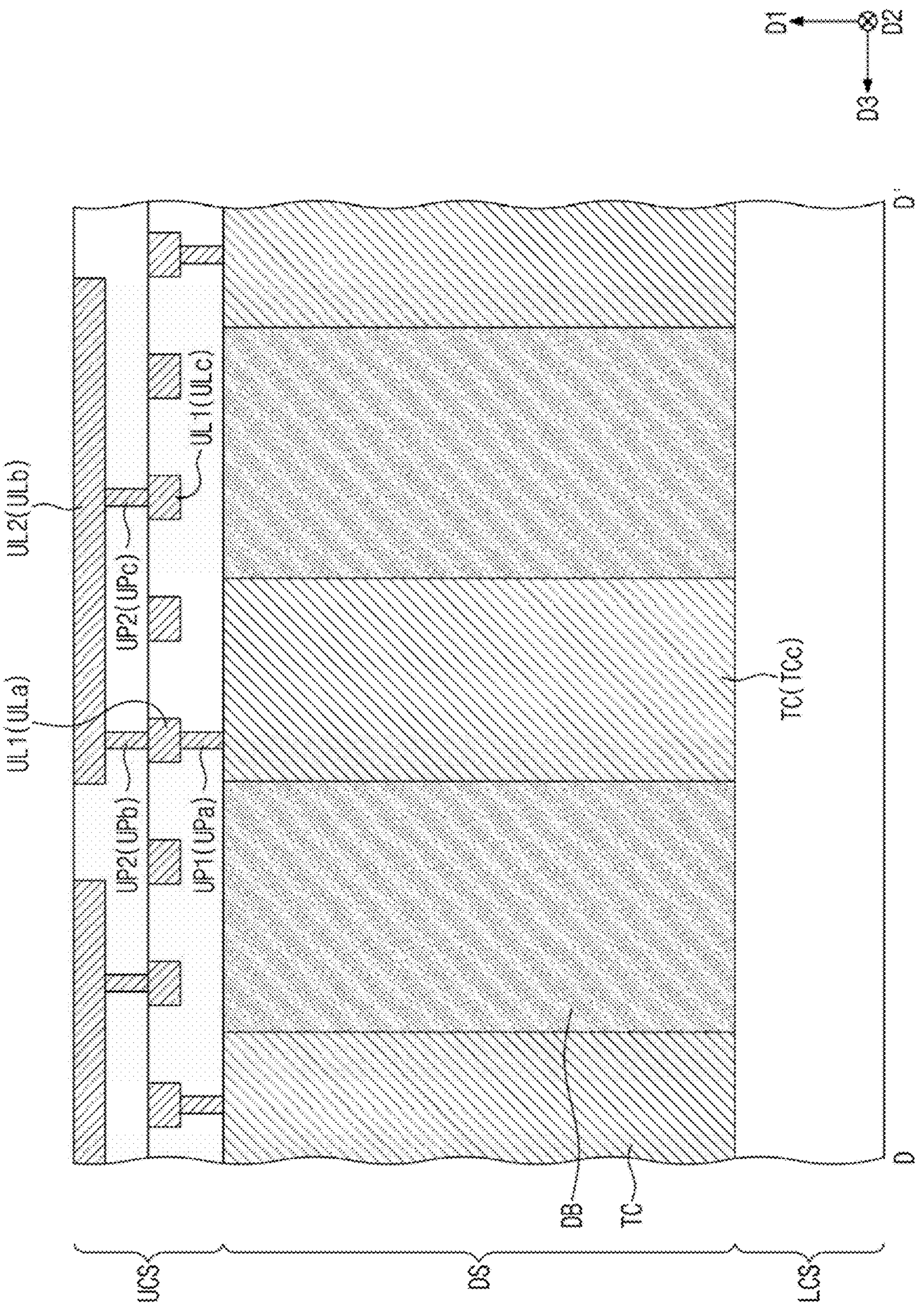
Figure 6E:
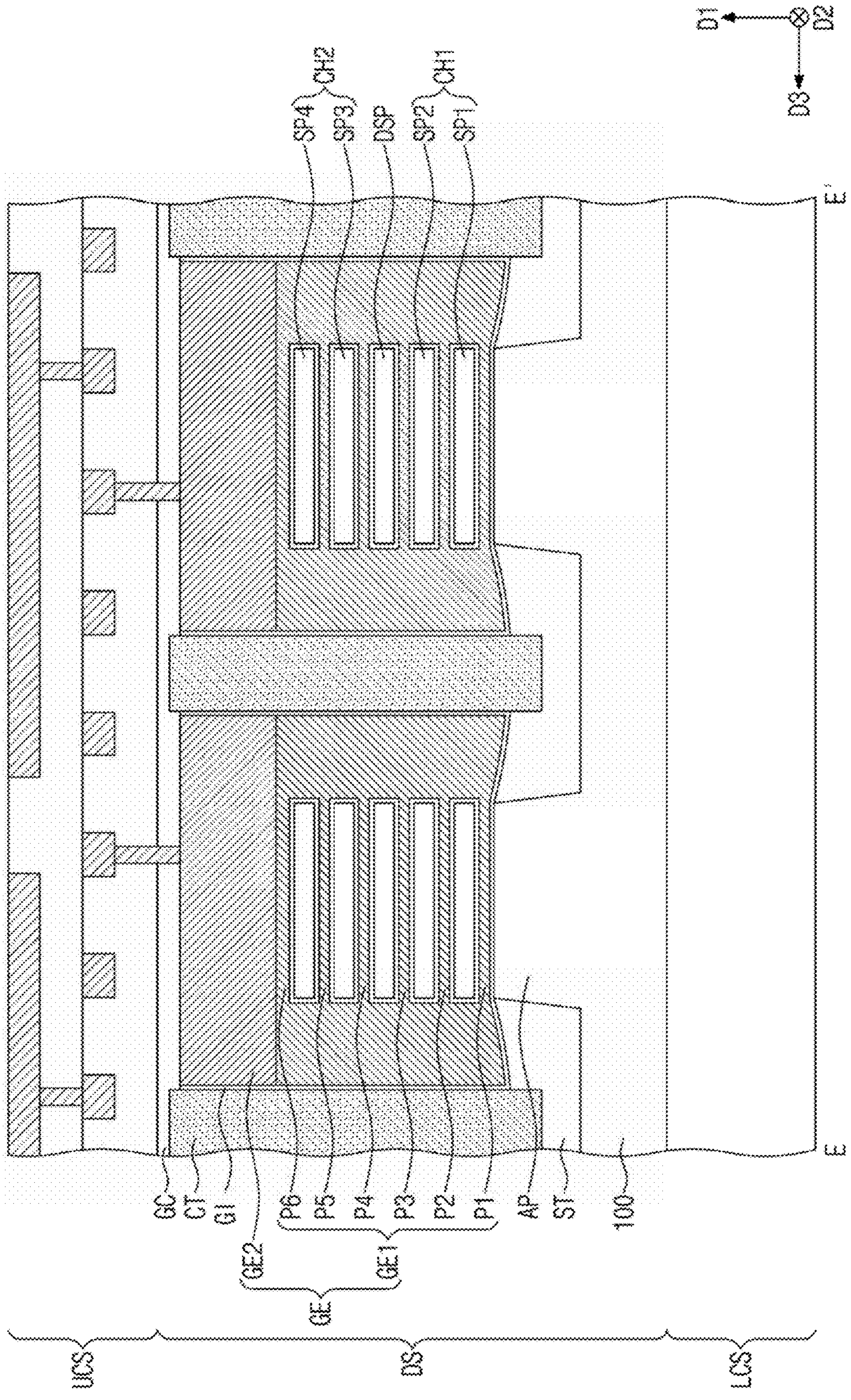

FIG. 5 illustrates an enlarged view of section M1 depicted in FIG. 1, showing a connection relationship between components of a three-dimensional semiconductor device according to some embodiments. FIGS. 6A, 6B, 6C, 6D, and 6E illustrate cross-sectional views respectively taken along lines A-A', B-B', C-C', D-D', and E-E' of FIG. 1, showing a three-dimensional semiconductor device according to some embodiments. With reference to FIGS. 1, 5, and 6A to 6E, the following will describe an example in which the second source/drain pattern SD2 is connected to the lower connection structure LCS through the upper connection structure UCS and the through conductive pattern TC.

Referring to FIGS. 1, 5, and 6A to 6E, the upper connection structure UCS may include first upper conductive plugs UP1, first upper conductive lines UL1, second upper conductive plugs UP2, and second upper conductive lines UL2 that are sequentially disposed in an upward direction. In the case of FIG. 5, for convenience of description, some or all of components are illustrated in perspective to concurrently show components that overlap each other in the first direction D1. This is an example for convenience of description, and the stacking sequence and actual observable planar structure are variously changed. The first upper conductive plugs UP1 may extend in the first direction D1, and may connect the device structure DS to the first upper conductive lines UL1. The second upper conductive plugs UP2 may extend in the first direction D1, and may connect the first upper conductive lines UL1 to the second upper conductive lines UL2. Each of the first upper conductive lines UL1 may extend in the second direction D2, and each of the second upper conductive lines UL2 may extend in the third direction D3.

In an implementation, the first upper conductive lines UL1 may include first and third connection lines ULa and ULc, and the second upper conductive lines UL2 may include a second connection line ULb. The first upper conductive plugs UP1 may include first and fourth connection plugs UPa and UPd, and the second upper conductive plugs UP2 may include second and third connection plugs UPb and UPc.

A connection source/drain pattern SDb of the second source/drain patterns SD2 may be connected to a connection through conductive pattern TCc of the through conductive patterns TC. In an implementation, the connection through conductive pattern TCc may be connected through the first connection plug UPa to the first connection line ULa (see FIGS. 6B and 6D). The first connection line ULa may be connected through the second connection plug UPb to the second connection line ULb (see FIGS. 6B and 6D). The second connection line ULb may be connected through the third connection plug UPc to the third connection line ULc (see FIGS. 6A and 6D). The third connection line ULc may be connected to a connection source/drain pattern SDb through the fourth connection plug UPd and the second conductive contact SC2 (see FIGS. 6A and 6C). In an implementation, the connection source/drain pattern SDb may be connected to the lower connection structure LCS through the upper connection structure UCS and the connection through conductive pattern TCc.

Figure 7:
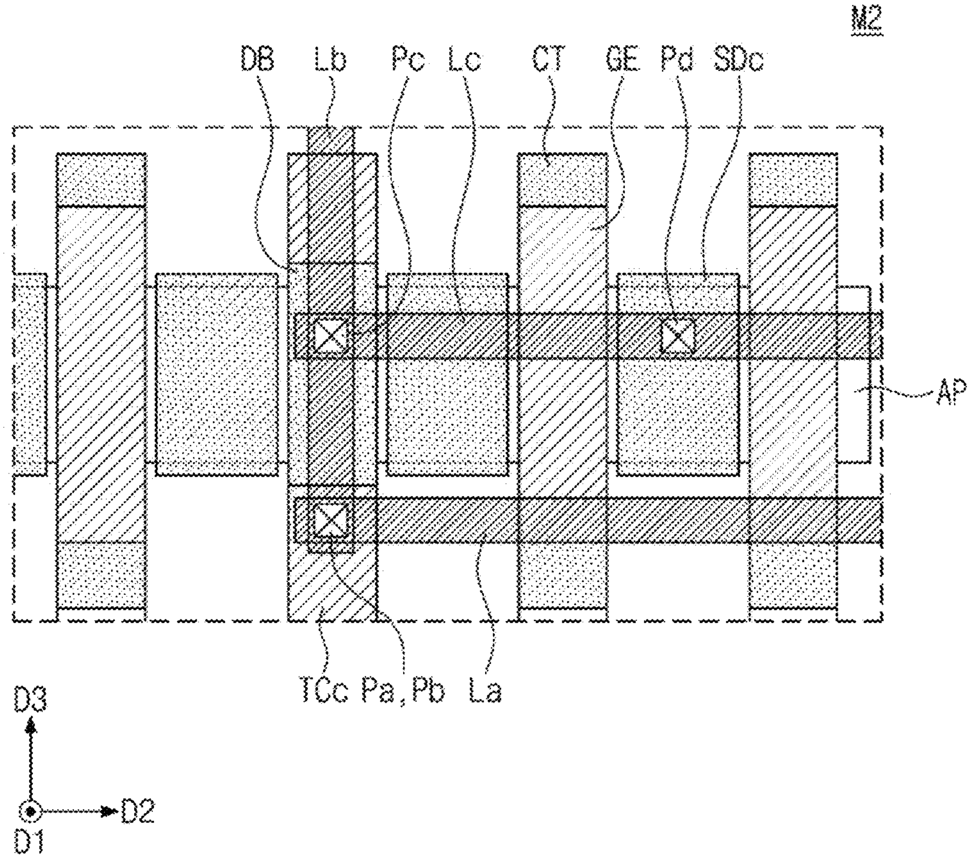
FIG. 7 illustrates an enlarged view of section M2 depicted in FIG. 1, showing a connection relationship between components of a three-dimensional semiconductor device according to some embodiments.

FIG. 7 illustrates an enlarged view of section M2 depicted in FIG. 1, showing a connection relationship between components of a three-dimensional semiconductor device according to some embodiments.

Referring to FIG. 7, when viewed in plan, an arrangement between the connection through conductive pattern TCc and the connection source/drain pattern SDc may not depend on a spacing distance therebetween. In an implementation, the connection through conductive pattern TCc and the connection source/drain pattern SDc may not be (e.g., directly) adjacent to each other, and the connection through conductive pattern TCc and the connection source/drain pattern SDc may still be connected to each other. In an implementation, the connection source/drain pattern SDc may be one of the first and second source/drain patterns SD1 and SD2.

One or more gate electrodes GE may be between the connection through conductive pattern TCc and the connection source/drain pattern SDc that are connected to each other. In an implementation, similar to that discussed with reference to FIGS. 3 to 6E, the connection through conductive pattern TCc may be connected through a first connection plug Pa to a first connection line La. The first connection line La may be connected through a second connection plug Pb to a second connection line Lb. The second connection line Lb may be connected through a third connection plug Pc to a third connection line Lc. The third connection line Lc may be connected through a fourth connection plug Pd to the connection source/drain pattern SDc. The first, second, third, and fourth connection plugs Pa, Pb, Pc, and Pd and the first, second, and third connection lines La, Lb, and Lc may constitute one of the lower connection structure LCS and the upper connection structure UCS.

Figure 8A:
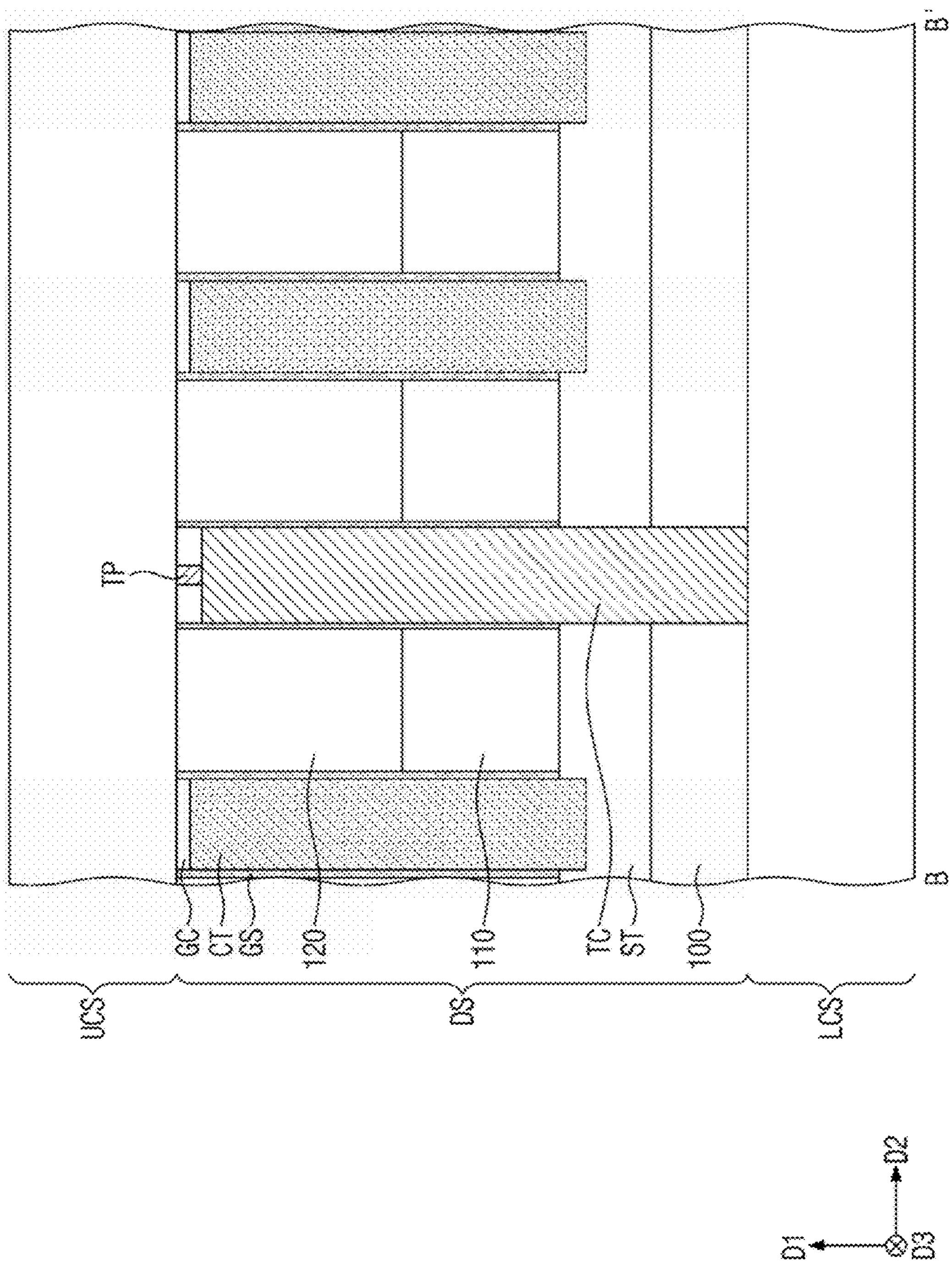
FIGS. 8A and 8B illustrate cross-sectional views respectively taken along lines B-B' and D-D' of FIG. 1, showing a three-dimensional semiconductor device according to some embodiments.
Figure 8B:
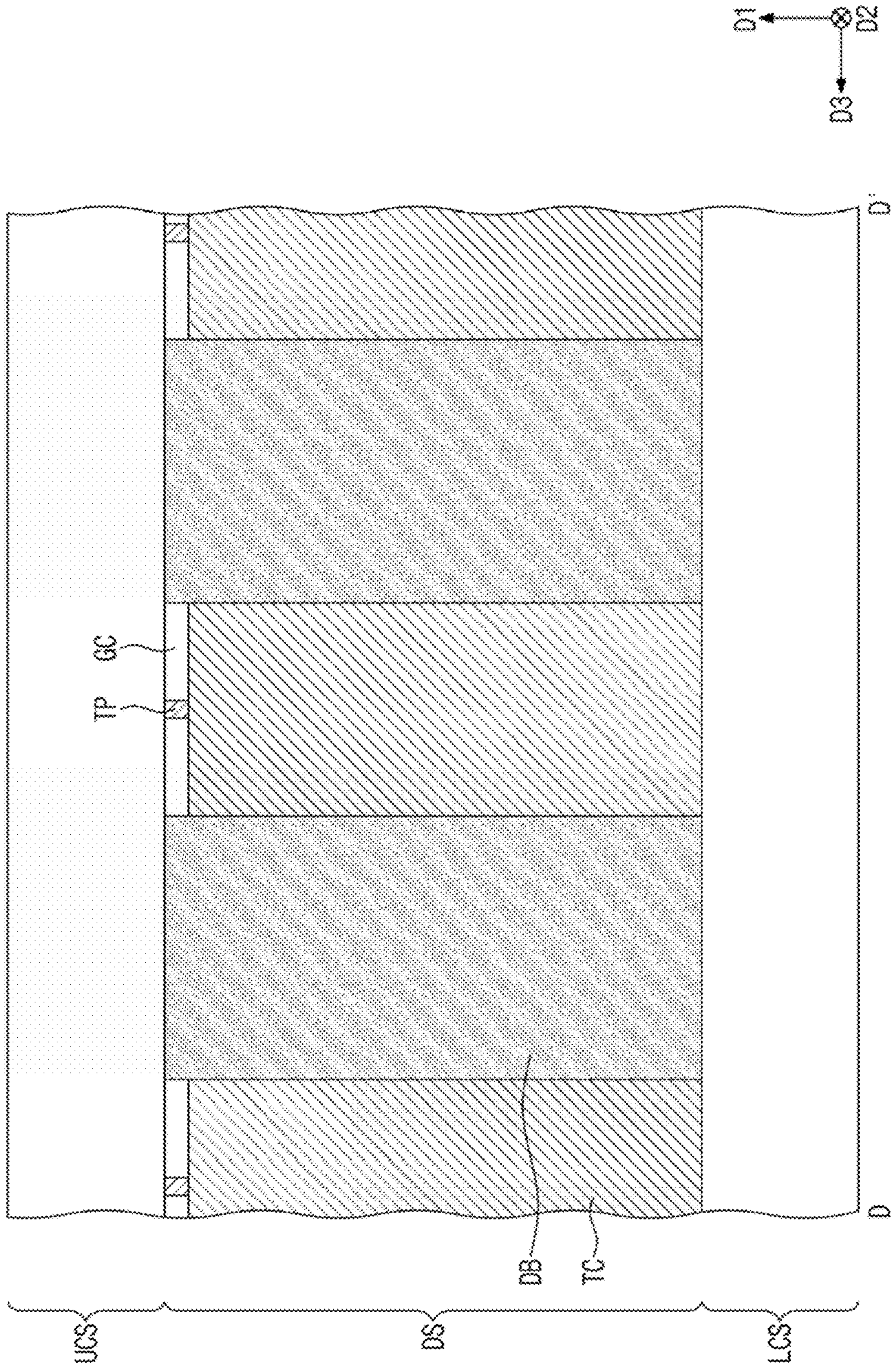
Figure 9A:
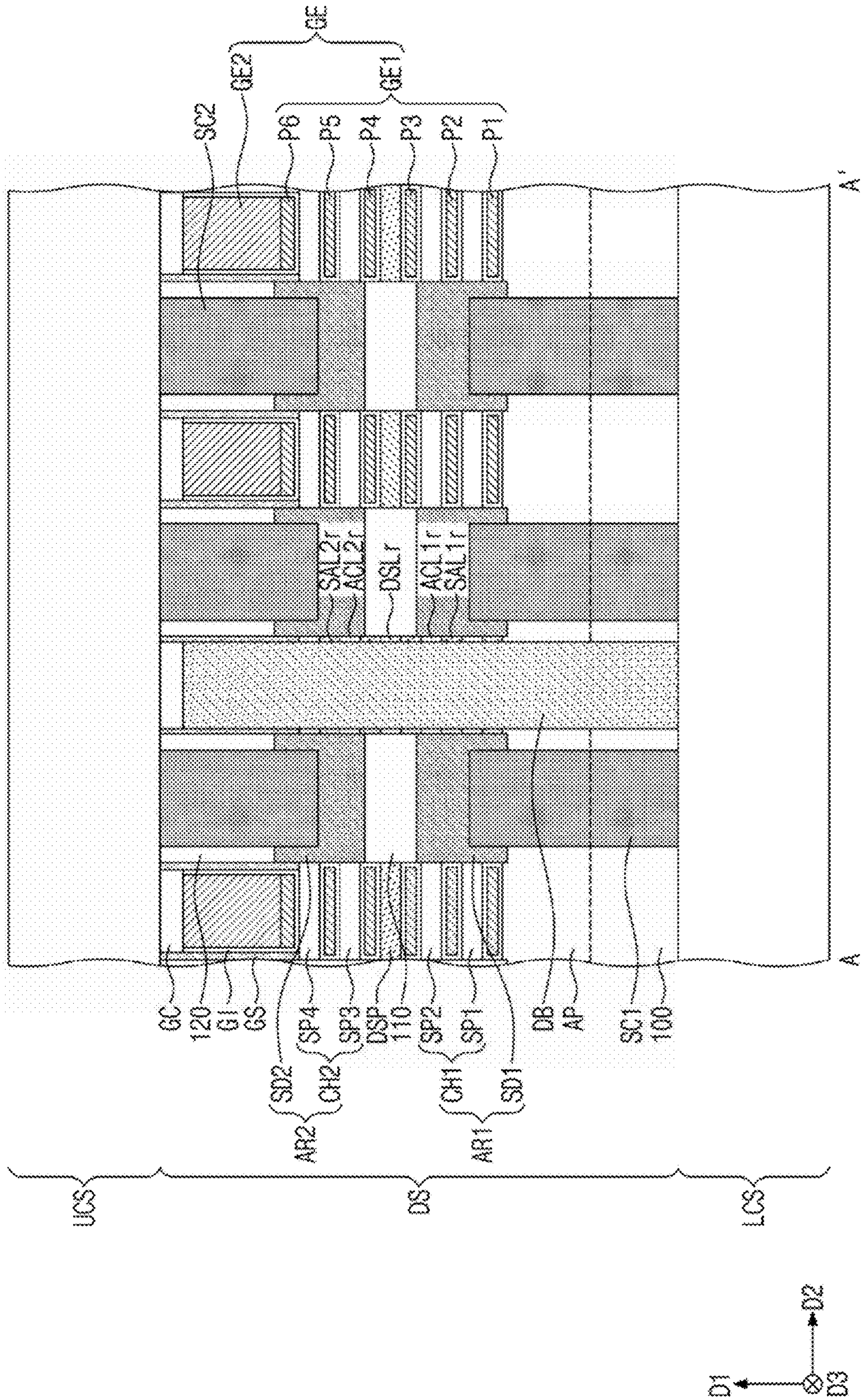
FIGS. 9A and 9B illustrate cross-sectional views respectively taken along lines A-A' and D-D' of FIG. 1, showing a three-dimensional semiconductor device according to some embodiments.
Figure 9B:
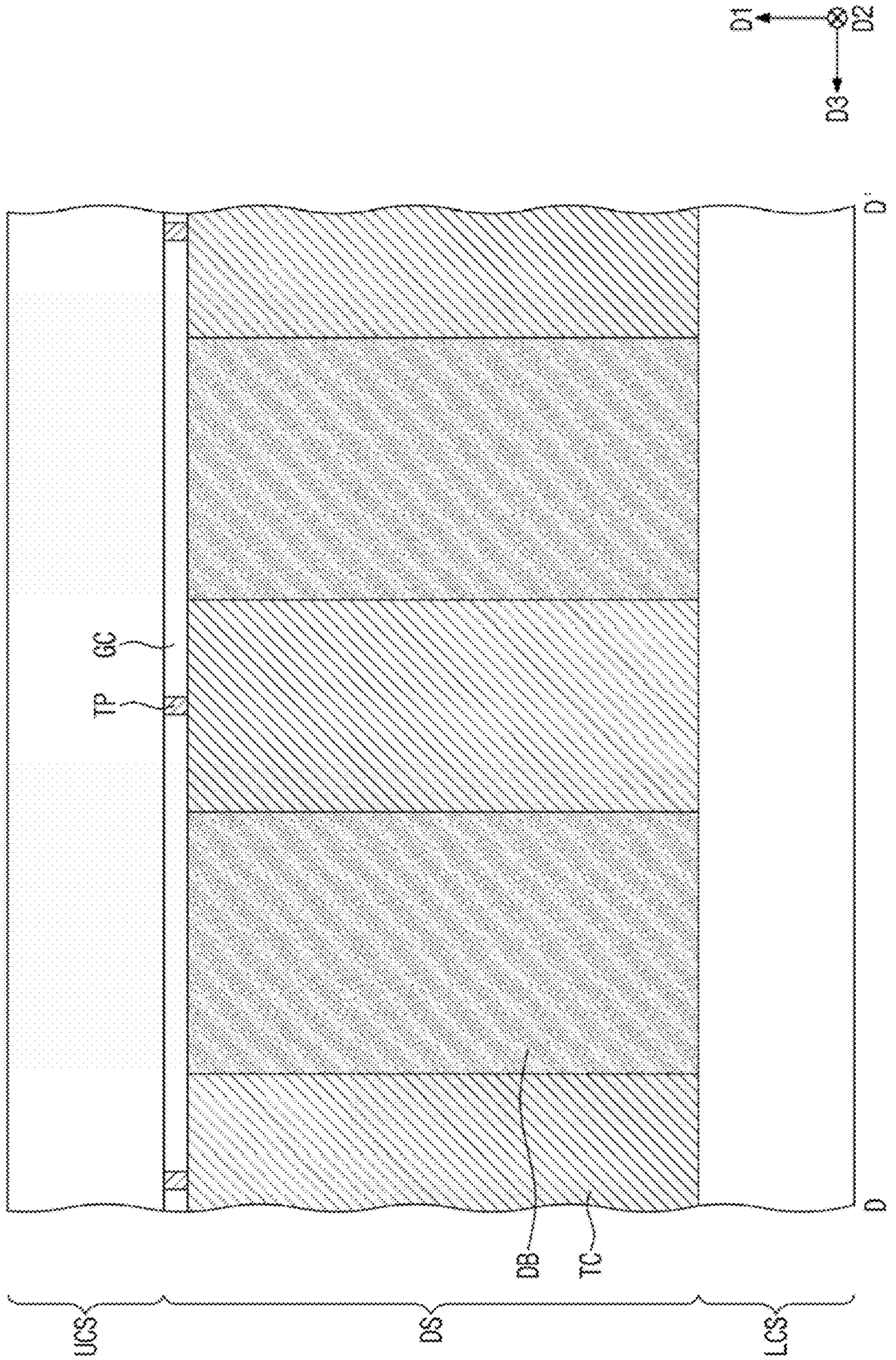

FIGS. 8A and 8B illustrate cross-sectional views respectively taken along lines B-B' and D-D' of FIG. 1, showing a three-dimensional semiconductor device according to some embodiments. FIGS. 9A and 9B illustrate cross-sectional views respectively taken along lines A-A' and D-D' of FIG. 1, showing a three-dimensional semiconductor device according to some embodiments.

Referring to FIGS. 8A and 8B, a portion of the gate capping patterns GC may be on the through conductive pattern TC. The portion of the gate capping patterns GC may extend in the third direction D3 on the through conductive pattern TC. The portion of the gate capping patterns GC may not be on the separation pattern DB. In an implementation, the through conductive pattern TC may be spaced apart from the upper connection structure UCS across the gate capping pattern GC, and may be connected via a through plug TP to the upper connection line UCS.

Referring to FIGS. 8A, 9A, and 9B, a portion of the gate capping patterns GC may be on the through conductive pattern TC and the separation pattern DB. The portion of the gate capping patterns GC may extend in the third direction D3 on the through conductive pattern TC and the separation pattern DB. In an implementation, the through conductive pattern TC may be spaced apart from the upper connection structure UCS across the gate capping pattern GC, and may be connected via a through plug TP to the upper connection line UCS.

FIGS. 10A to 11B illustrate cross-sectional views taken along line D-D' of FIG. 1, showing a three-dimensional semiconductor device according to some embodiments.

Referring to FIGS. 10A to 11B, the through conductive pattern TC may include a penetration part TCa that extends along the first direction D1 and a protrusion part TCb that protrudes toward the separation pattern DB from the penetration part TCa. In an implementation, the separation pattern DB may include a penetration part DBa that extends along the first direction D1 and a protrusion part DBb that protrudes toward the through conductive pattern TC from the penetration part DBa. The penetration part TCa of the through conductive pattern TC may be spaced apart in the third direction D3 from the penetration part DBa of the separation pattern DB. The protrusion part TCb of the through conductive pattern TC may vertically overlap the protrusion part DBb of the separation pattern DB.

Figure 10A:
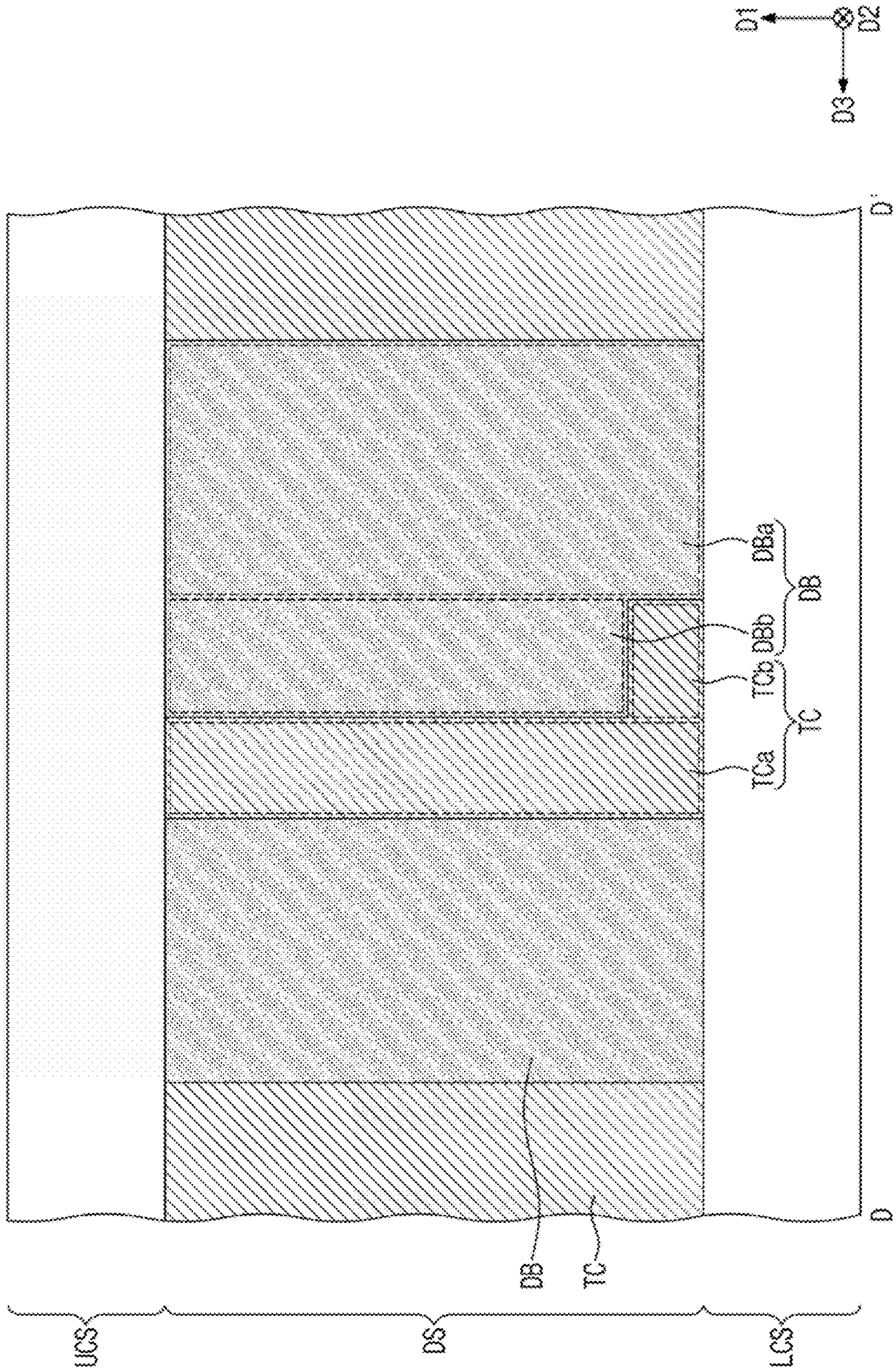
FIGS. 10A to 11B illustrate cross-sectional views taken along line D-D' of FIG. 1, showing a three-dimensional semiconductor device according to some embodiments.
Figure 10B:
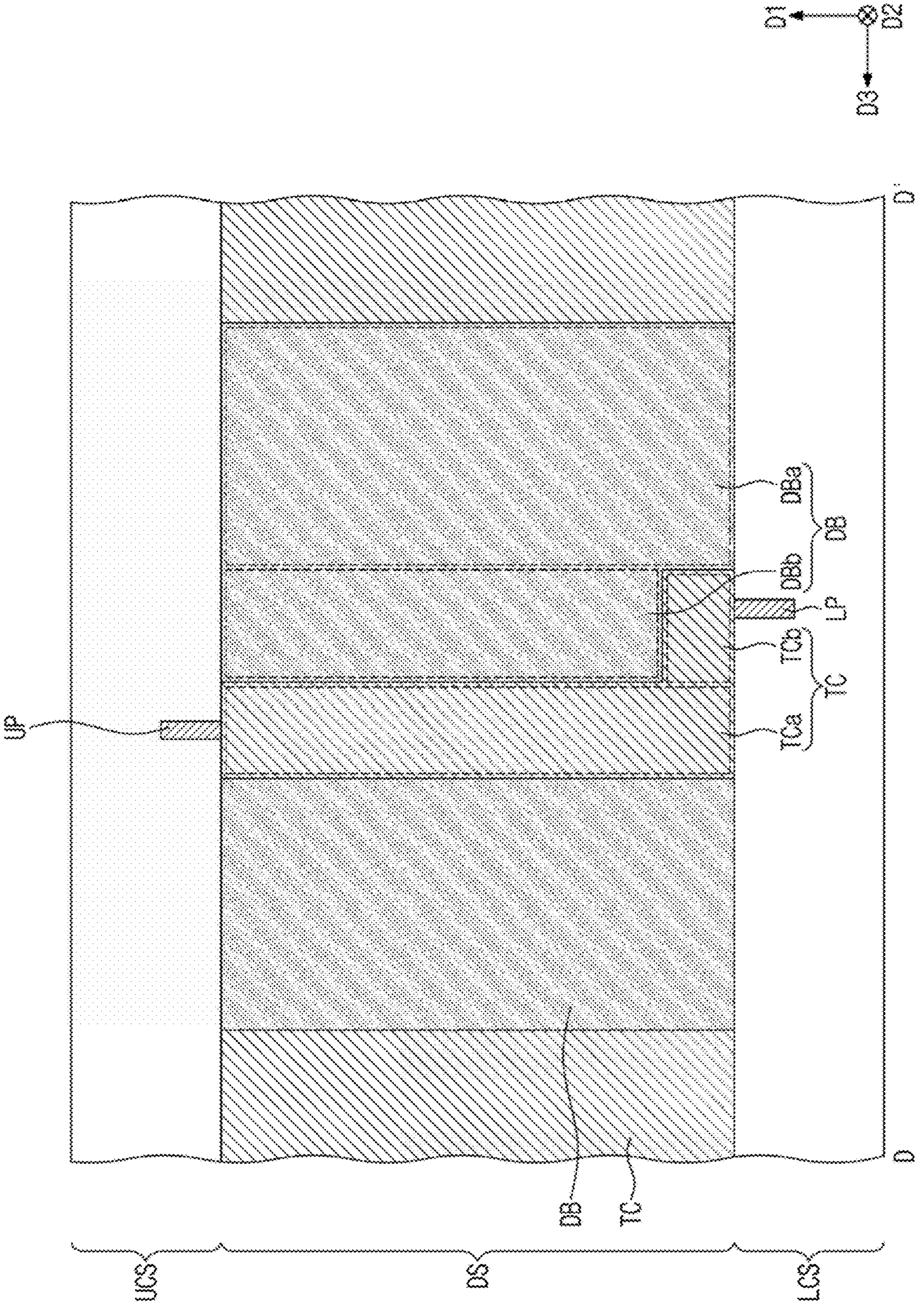

As shown in FIGS. 10A and 10B, the protrusion part TCb of the through conductive pattern TC may protrude from a lower portion of the penetration part TCa of the through conductive pattern TC. The protrusion part DBb of the separation pattern DB may be between the upper connection structure UCS and the protrusion part TCb of the through conductive pattern TC.

As shown in FIG. 10B, the upper connection structure UCS may include an upper conductive plug UP. The lower connection structure LCS may include a lower conductive plug LP. The upper conductive plug UP may be connected to the penetration part TCa of the through conductive pattern TC. The lower conductive plug LP may be connected to the protrusion part TCb of the through conductive pattern TC. The upper conductive plug UP and the lower conductive plug LP may not vertically overlap each other (e.g., may be vertically misaligned). The upper conductive plug UP and the lower conductive plug LP may be connected to each other via the through conductive pattern TC.

Figure 11A:
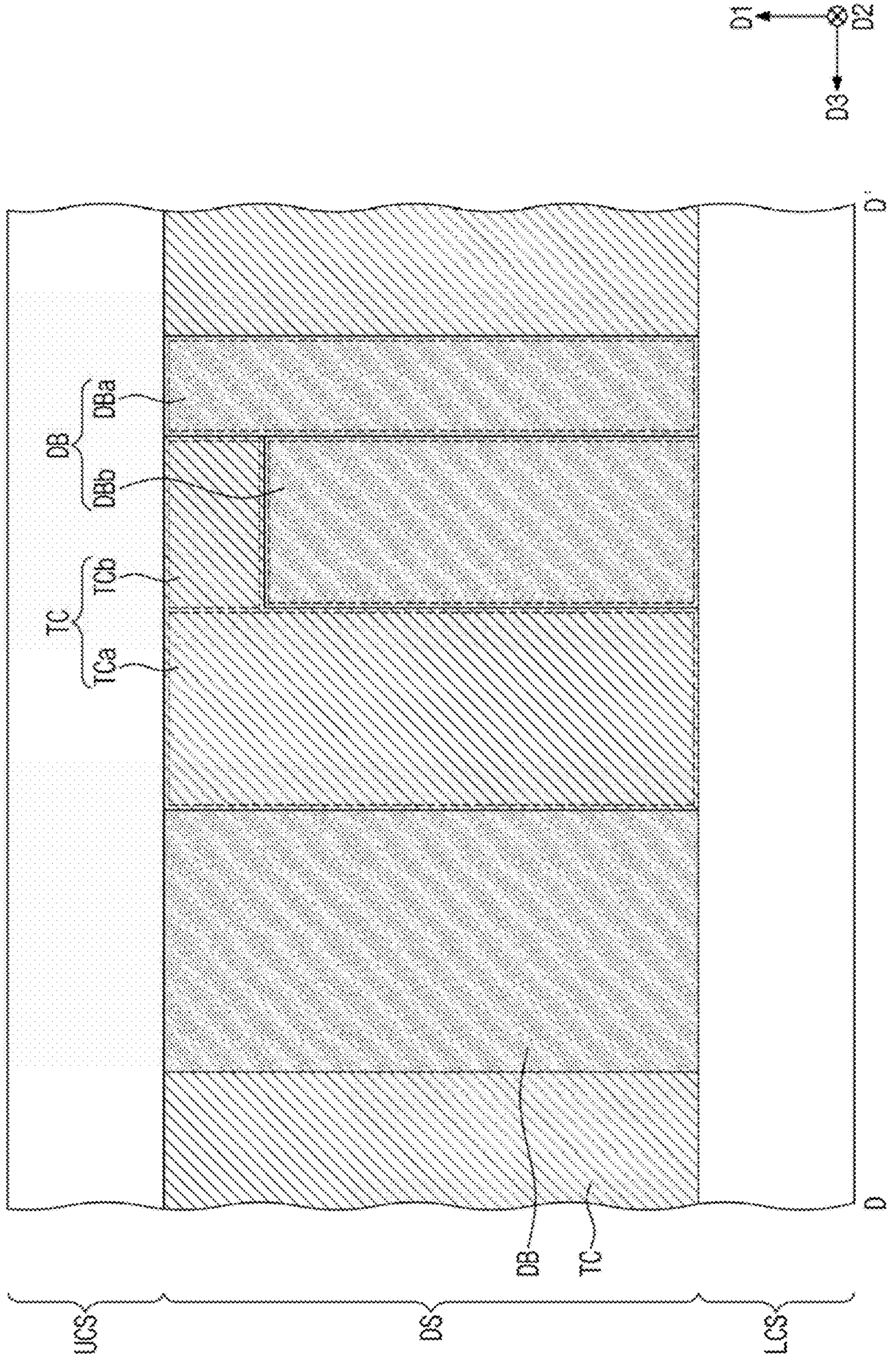
Figure 11B:
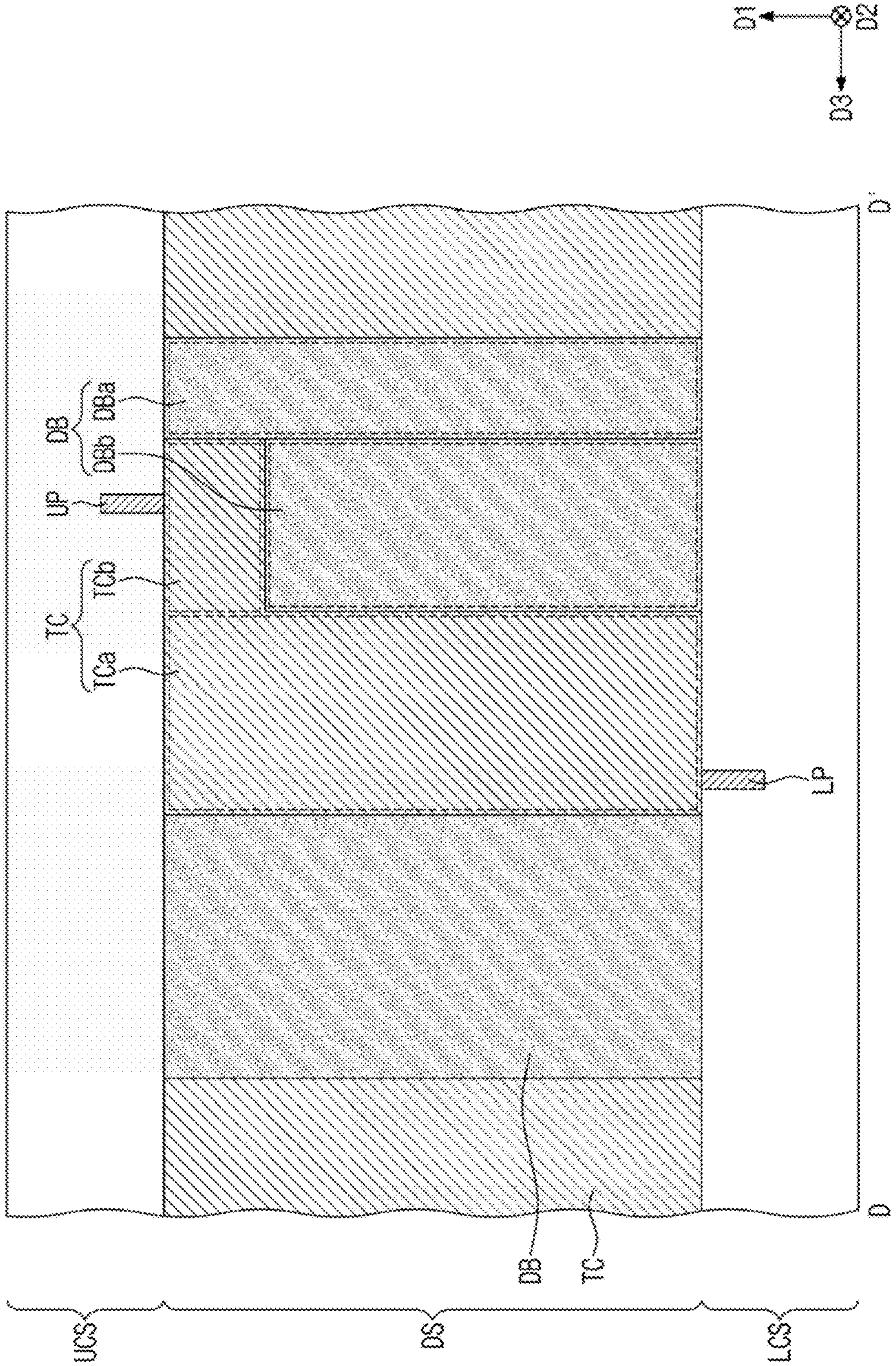
Figure 12A:
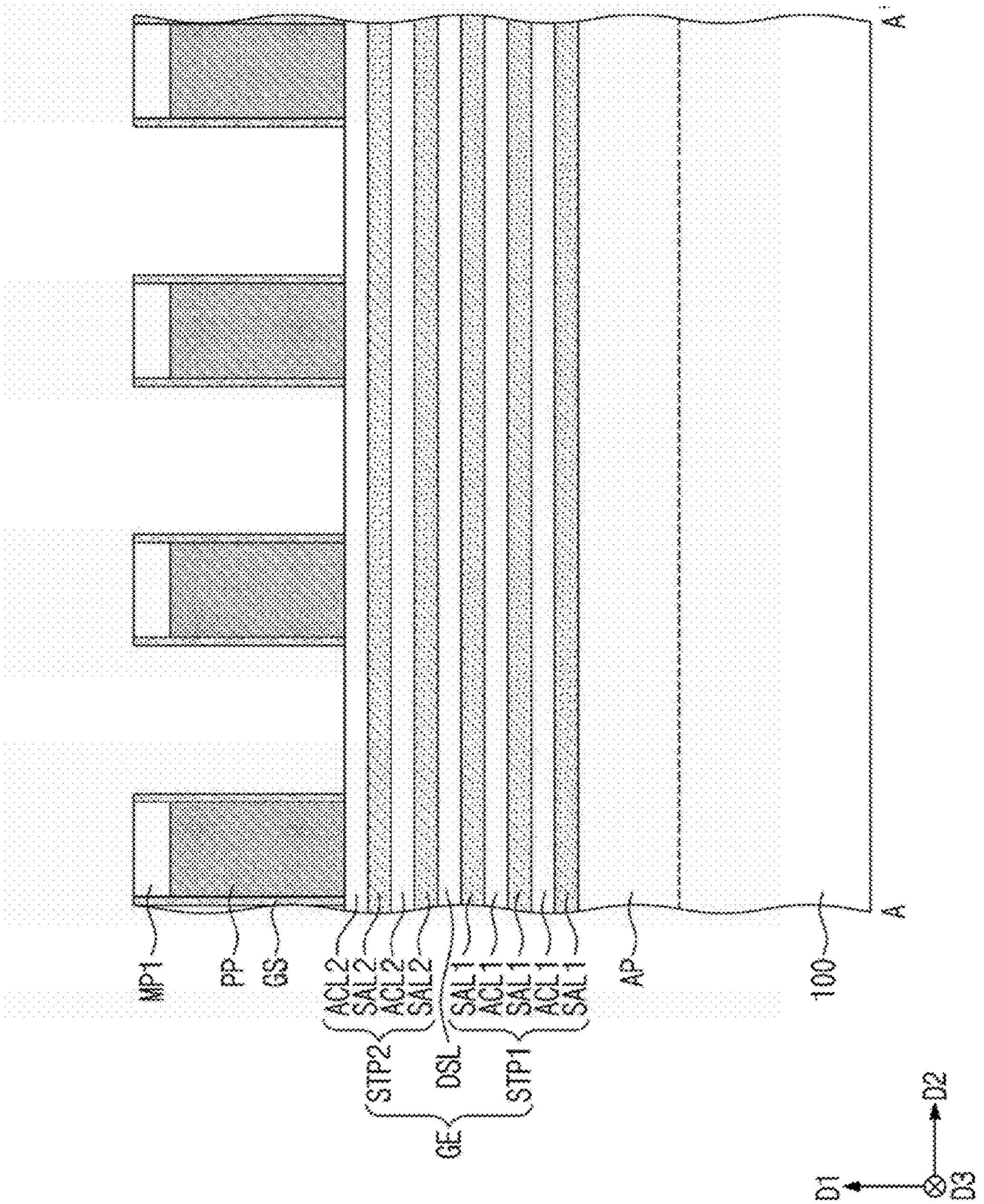
FIGS. 12A to 17D illustrate cross-sectional views of stages in a method of fabricating a three-dimensional semiconductor device depicted in FIGS. 2A to 2E.
Figure 12B:
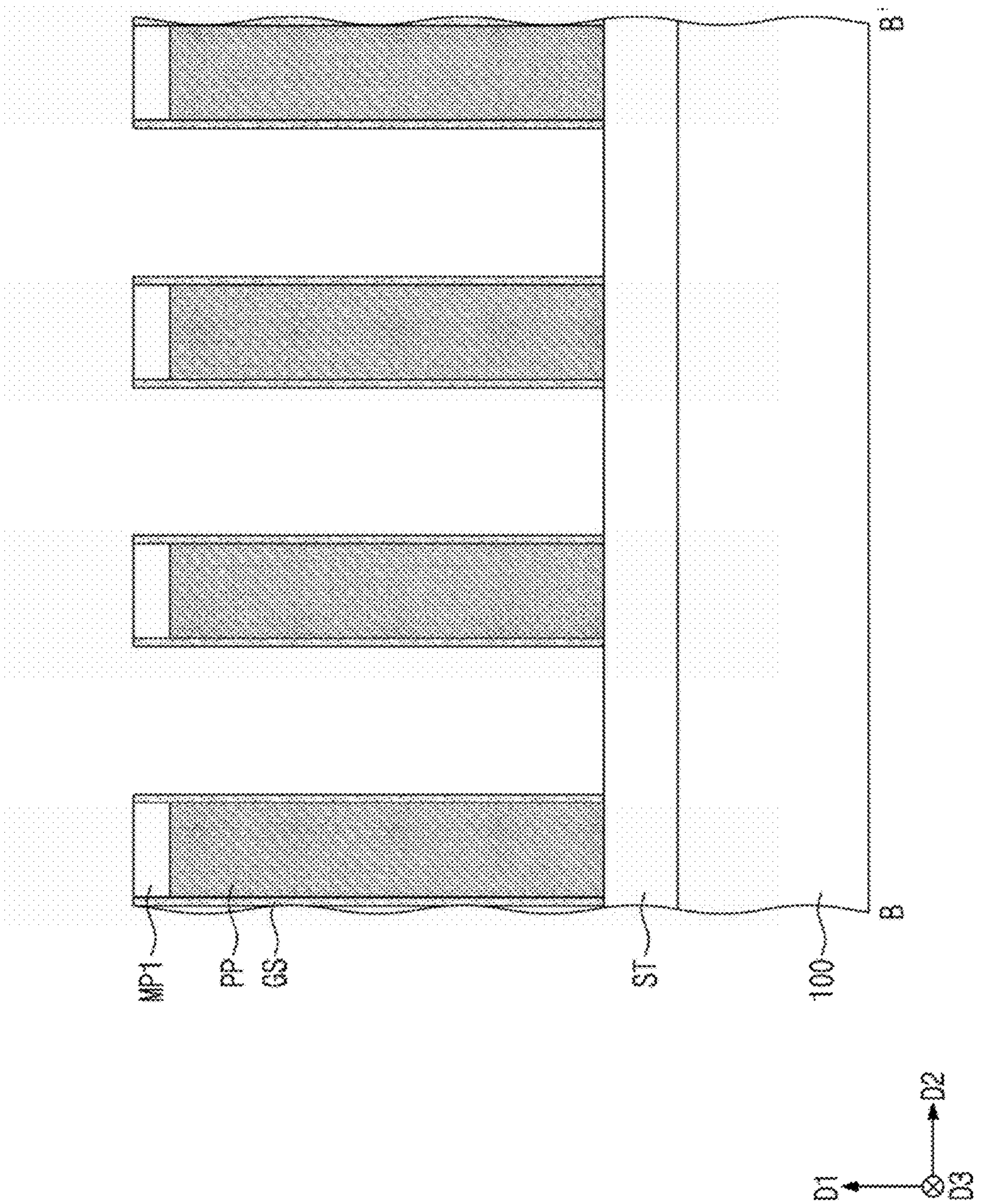
Figure 12C:
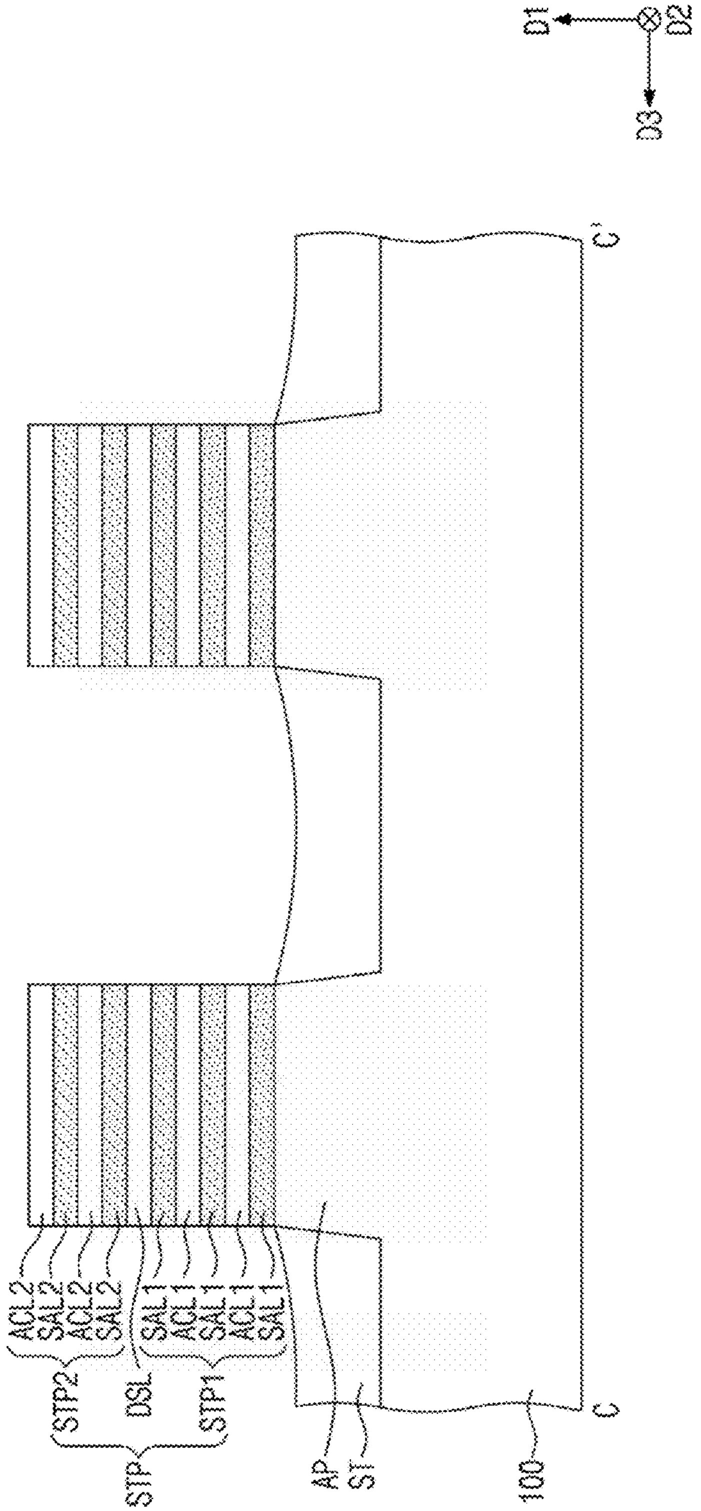
Figure 12D:
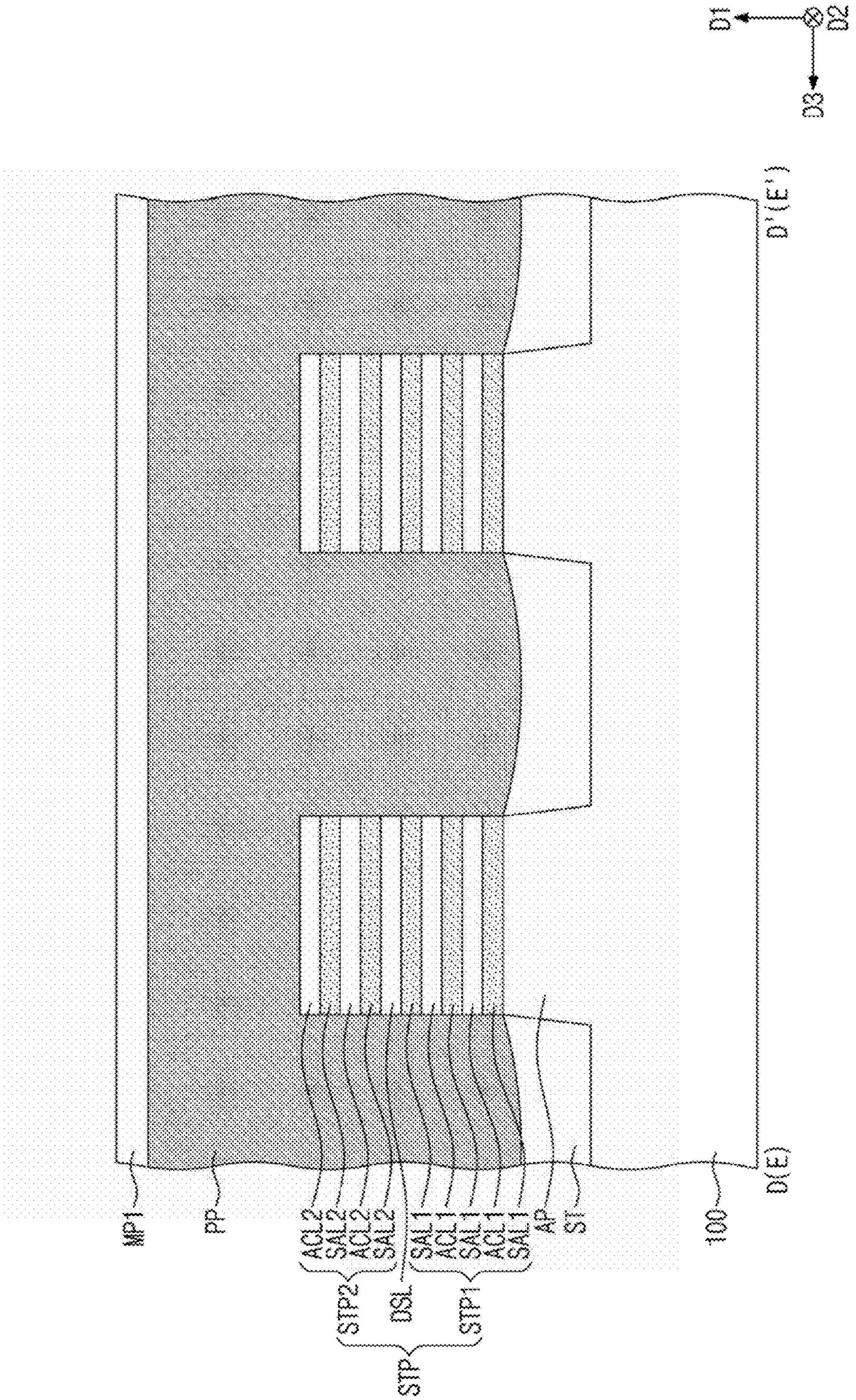
Figure 13A:
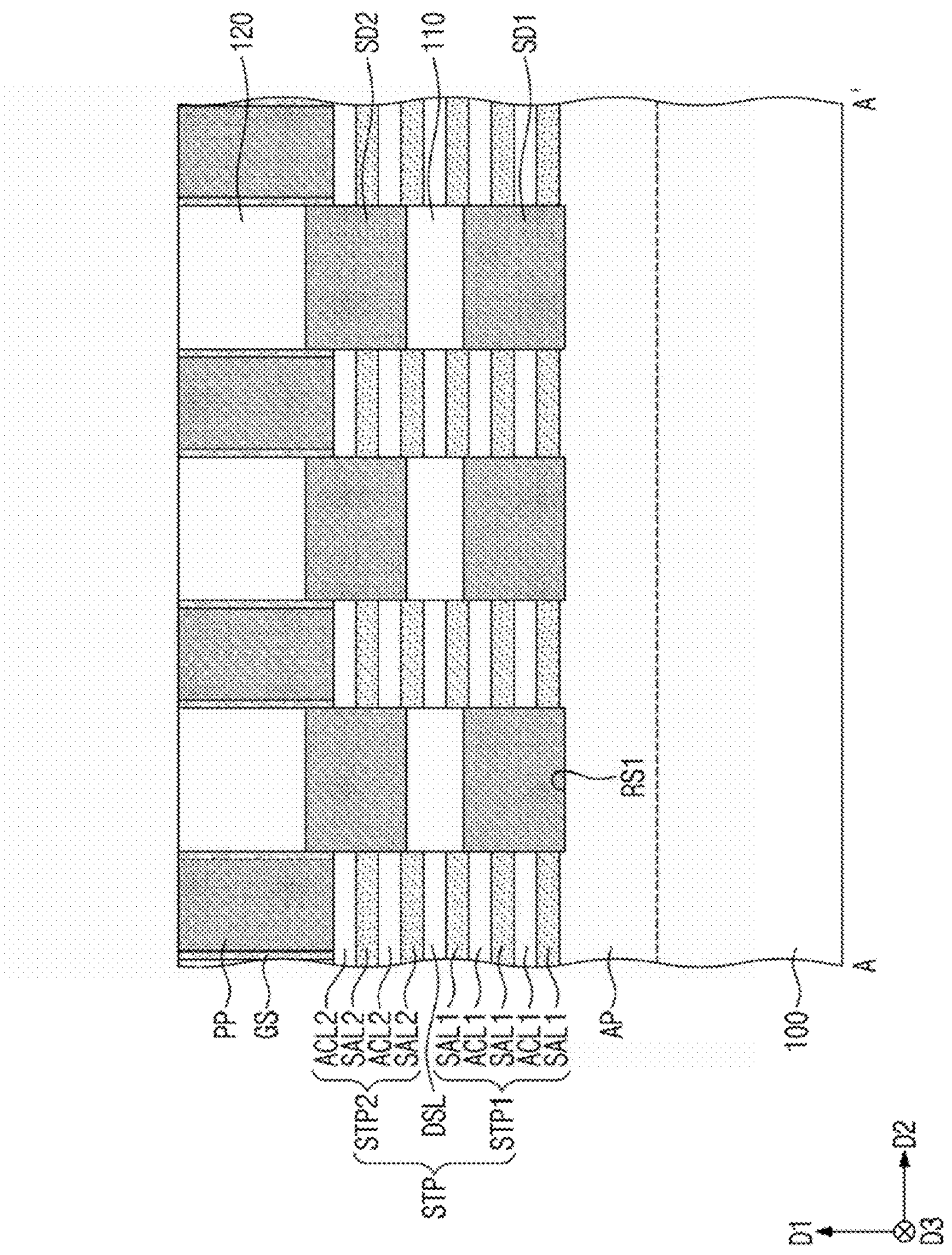
Figure 13B:
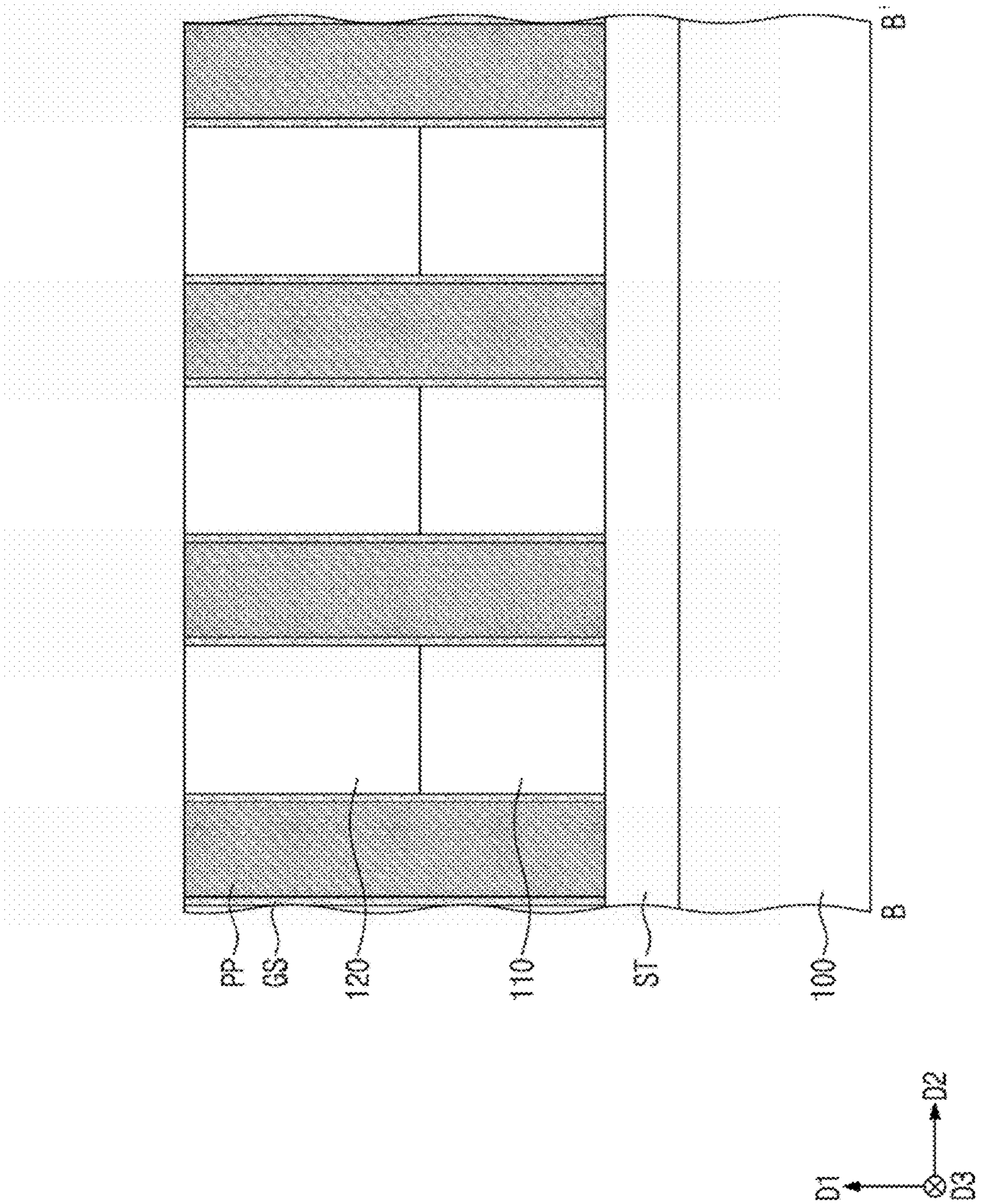
Figure 13C:
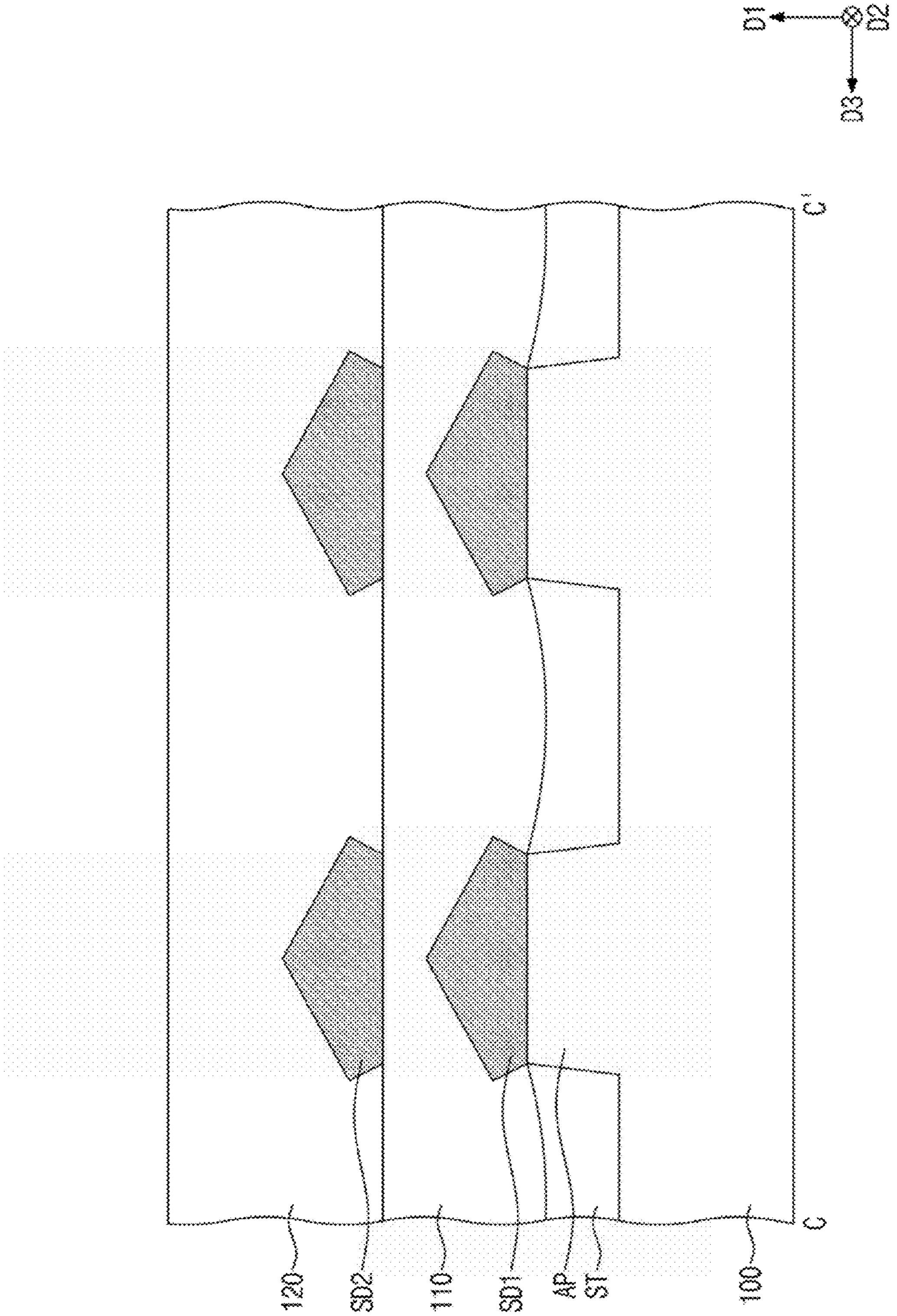
Figure 13D:
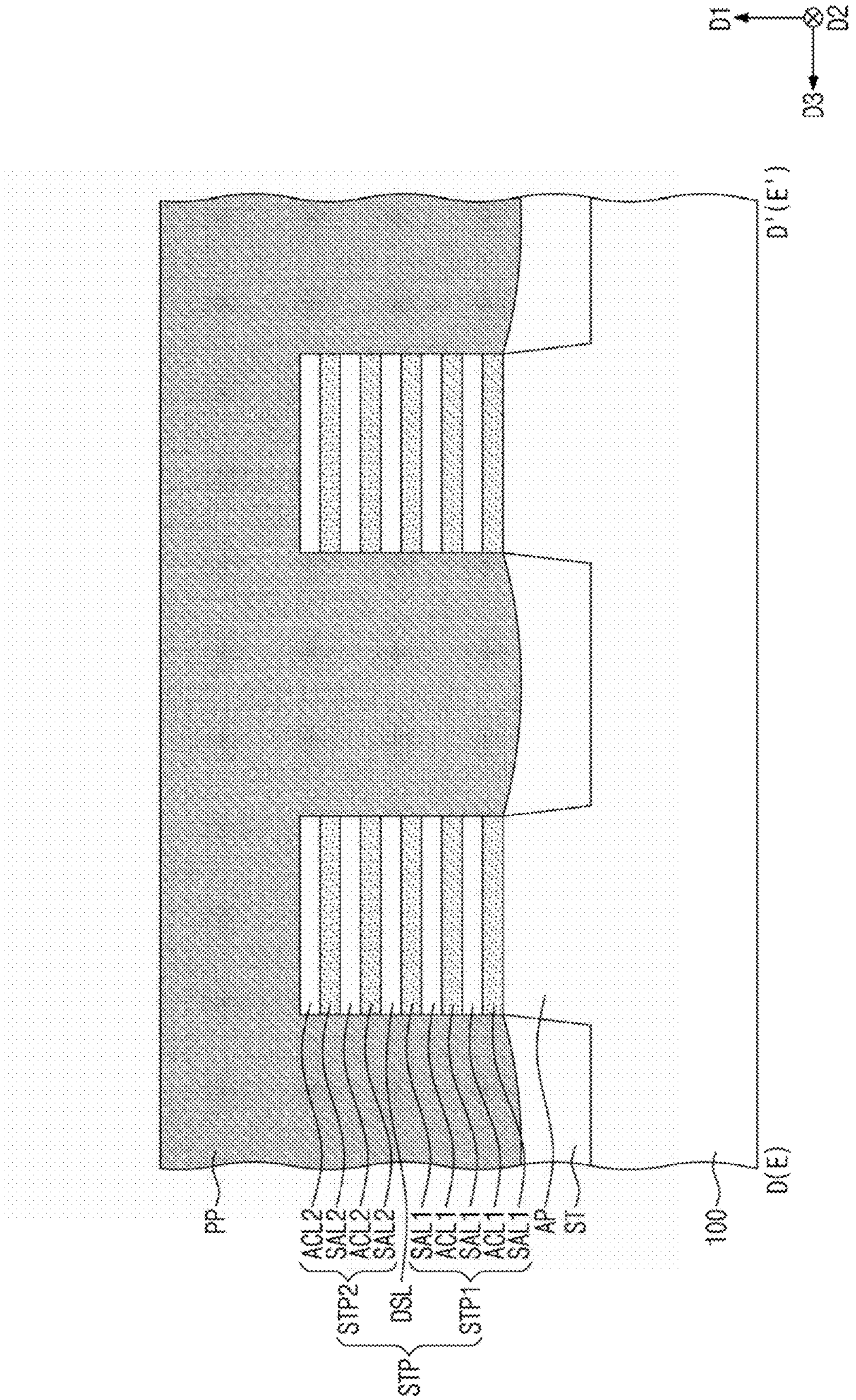
Figure 14A:
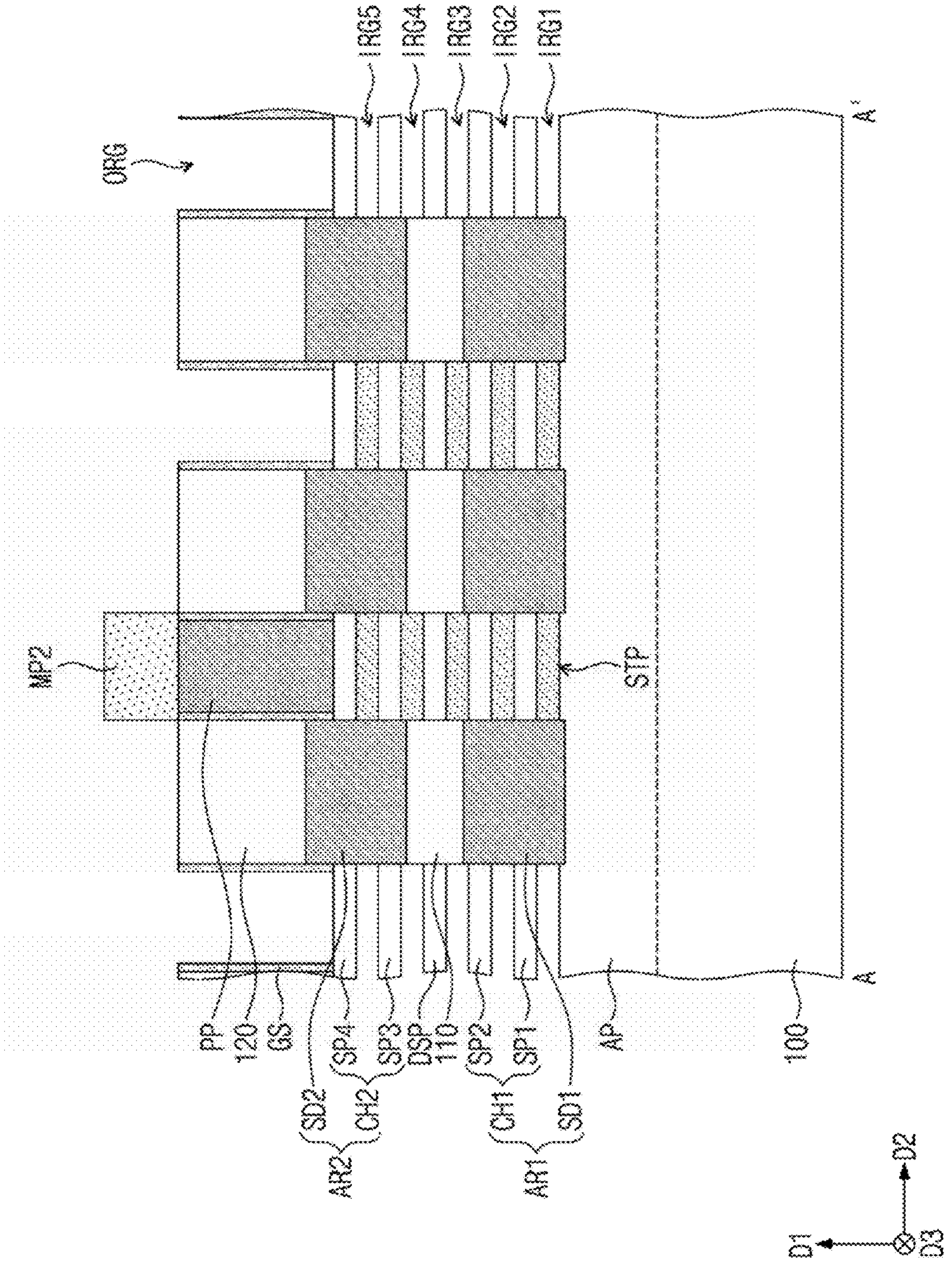
Figure 14B:
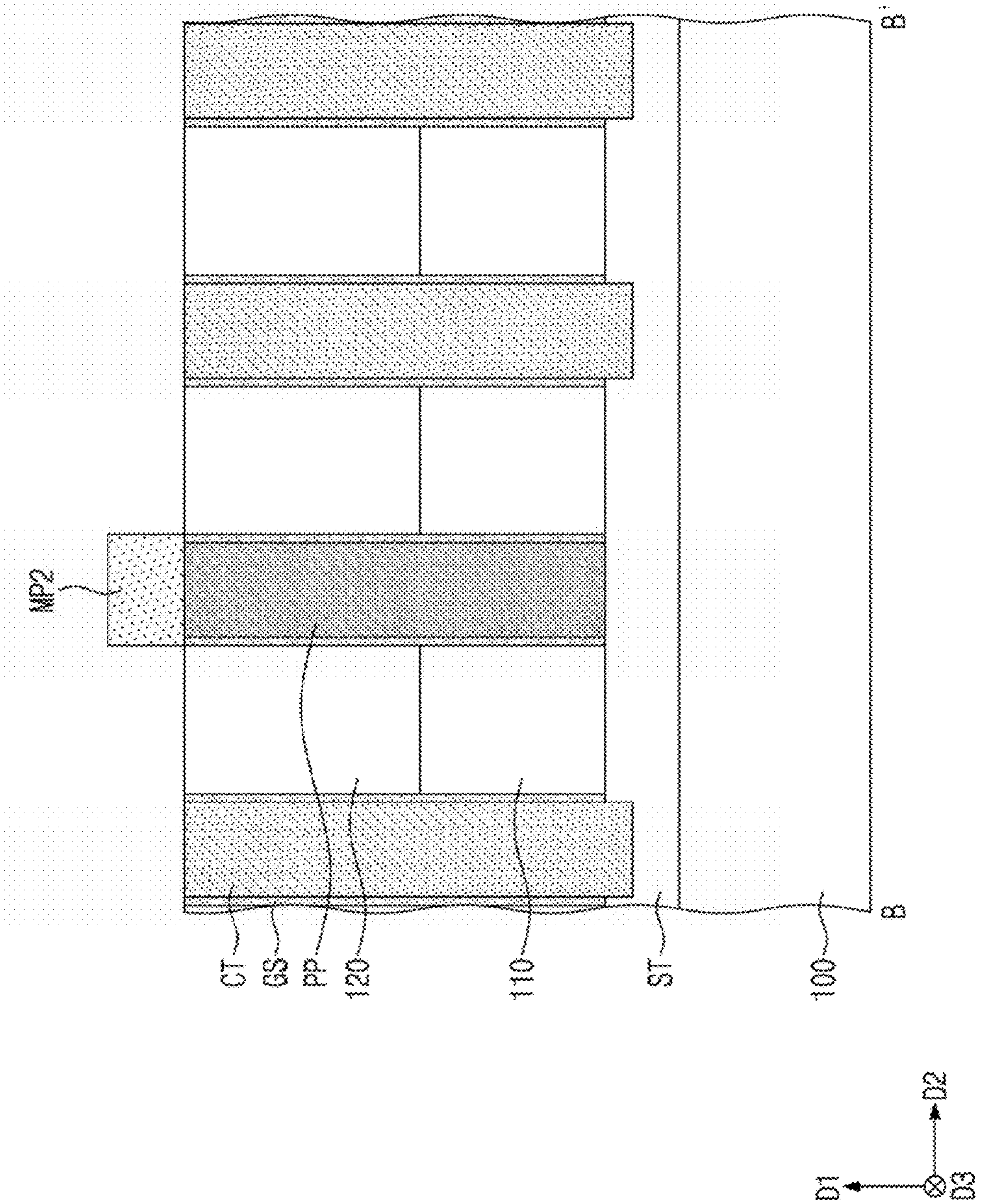
Figure 14C:
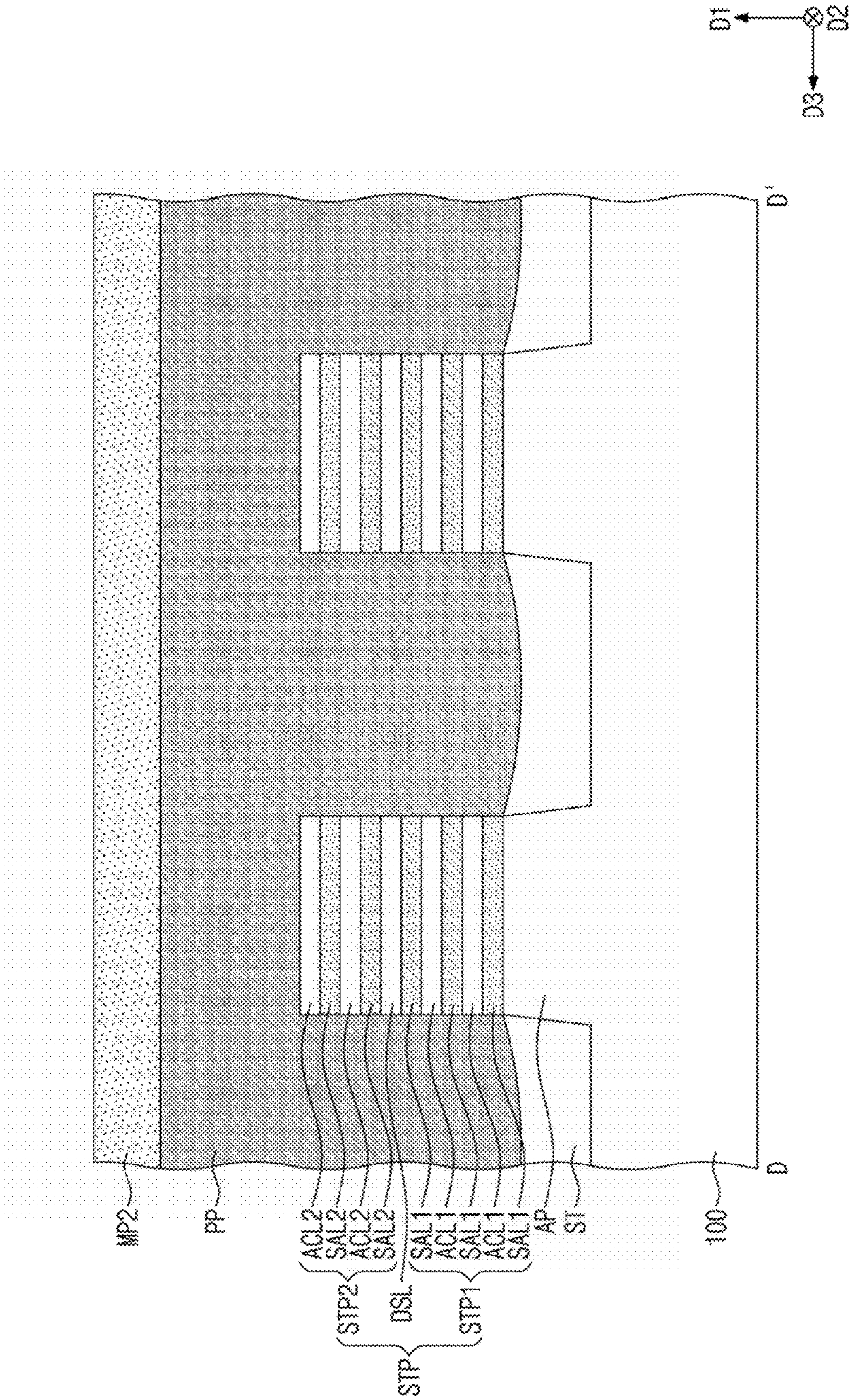
Figure 14D:
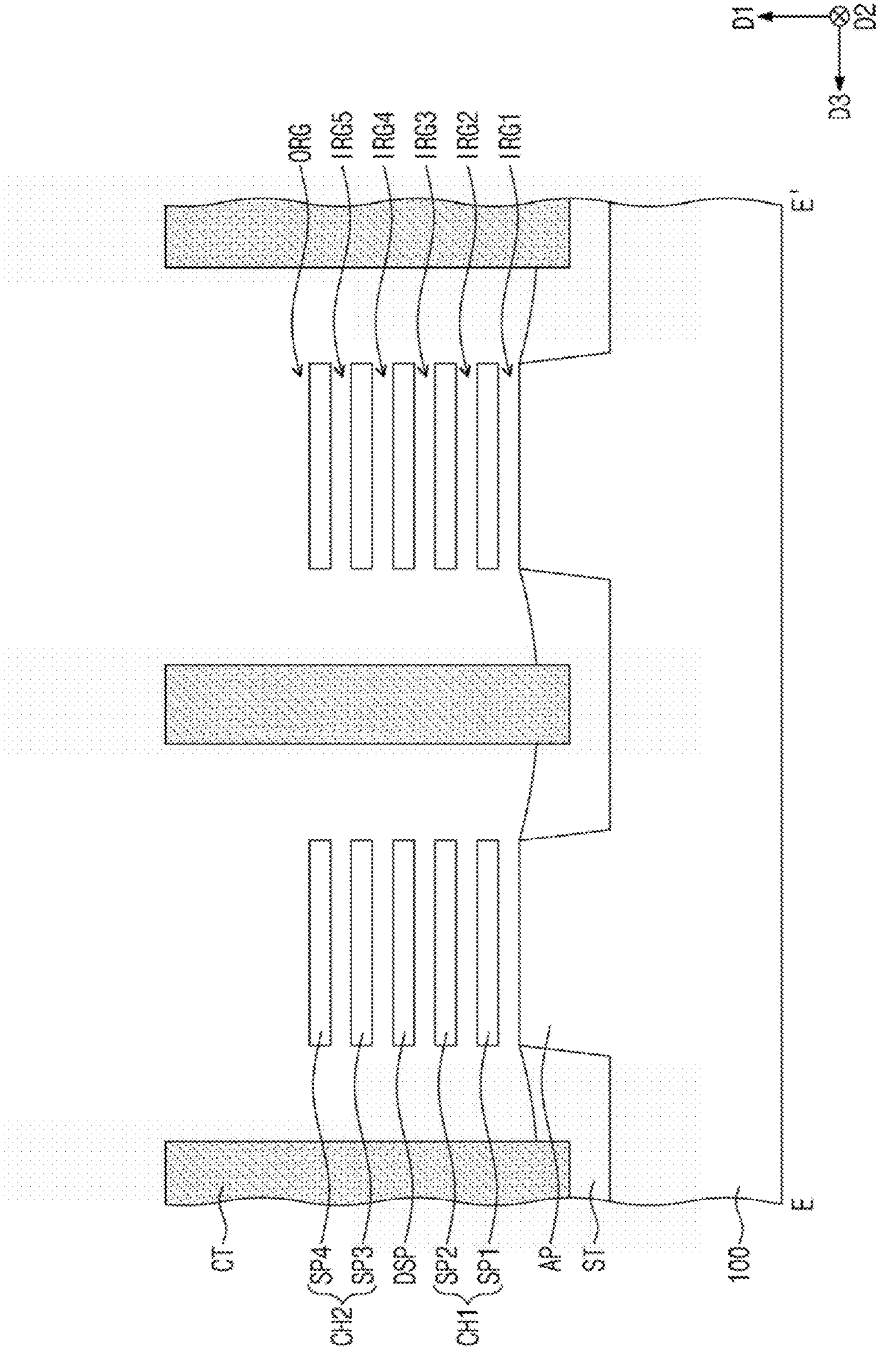
Figure 15A:
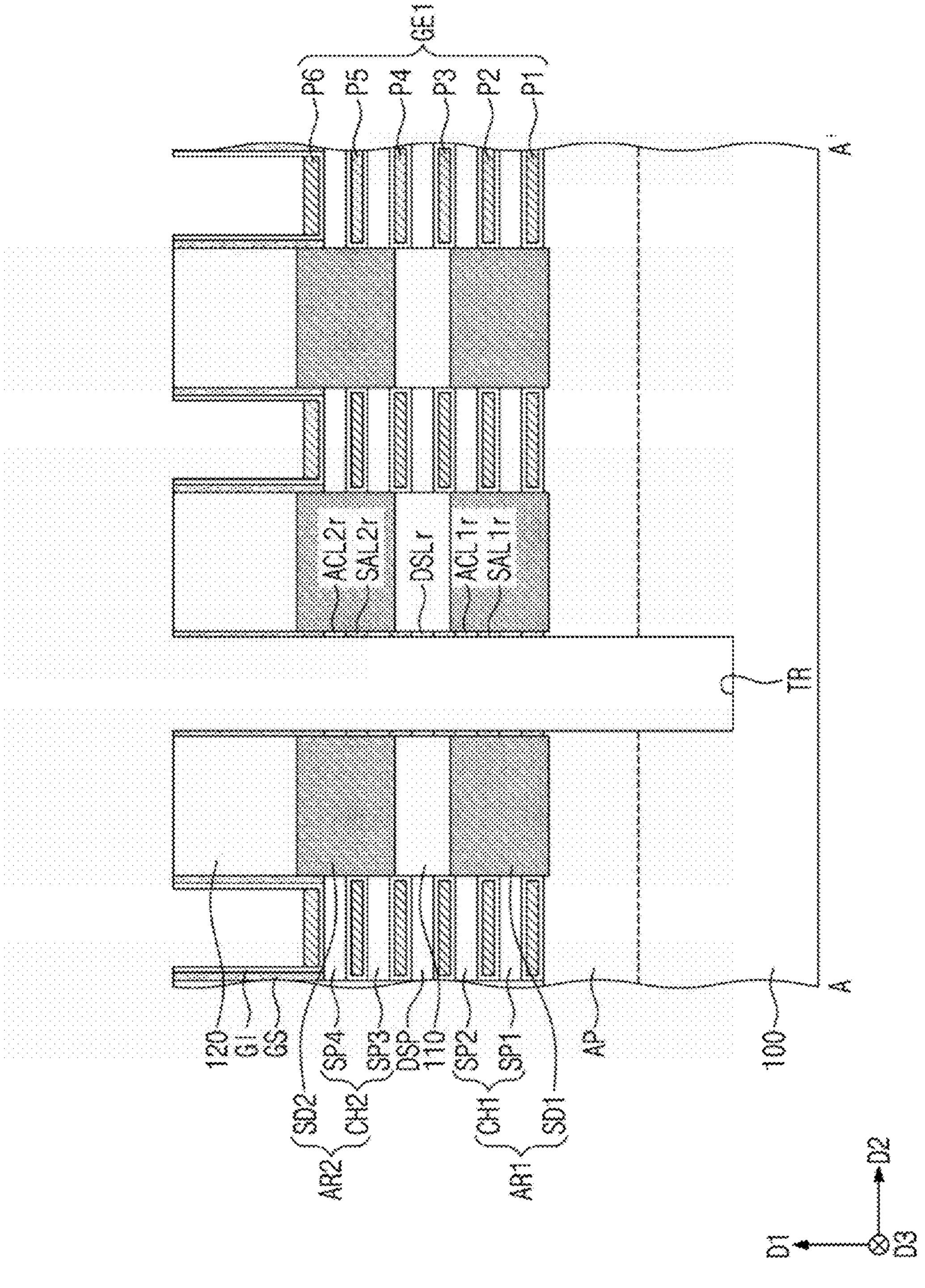
Figure 15B:
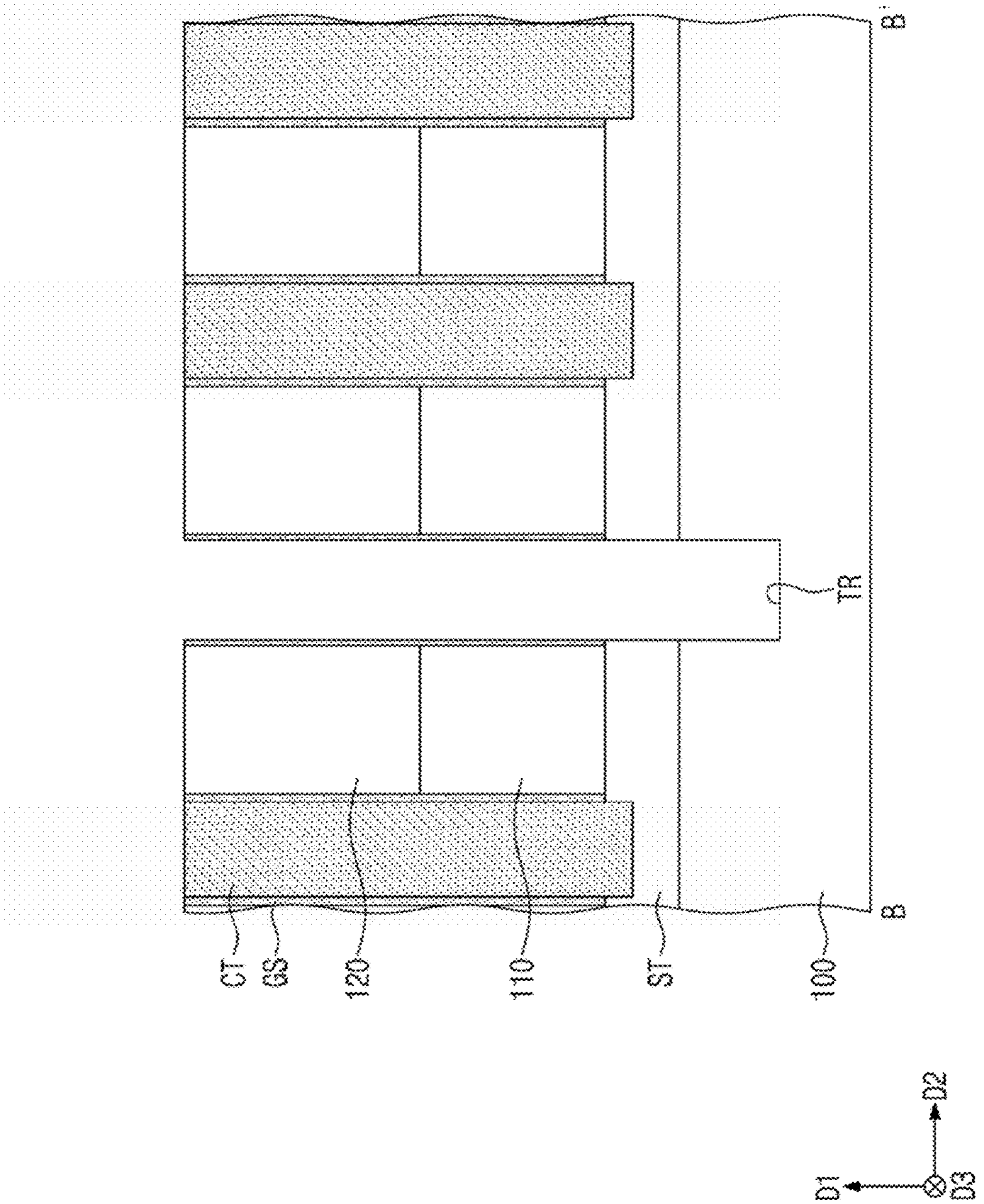
Figure 15C:
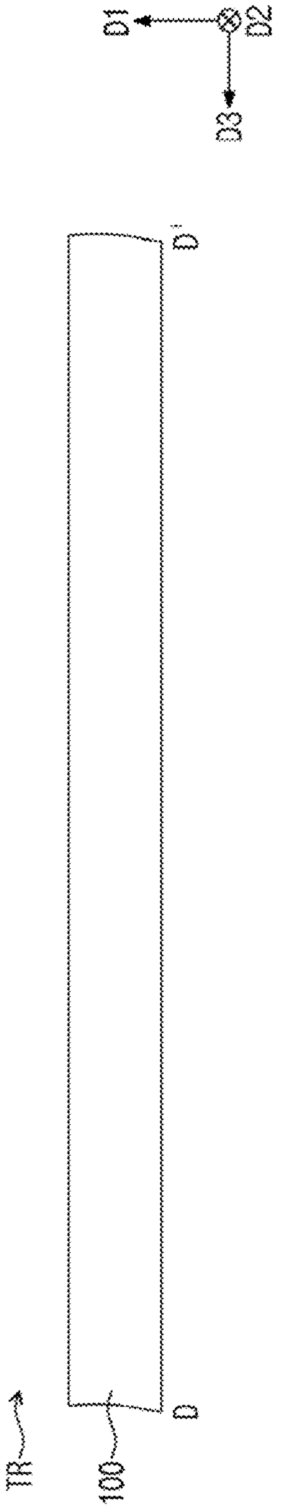
Figure 15D:
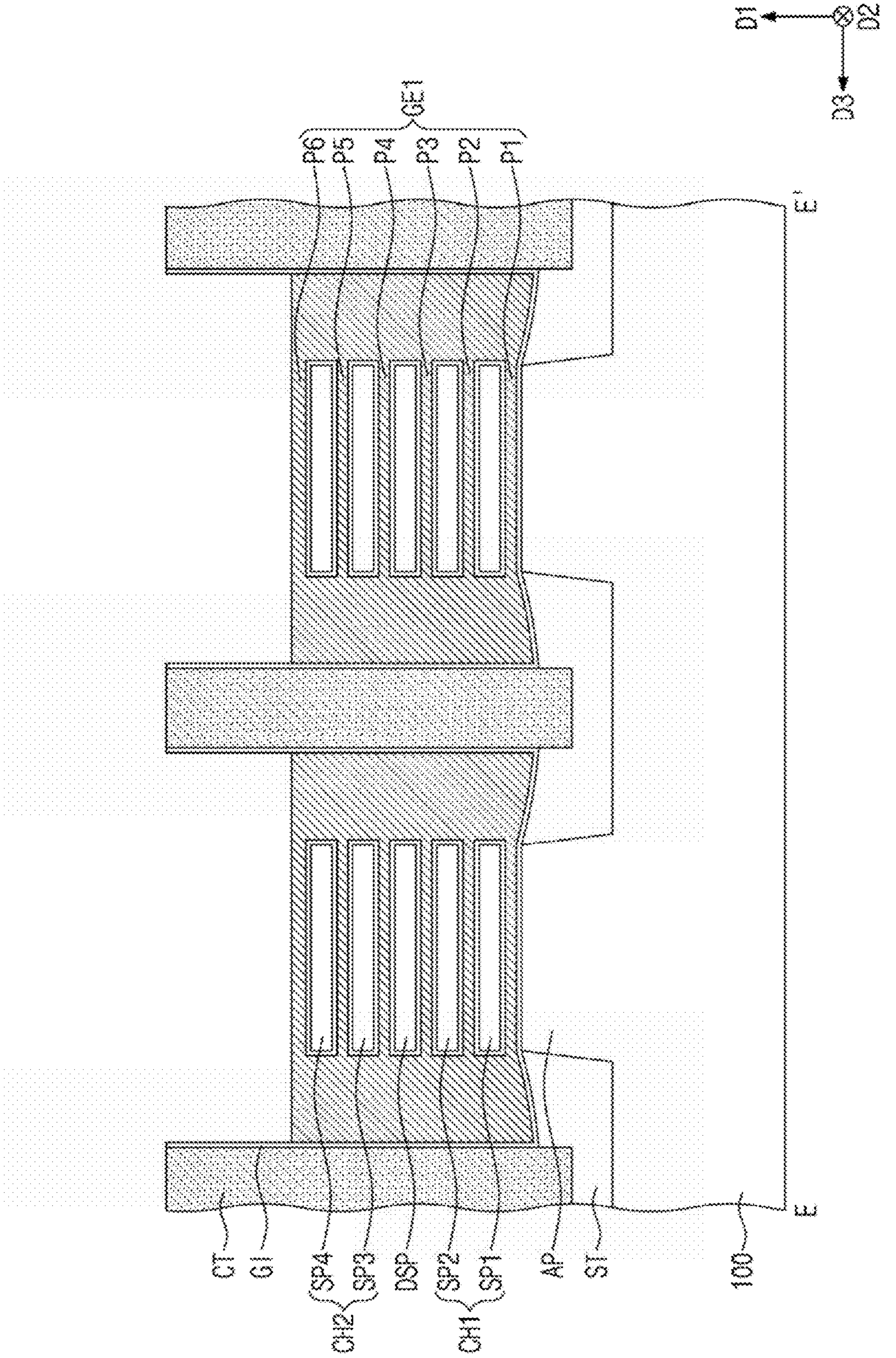
Figure 16A:
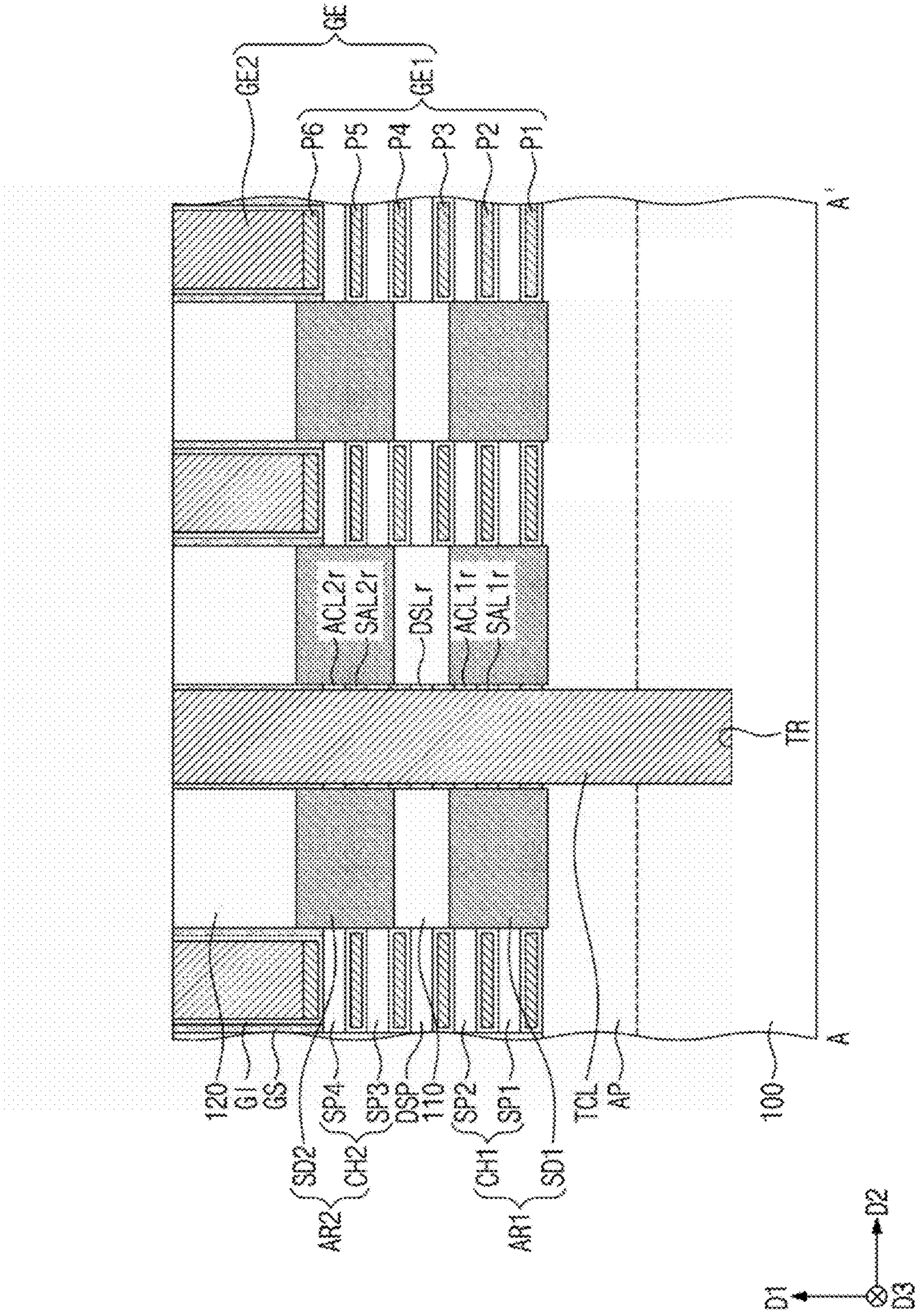
Figure 16B:
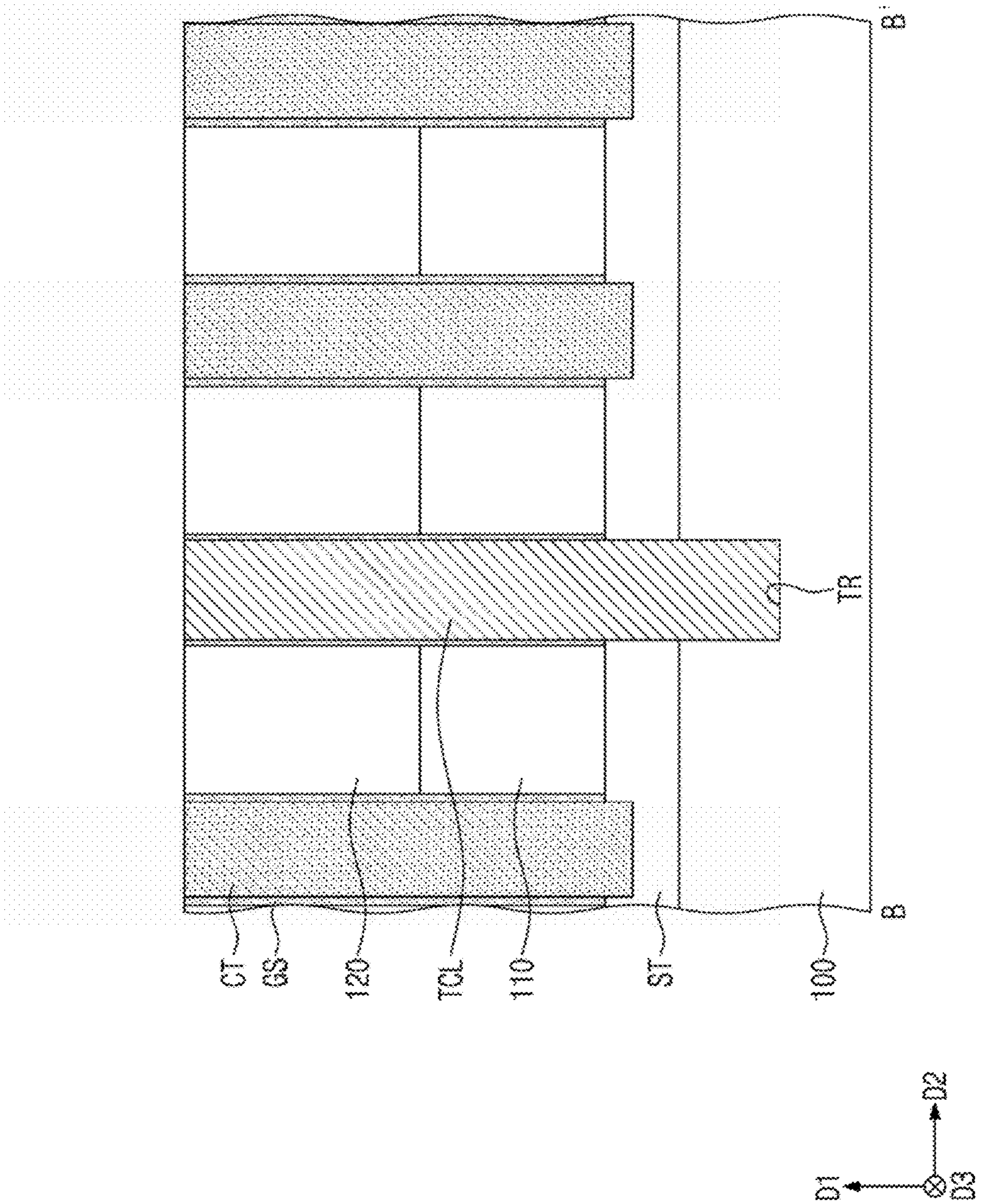
Figure 16C:
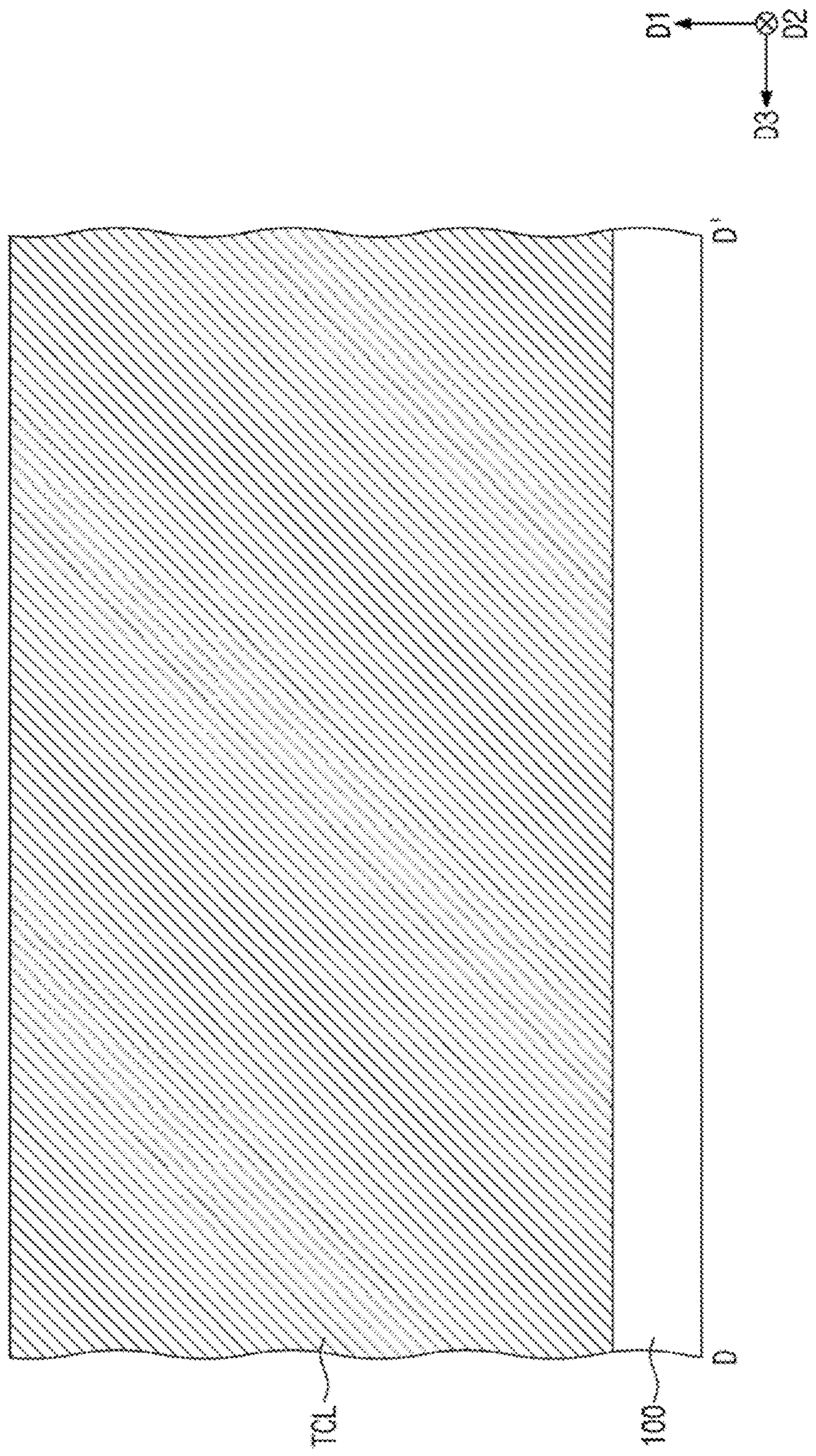
Figure 16D:
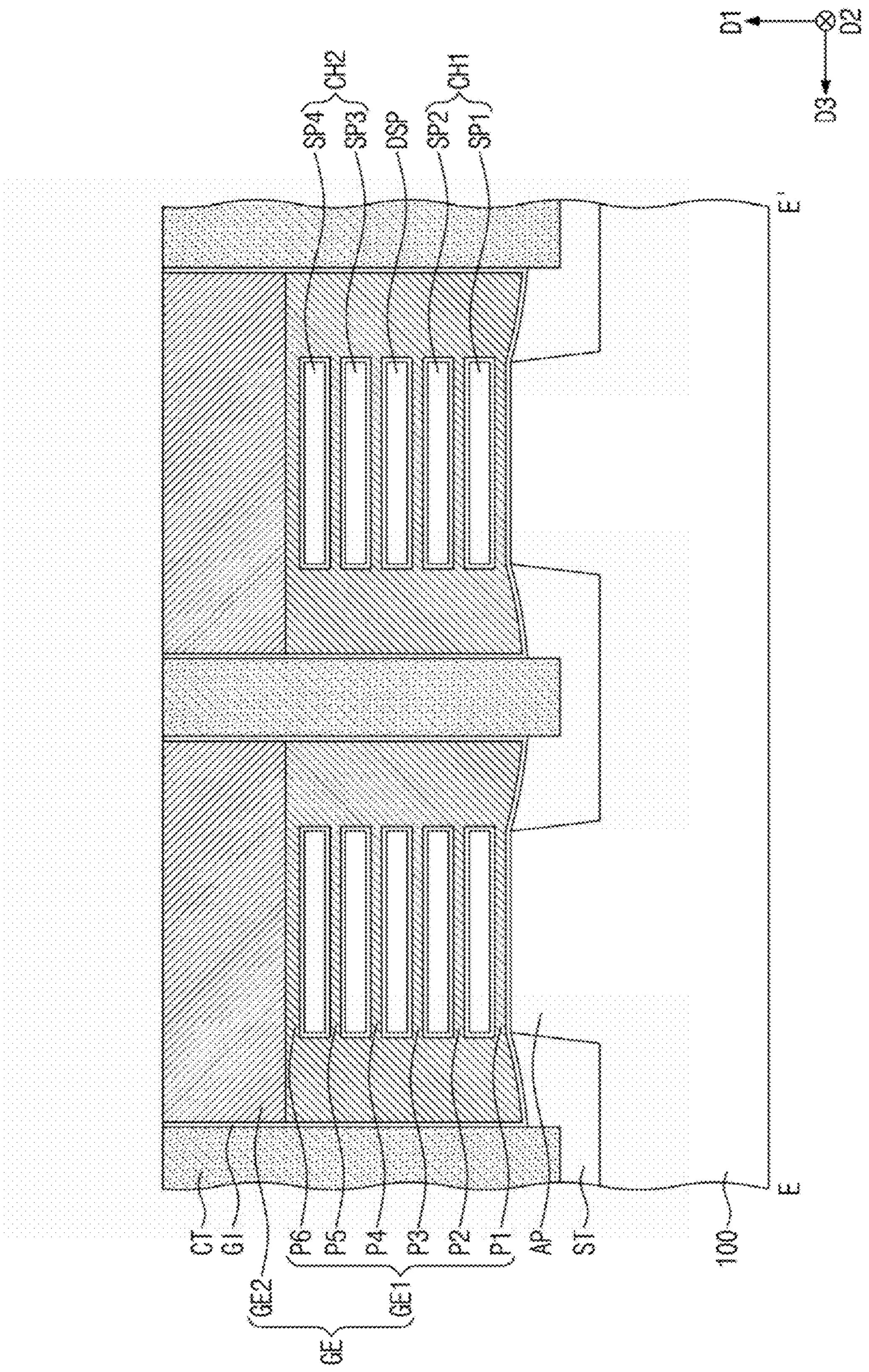
Figure 17A:
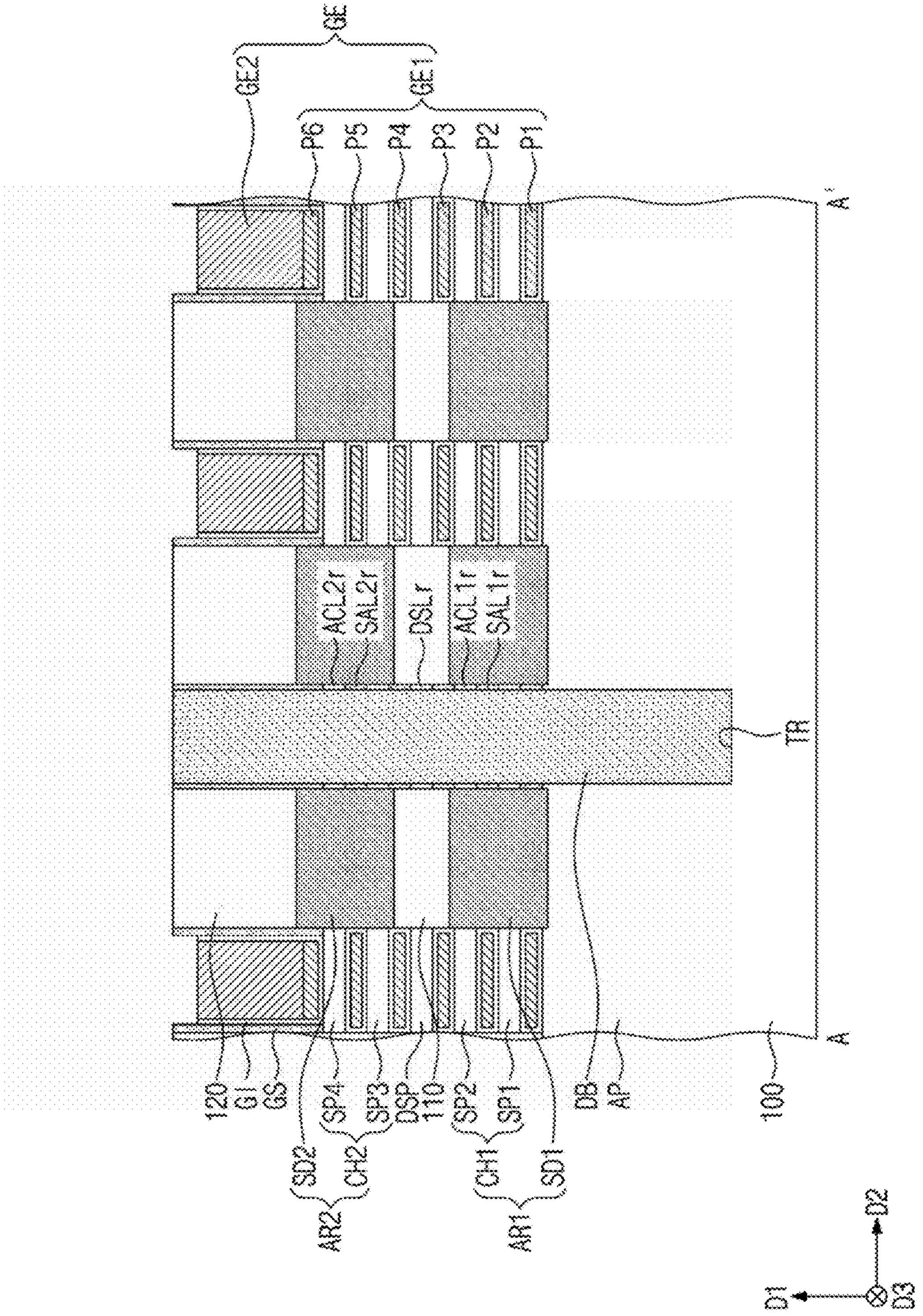
Figure 17B:
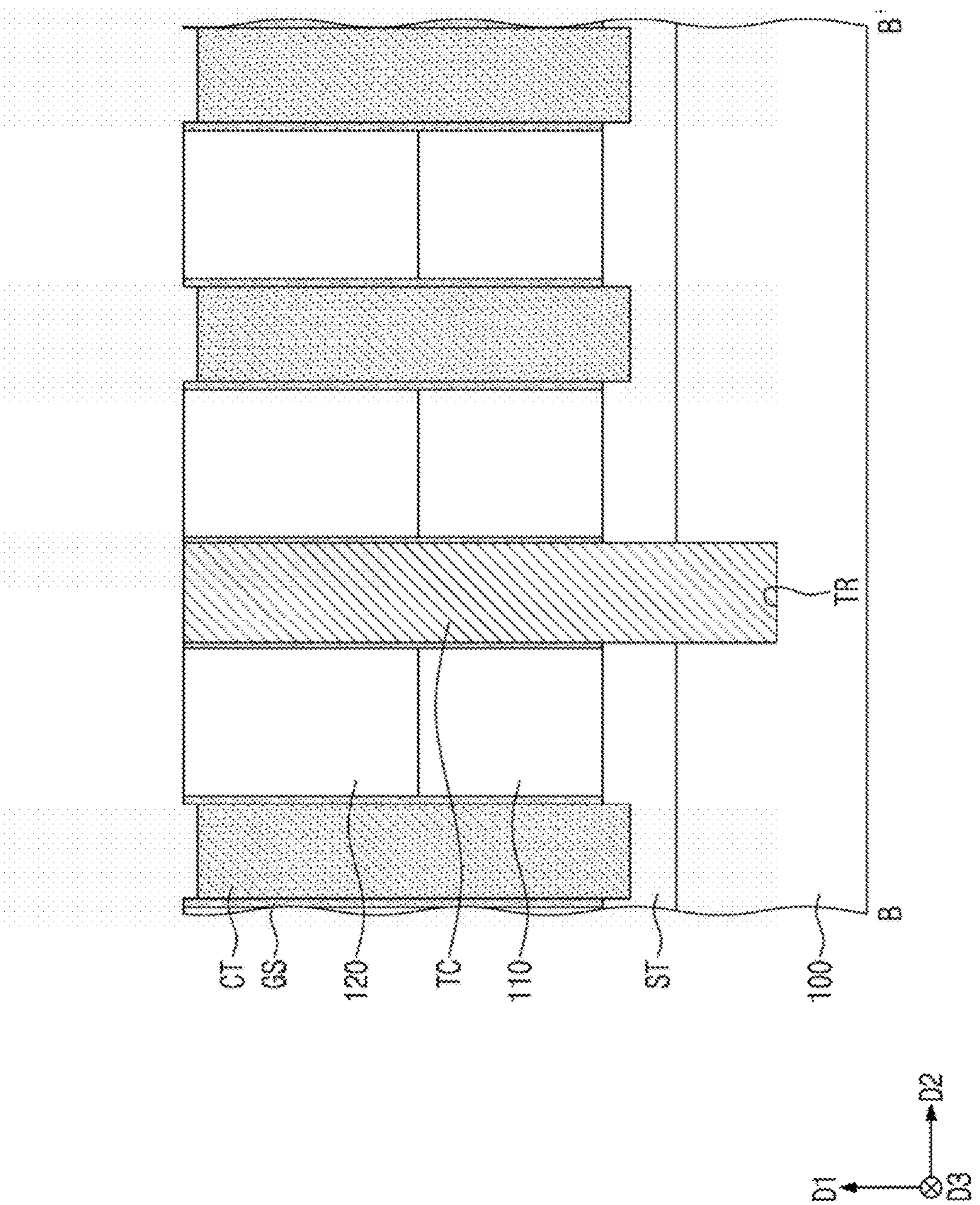
Figure 17C:
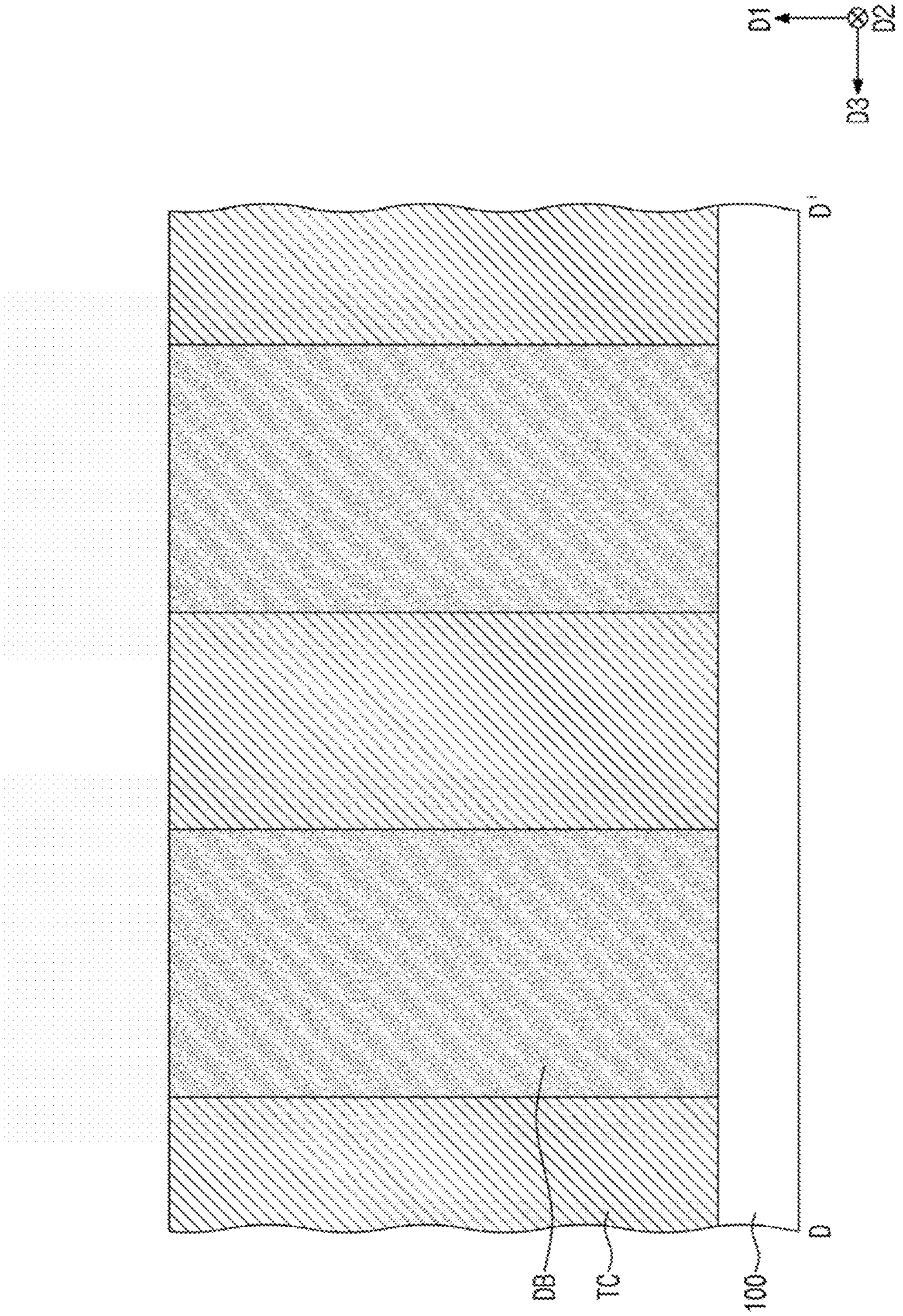
Figure 17D:
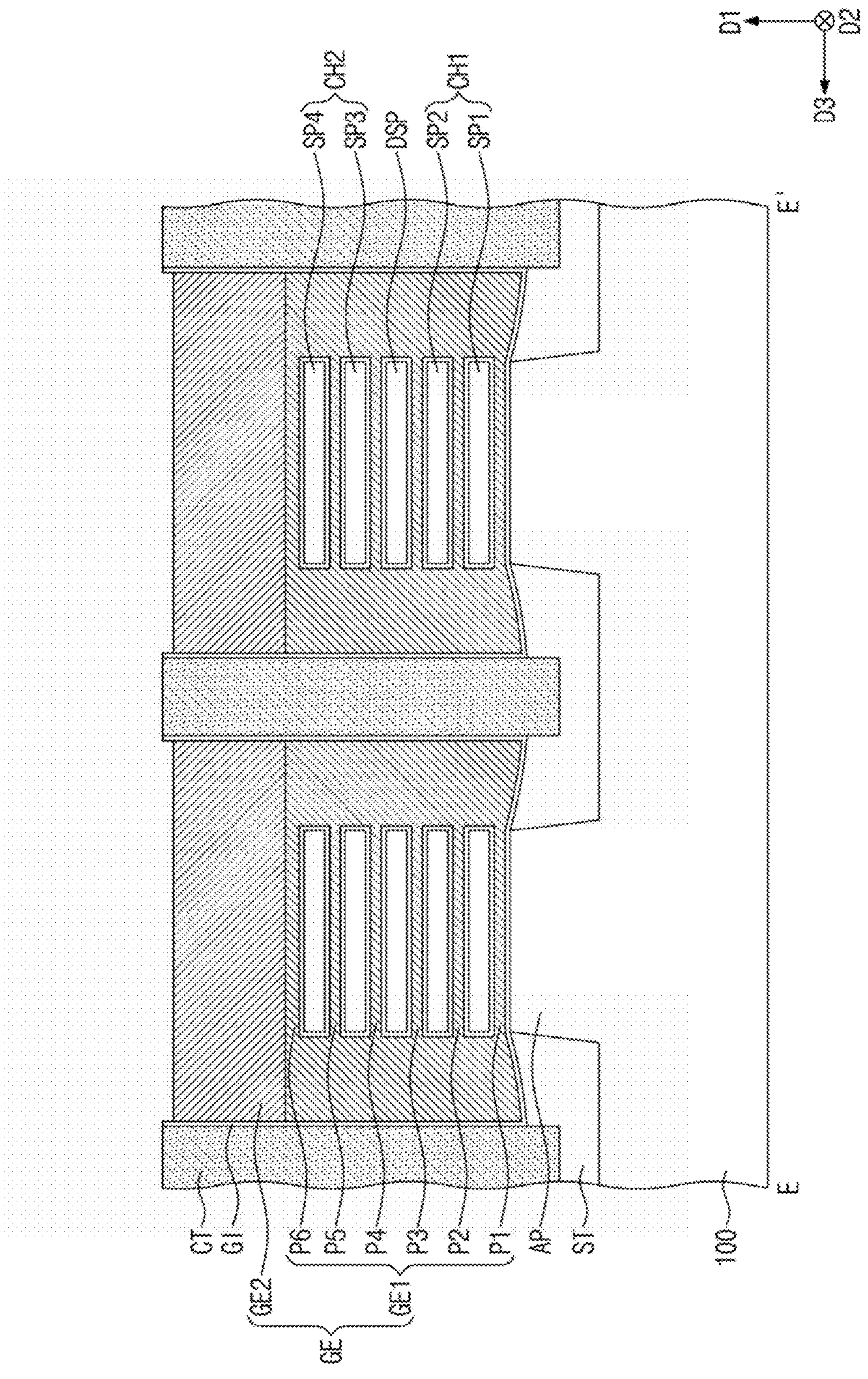

As shown in FIGS. 11A and 11B, the protrusion part TCb of the through conductive pattern TC may protrude from an upper portion of the penetration part TCa of the through conductive pattern TC. The protrusion part DBb of the separation pattern DB may be between the lower connection structure LCS and the protrusion part TCb of the through conductive pattern TC.

As shown in FIG. 11B, the upper connection structure UCS may include an upper conductive plug UP. The lower connection structure LCS may include a lower conductive plug LP. The upper conductive plug UP may be connected to the protrusion part TCb of the through conductive pattern TC. The lower conductive plug LP may be connected to the penetration part TCa of the through conductive pattern TC. The upper conductive plug UP and the lower conductive plug LP may not vertically overlap each other. The upper conductive plug UP and the lower conductive plug LP may be connected to each other via the through conductive pattern TC.

FIGS. 12A to 17D illustrate cross-sectional views of stages in a method of fabricating a three-dimensional semiconductor device depicted in FIGS. 2A to 2E. FIGS. 12A, 13A, 14A, 15A, 16A, and 17A illustrate cross-sectional views taken along line A-A' of FIG. 1. FIGS. 12B, 13B, 14B, 15B, 16B, and 17B illustrate cross-sectional views taken along line B-B' of FIG. 1. FIGS. 12C and 13C illustrate cross-sectional views taken along line C-C' of FIG. 1. FIGS. 12D, 13D, 14C, 15C, 16C, and 17C illustrate cross-sectional views taken along line B-B' of FIG. 1. FIGS. 14D, 15D, 16D, and 17D illustrate cross-sectional views taken along line E-E' of FIG. 1. With reference to FIGS. 1 and 12A to 17D, the following will describe a method of fabricating a three-dimensional semiconductor device depicted in FIGS. 2A to 2E.

Referring to FIGS. 1 and 12A to 12D, a stack pattern STP may be formed on a substrate 100. The stack pattern STP may include a first stack pattern STP1 and a second stack pattern STP2 that are sequentially stacked.

The first stack pattern STP1 may include first sacrificial layers SAL1 and first active layers ACL1 that are alternately stacked with each other. The first sacrificial layers SAL1 may include, e.g., one of silicon (Si), germanium (Ge), or silicon-germanium (SiGe), and the first active layers ACL1 may include, e.g., another of silicon (Si), germanium (Ge), or silicon-germanium (SiGe). In an implementation, the first sacrificial layers SAL1 may include silicon-germanium (SiGe), and the first active layers ACL1 may include silicon (Si). Each of the first sacrificial layers SAL1 may have a germanium concentration of about 10 at % to about 30 at %.

The second stack pattern STP2 may include second sacrificial layers SAL2 and second active layers ACL2 that are alternately stacked with each other. The second sacrificial layers SAL2 may include the same material as that of the first sacrificial layers SAL1. The second active layers ACL2 may include the same material as that of the first active layers ACL1.

A dummy semiconductor layer DSL may be formed on the first stack pattern STP1 before the second stack pattern STP2 is formed. The dummy semiconductor layer DSL may include, e.g., a dielectric material, a material the same as that of the first and second active layers ACL1 and ACL2, or a combination thereof.

A patterning process may be performed such that the stack pattern STP may be patterned into a plurality of stack patterns STP. The plurality of stack patterns STP may extend in a second direction D2, and may be spaced apart from each other in a third direction D3. In the patterning process, an upper portion of the substrate 100 may further be patterned to form a trench.

Afterwards, a device isolation pattern ST may be formed to fill the trench. In this step, an active pattern AP may be defined by the device isolation pattern ST. The formation of the device isolation pattern ST may include forming a dielectric layer that fills the trench and covers the stack pattern STP, and recessing the dielectric layer until the stack pattern STP is exposed. The device isolation pattern ST may be constituted by the dielectric layer that remains after being recessed.

Sacrificial patterns PP may be formed to cross the stack pattern STP. Each of the sacrificial patterns PP may be formed to have a linear shape that extends in the third direction D3. The sacrificial patterns PP may be arranged spaced apart from each other along a second direction D2.

The formation of the sacrificial patterns PP may include forming an upper sacrificial layer on an entire surface of the substrate 100, forming first hardmask patterns MP1 on the upper sacrificial layer, and using the first hardmask patterns MP1 as an etching mask to pattern the upper sacrificial layer. The sacrificial patterns PP may be constituted by the upper sacrificial layer that remains after being patterned. Even after the formation of the sacrificial patterns PP, the first hardmask patterns MP1 may remain on corresponding sacrificial patterns PP. The sacrificial patterns PP may include, e.g., amorphous silicon, polycrystalline silicon, or a combination thereof.

A spacer layer may be conformally formed on the entire surface of the substrate 100. The spacer layer may cover the sacrificial patterns PP and the first hardmask patterns MP1. Thereafter, the spacer layer may undergo an etching process to form gate spacers GS. The gate spacers GS may cover lateral surfaces of the sacrificial patterns PP and lateral surfaces of the first hardmask patterns MP1.

Referring to FIGS. 1 and 13A to 13D, the stack pattern STP may undergo an etching process in which the first hardmask patterns MP1 and the gate spacers GS are used as an etching mask. The etching process may form a first recess RS1 between neighboring sacrificial patterns PP. The first recess RS1 may be formed in plural. The first active layers ACL1 and the first sacrificial layers SAL1 may be exposed on an inner sidewall of the first recess RS1. The second active layers ACL2 and the second sacrificial layers SAL2 may be covered with a subsequently described liner that covers a portion of the inner sidewall of the first recess RS1. The etching process may be an anisotropic etching process, and may continue until a top surface of the active pattern AP is exposed.

In an implementation, the etching process may include a first etching process and a second etching process. The first etching process may be performed on the second stack pattern STP2. The second etching process may be performed on the first stack pattern STP1. The first etching process may be performed to expose the second stack pattern STP2 between neighboring sacrificial patterns PP. A liner may cover the exposed second stack pattern STP2, and then the second etching process may be performed. The liner may remain on the second stack pattern STP2 even after the second etching process. The second stack pattern STP2 (or the second active layers ACL2 and the second sacrificial layer SAL2) may be covered with the liner on the inner sidewall of the first recess RS1, and the first stack pattern STP1 (or the first active layers ACL1 and the first sacrificial layers SAL1) may be exposed on the inner sidewall of the first recess RS1.

After that, first source/drain patterns SD1 may be formed in corresponding first recesses RS1. In an implementation, a first selective epitaxial growth (SEG) process may be performed in which the first active layer ACL1 and the active pattern AP exposed by the first recess RS1 are used as a seed to form the first source/drain pattern SD1. For example, the first SEG process may include chemical vapor deposition (CVD) or molecular beam epitaxy (MBE).

In an implementation, during the first SEG process, impurities may be in-situ doped into the first source/drain pattern SD1. In an implementation, after the first source/drain pattern SD1 is formed, impurities may be doped into the first source/drain pattern SD1. The first source/drain pattern SD1 may be doped to have a first conductivity type. Afterwards, a first interlayer dielectric layer 110 may be formed to cover the first source/drain patterns SD1.

The liner may be removed, and the second stack pattern STP2 may be exposed on the inner sidewall of the first recess RS1. Afterwards, second source/drain patterns SD2 may be formed in corresponding first recesses RS1. In an implementation, a second SEG process may be performed in which the second active layer ACL2 exposed by the first recess RS1 is used as a seed to form the second source/drain pattern SD2. The second source/drain patterns SD2 may be doped to have a second conductivity type different from the first conductivity type.

A second interlayer dielectric layer 120 may be formed to cover the second source/drain patterns SD2 and the first hardmask pattern MP1. An upper portion of the second interlayer dielectric layer 120 may be planarized until top surfaces of the sacrificial patterns PP are exposed. An etch-back or chemical mechanical polishing (CMP) process may be employed to planarize the second interlayer dielectric layer 120. All of the first hardmask patterns MP1 and upper portions of the gate spacers GS may be removed during the planarization process. As a result, the second interlayer dielectric layer 120 may have a top surface coplanar with those of the sacrificial patterns PP and those of the gate spacers GS.

Referring to FIGS. 1 and 14A to 14D, gate cutting patterns CT may be formed to run along a first direction D1 across the sacrificial pattern PP. The gate cutting patterns CT may be formed spaced apart from each other in the second direction D2 and the third direction D3.

Second hardmask patterns MP2 may be formed on portions of the sacrificial patterns PP. The second hardmask patterns MP2 may extend in the third direction D3, and may cover corresponding portions of the sacrificial patterns PP. In an implementation, the portions of the sacrificial patterns PP may be the sacrificial patterns PP through which the gate cutting patterns CT do not penetrate. The second hardmask patterns MP2 may not be formed on other portions of the sacrificial patterns PP. The other portions of the sacrificial patterns PP may be outwardly exposed.

The exposed sacrificial patterns PP, the first sacrificial layers SAL1, and the second sacrificial layers SAL2 may be selectively removed. In this step, the sacrificial patterns PP and the stack pattern STP below the second hardmask patterns MP2 may not be removed.

The exposed sacrificial patterns PP may be removed to expose the stack pattern STP. The removal of the sacrificial patterns PP may include performing a wet etching process in which an etchant is used to selectively etch polysilicon.

The stack pattern STP may be exposed such that the exposed first and second sacrificial layers SAL1 and SAL2 may be selectively removed. Even when the first and second sacrificial layers SAL1 and SAL2 are removed, the first and second active layers ACL1 and ACL2 may remain. The first and second sacrificial layers SAL1 and SAL1 may be removed by an etching process having an etch selectivity between the first and second sacrificial layers SAL1 and SAL2 and the first and second active layers ACL1 and ACL2. In an implementation, the first and second sacrificial layers SAL1 and SAL2 may include silicon-germanium whose germanium concentration is greater than that of the first and second active layers ACL1 and ACL2, and the etching process may have a higher etch rate for the first and second sacrificial layers SAL1 and SAL2 whose germanium concentration is high. The etching process may have a high etch rate for silicon-germanium whose germanium concentration is greater than about 10 at %. The remaining first and second active layers ACL1 and ACL2 may constitute a plurality of semiconductor patterns SP1, SP2, SP2, and SP4.

A plurality of inner regions IRG1, IRG2, IRG3, IRG4, and IRG5 may be formed in areas where the first and second sacrificial layers SAL1 and SAL2 are removed. An outer region ORG may be defined on the remaining stack pattern STP (or on the second channel pattern CH2).

The sacrificial patterns PP and the first and second sacrificial layers SAL1 and SAL2 below the second hardmask pattern MP2 may not be removed during the removal of the first and second sacrificial layers SAL1 and SAL2. The sacrificial patterns PP below the second hardmask pattern MP2 may not be exposed, and thus unlike the exposed sacrificial patterns PP, the unexposed sacrificial patterns PP may not be exposed to an etchant. As a result, the first and second sacrificial layers SAL1 and SAL2 below the second hardmask pattern MP2 may be neither exposed nor removed.

Referring to FIGS. 1 and 15A to 15D, a gate dielectric pattern GI may be formed to conformally cover the semiconductor patterns SP1, SP2, SP3, and SP4. The gate dielectric pattern GI may conformally cover inner walls of the inner regions IRG1, IRG2, IRG3, IRG4, and IRG and an inner wall of the outer region ORG.

A first gate electrode GE1 may be formed in lower portions of the inner regions IRG1, IRG2, IRG3, IRG4, and IRG and a lower portion of the outer region ORG. The first gate electrode GE1 may include first, second, third, fourth, and fifth parts P1, P2, P3, P4, and P5 respectively formed in the inner regions IRG1, IRG2, IRG3, IRG4, and IRG and a sixth part P6 formed in a lower portion of the outer region ORG. The first gate electrode GE1 may cover the semiconductor patterns SP1, SP2, SP3, and SP4.

The second hardmask pattern MP2 may be removed to expose the stack pattern STP that remains below the second hardmask pattern MP2. A removal process may be performed on the exposed stack pattern STP to remove the exposed stack pattern STP, the active pattern AP below the exposed stack pattern STP, and a portion of the substrate 100. The removal process may form a trench region TR. The trench region TR may have a linear or bar shape that extends in the third direction D3. A bottom surface of the trench region TR may be located at a lower level than that of a bottom surface of the first gate electrode GE1.

After the removal process, a gate spacer GS may remain and be exposed in the trench region TR. In an implementation, first and second residual active layers ACL1*r* and ACL2*r*, first and second residual sacrificial layers SAL1*r* and SAL2*r*, and a residual dummy semiconductor layer DSLr may remain below the gate spacer GS, and may be exposed in the trench region TR.

Referring to FIGS. 1 and 16A to 16D, through conductive lines TCL and second gate electrodes GE2 may be formed. The through conductive lines TCL may be formed in corresponding trench regions TR, and may extend in the third direction D3 along the trench regions TR. The second gate electrodes GE2 may be formed in corresponding outer regions ORG.

The formation of the through conductive lines TCL and the second gate electrodes GE2 may include forming on the entire surface of the substrate 100 a conductive layer that fills the trench regions TR and the outer regions ORG, and removing an upper portion of the conductive layer to form the through conductive lines TCL and the second gate electrodes GE2 that are separated from each other. The removal of the upper portion of the conductive layer may expose the second interlayer dielectric layer 120 and the gate cutting pattern CT.

The conductive layer may include metal whose resistance is less than that of the first gate electrode GE1. In an implementation, the conductive layer may include, e.g., tungsten (W), aluminum (Al), titanium (Ti), tantalum (Ta), or a combination thereof.

Referring to FIGS. 1 and 17A to 17D, a separation pattern DB may be formed to penetrate through the through conductive line TCL. The formation of the separation pattern DB may include forming a separation region that penetrates in the first direction D1 through each of the through conductive lines TCL, and filling the separation region with the separation pattern DB. As the separation pattern DB is formed, a remaining through conductive line TCL may constitute one or more through conductive patterns TC. The separation pattern DB may separate the through conductive patterns TC from each other in the third direction D3.

A top surface of the through conductive pattern TC may be exposed on the second interlayer dielectric layer 120. In an implementation, the through conductive pattern TC and the separation pattern DB may have top surfaces that are exposed on the second interlayer dielectric layer 120 and are coplanar with the top surface of the second interlayer dielectric layer 120. In an implementation, an upper portion of the second gate electrode GE2 may be recessed in the procedure of forming the separation pattern DB.

Referring back to FIGS. 1 and 2A to 2E, a gate capping pattern GC may be formed to fill the recessed upper portion of the second gate electrode GE2. A planarization process may be performed to allow the gate capping pattern GC to have a top surface coplanar with that of the second interlayer dielectric layer 120.

An upper connection structure UCS may be formed on the top surface of the through conductive pattern TC. The upper connection structure UCS and the through conductive pattern TC may be connected to each other on the top surface of the through conductive pattern TC. In an implementation, the upper connection structure UCS may be manufactured separately from a device structure DS, and the separately manufactured upper connection structure UCS may be mounted on the top surface of the through conductive pattern TC. In an implementation, the upper connection structure UCS may be formed by processes that are sequentially performed on the device structure DS.

Before the formation of the upper connection structure UCS, a second conductive contact SC2 may be formed. In an implementation, the second conductive contact SC2 may penetrate through the second interlayer dielectric layer 120. The second conductive contact SC2 may connect the second source/drain pattern SD2 to the upper connection structure UCS.

A lower connection structure LCS may be formed on a bottom surface of the substrate 100. The lower connection structure LCS and the through conductive pattern TC may be connected to each other on the bottom surface of the substrate 100. Before the lower connection structure LCS is formed on the bottom surface of the substrate 100, a lower portion of the substrate 100 may be removed. Therefore, the substrate 100 may have a reduced thickness in the first direction D1. The lower portion of the substrate 100 may be removed to outwardly expose a bottom surface of the through conductive pattern TC. In this step, the lower connection structure LCS may be in direct contact with and connected to the through conductive pattern TC. Alternatively, as the lower portion of the substrate 100 is removed, the bottom surface of the through conductive pattern TC may be adjacent to the bottom surface of the substrate 100, but may not be outwardly exposed. The lower connection structure LCS may be connected through a separate plug to the through conductive pattern TC.

In an implementation, the lower connection structure LCS may be manufactured separately from the device structure DS, and the separately manufactured lower connection structure LCS may be mounted on the bottom surface of the through conductive pattern TC. In an implementation, the lower connection structure LCS may be formed by processes that are sequentially performed on the bottom surface of the substrate 100.

Before the formation of the lower connection structure LCS, a first conductive contact SC1 may be formed. In an implementation, the first conductive contact SC1 may penetrate through the first interlayer dielectric layer 110. The first conductive contact SC1 may connect the first source/drain pattern SD1 to the lower connection structure LCS.

In an implementation, the through conductive pattern TC and the second gate electrode GE2 may be formed from the same conductive layer. Therefore, it may be possible to simplify a process for forming the through conductive pattern TC. In an implementation, it may be easy to produce a three-dimensional semiconductor device.

FIGS. 18A to 19C illustrate cross-sectional views of stages in a method of fabricating a three-dimensional semiconductor device depicted in FIGS. 8A and 8B.

Figure 18A:
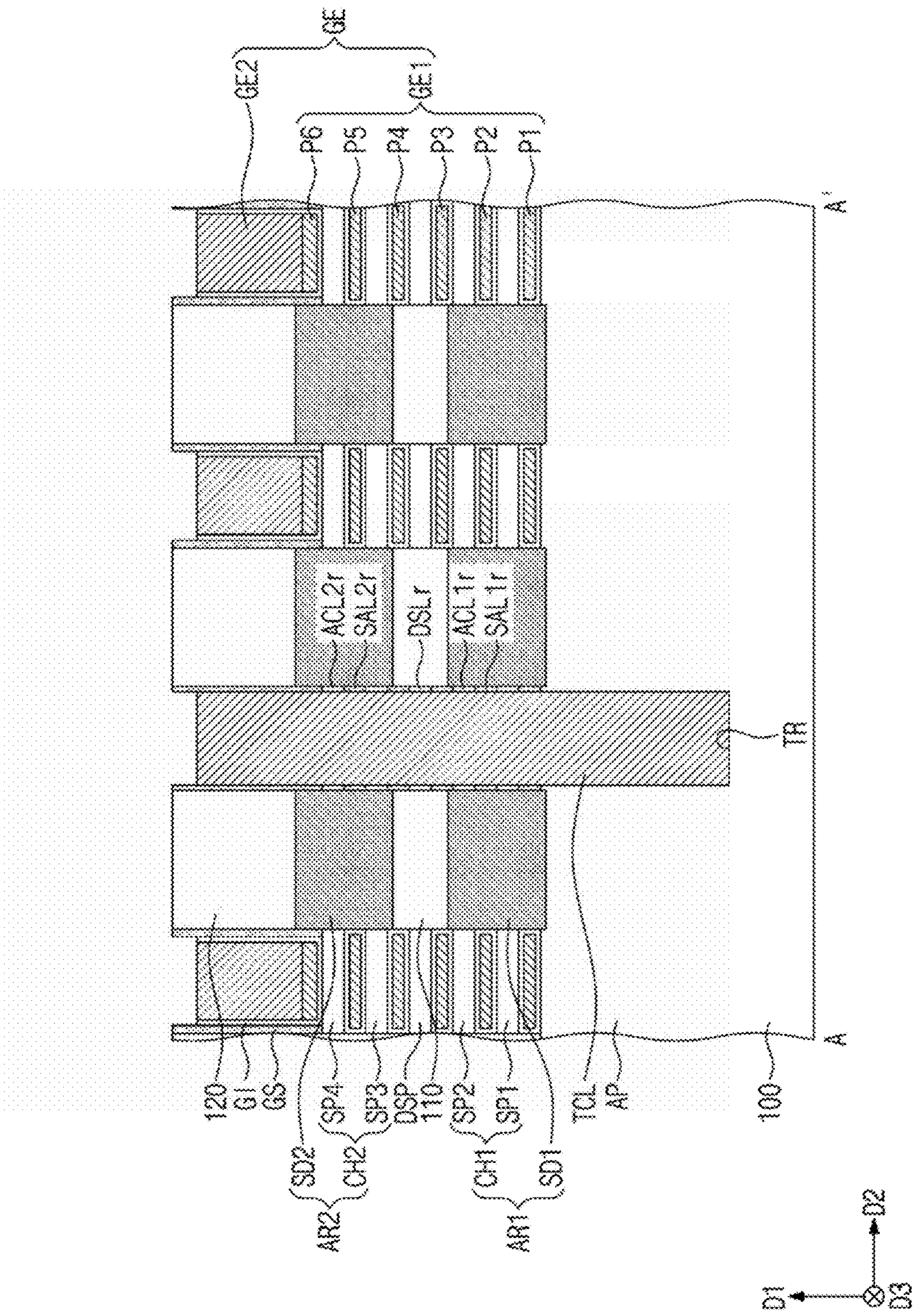
FIGS. 18A to 19C illustrate cross-sectional views of stages in a method of fabricating a three-dimensional semiconductor device depicted in FIGS. 8A and 8B.
Figure 18B:
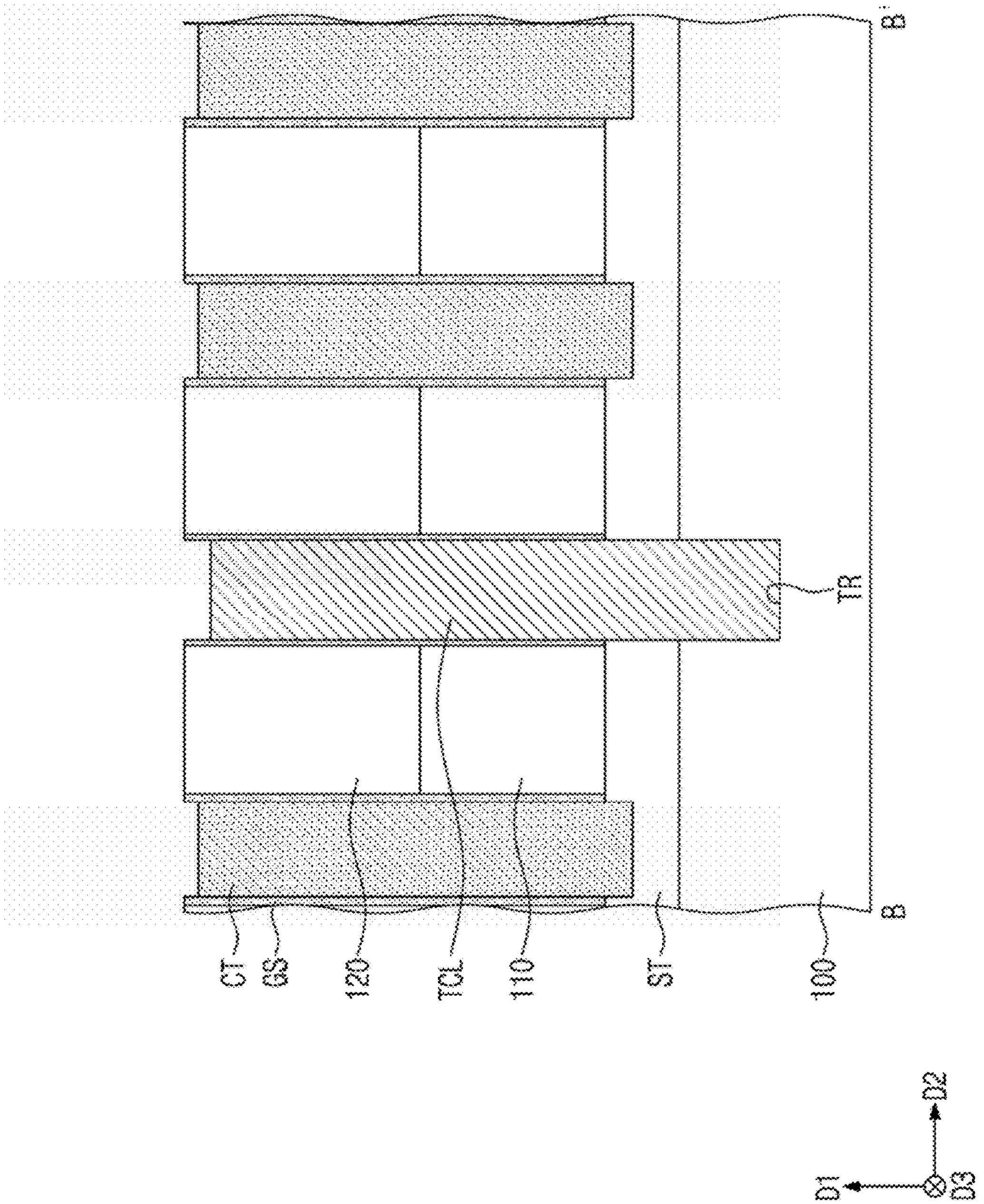
Figure 18C:
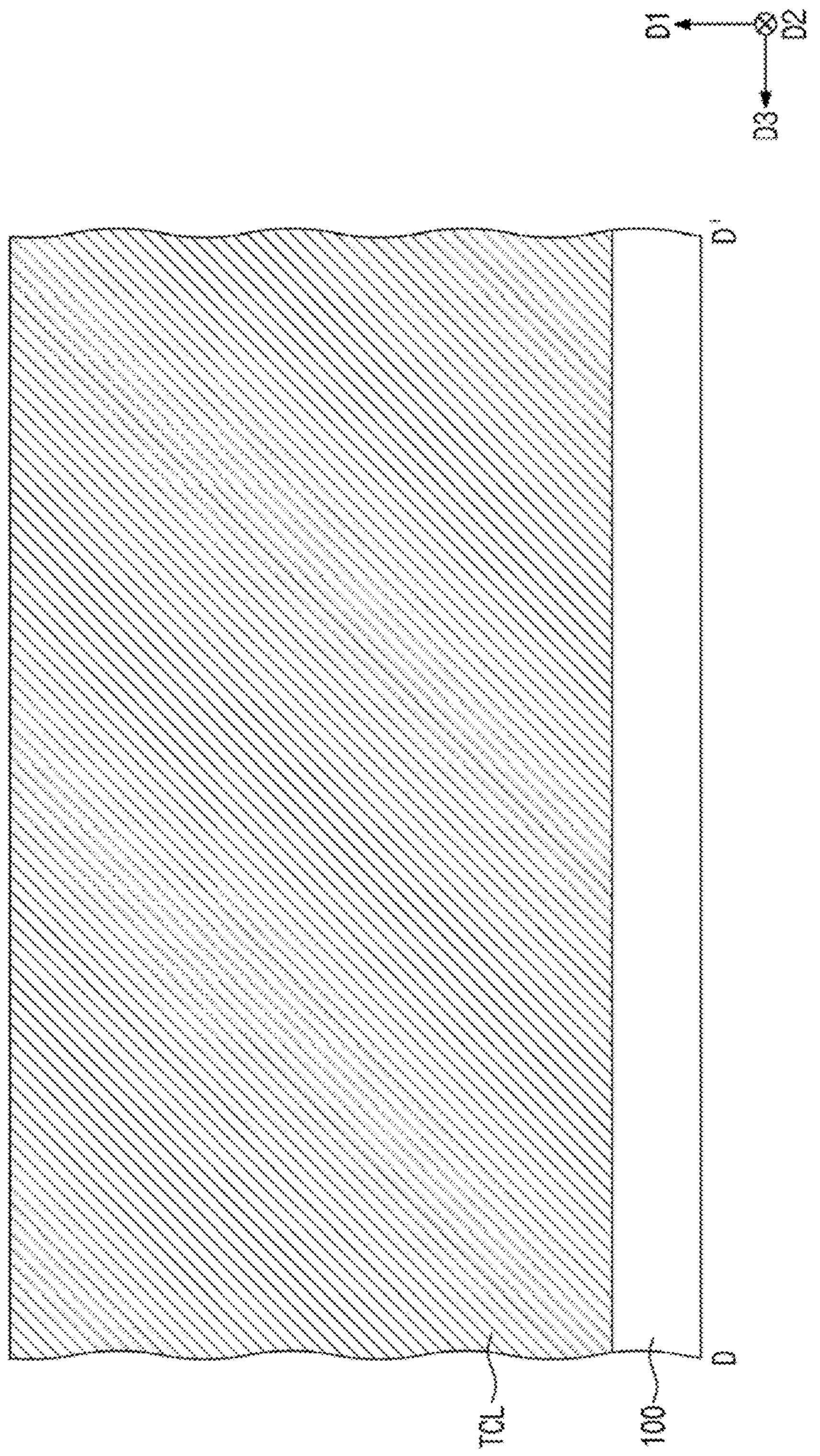

Referring to FIGS. 18A to 18C, in forming the through conductive lines TCL and the second gate electrodes GE2, upper portions of the through conductive lines TCL may be recessed, and upper portions of the second gate electrodes GE2 may be recessed. The through conductive lines TCL and the second gate electrodes GE2 may have top surfaces located at a level lower than that of a top surface of the second interlayer dielectric layer 120.

Figure 19A:
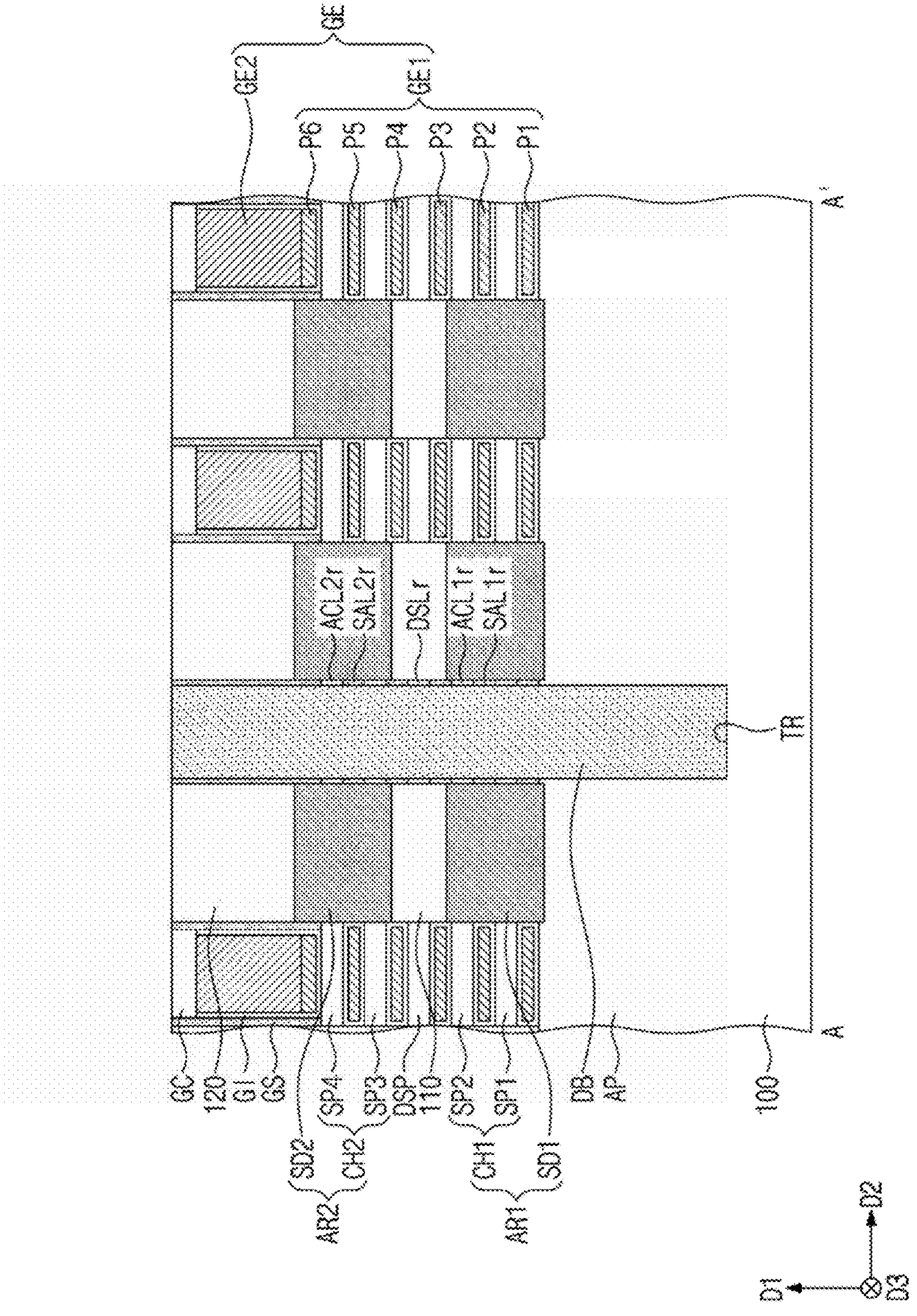
Figure 19B:
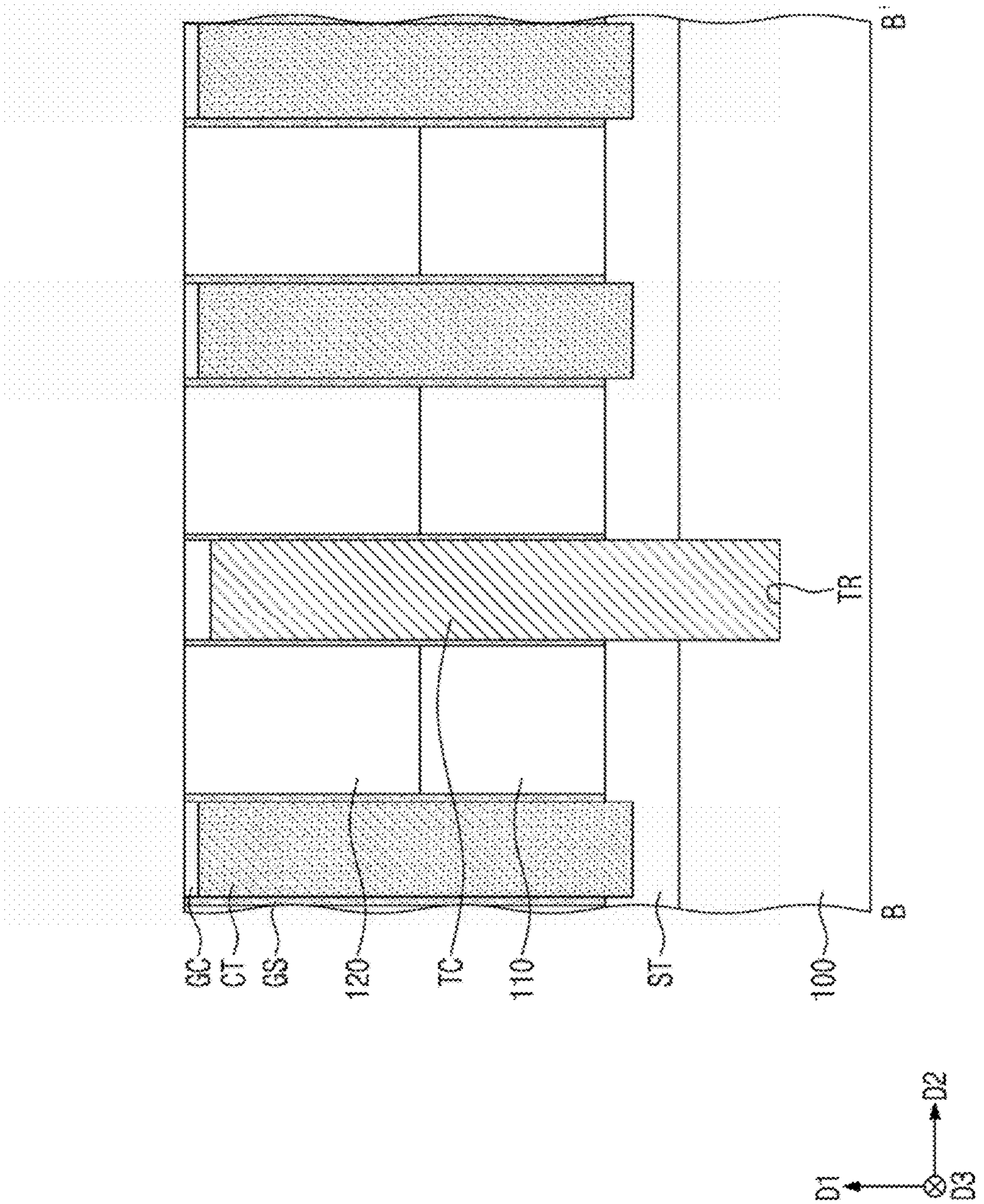
Figure 19C:
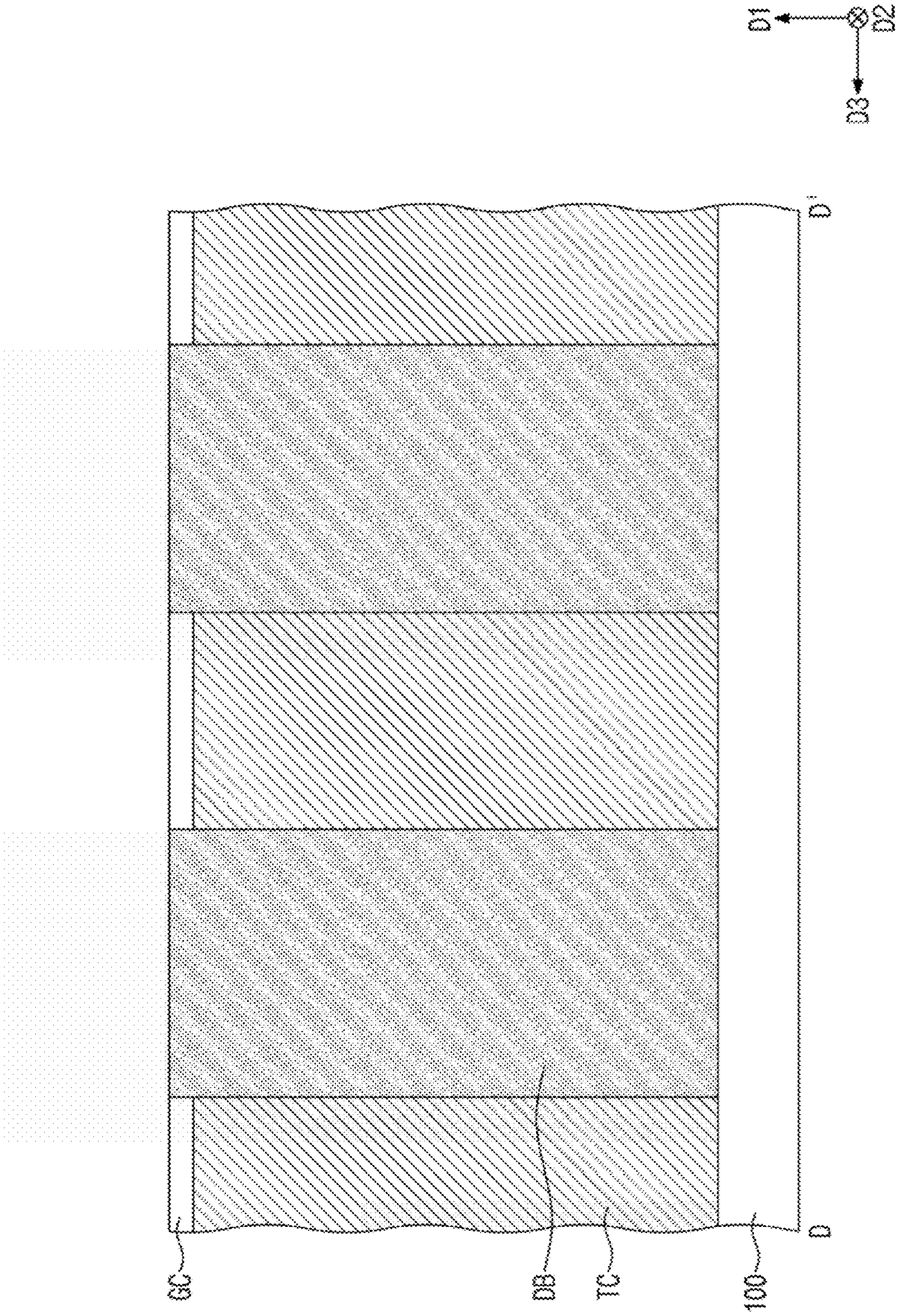

Referring to FIGS. 19A to 19C, gate capping patterns GC may be correspondingly formed on the through conductive lines TCL and the second gate electrodes GE2. The gate capping patterns GC may cover the top surfaces of the through conductive lines TCL and the second gate electrodes GE2. The gate capping patterns GC may have top surfaces that are located at substantially the same as that of the top surface of the second interlayer dielectric layer 120 and are coplanar with the top surface of the second interlayer dielectric layer 120.

Afterwards, a separation pattern DB may be formed to penetrate through the through conductive line TCL and its overlying gate capping pattern GC. The formation of the separation pattern DB may include forming a separation region that penetrates through the through conductive line TCL and its overlying gate capping pattern GC, and filling the separation region with the separation pattern DB. In an implementation, the gate capping pattern GC may not be on the separation pattern DB. A top surface of the separation pattern DB may be located at substantially the same level as that of the top surface of the gate capping pattern GC and coplanar with the top surface of the gate capping pattern GC.

Afterwards, through the fabrication process discussed with reference to FIGS. 2A to 2E, a three-dimensional semiconductor device may be fabricated as shown in FIGS. 8A and 8B.

Figure 20A:
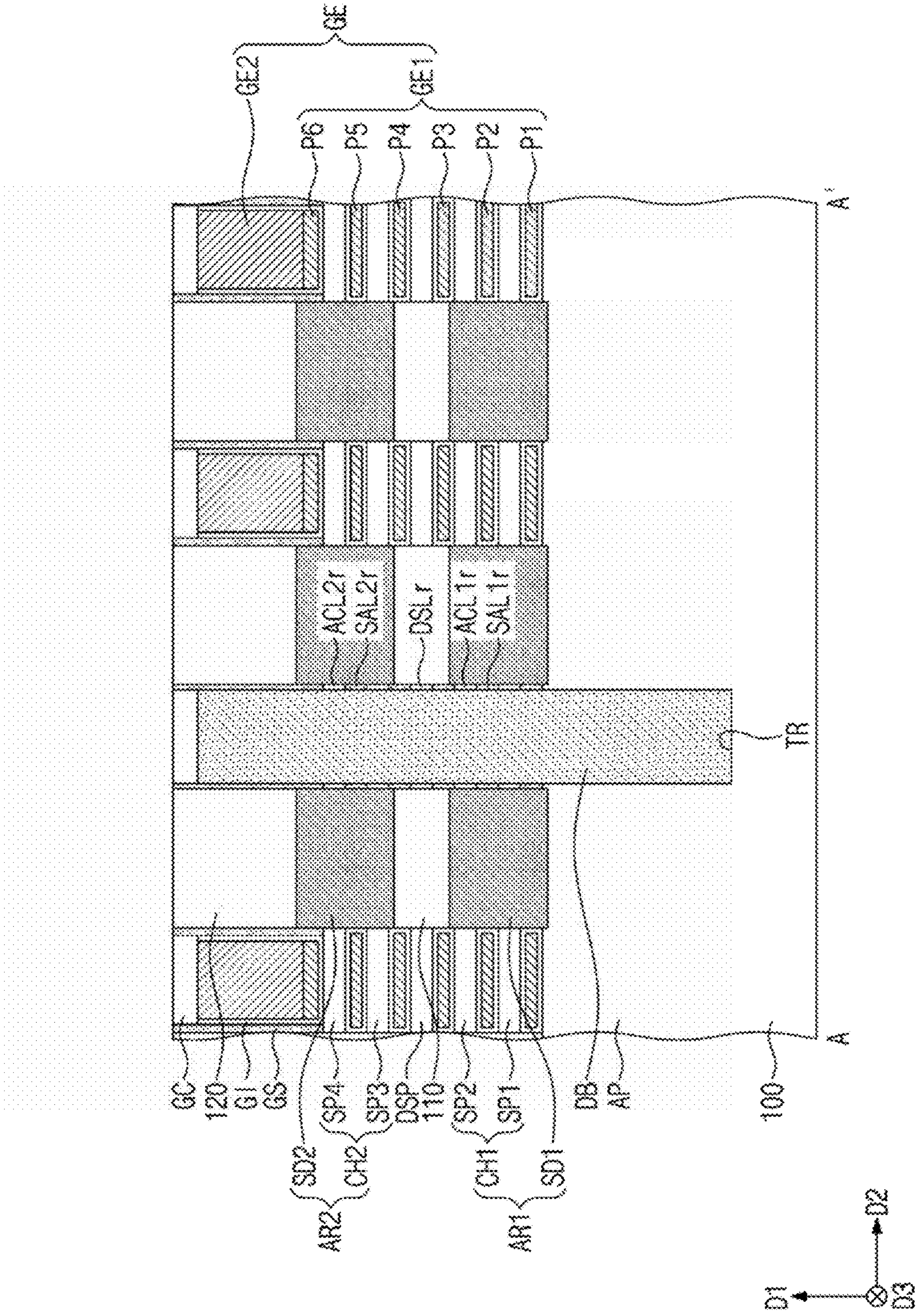
FIGS. 20A to 20C illustrate cross-sectional views of stages in a method of fabricating a three-dimensional semiconductor device depicted in FIGS. 9A and 9B.
Figure 20B:
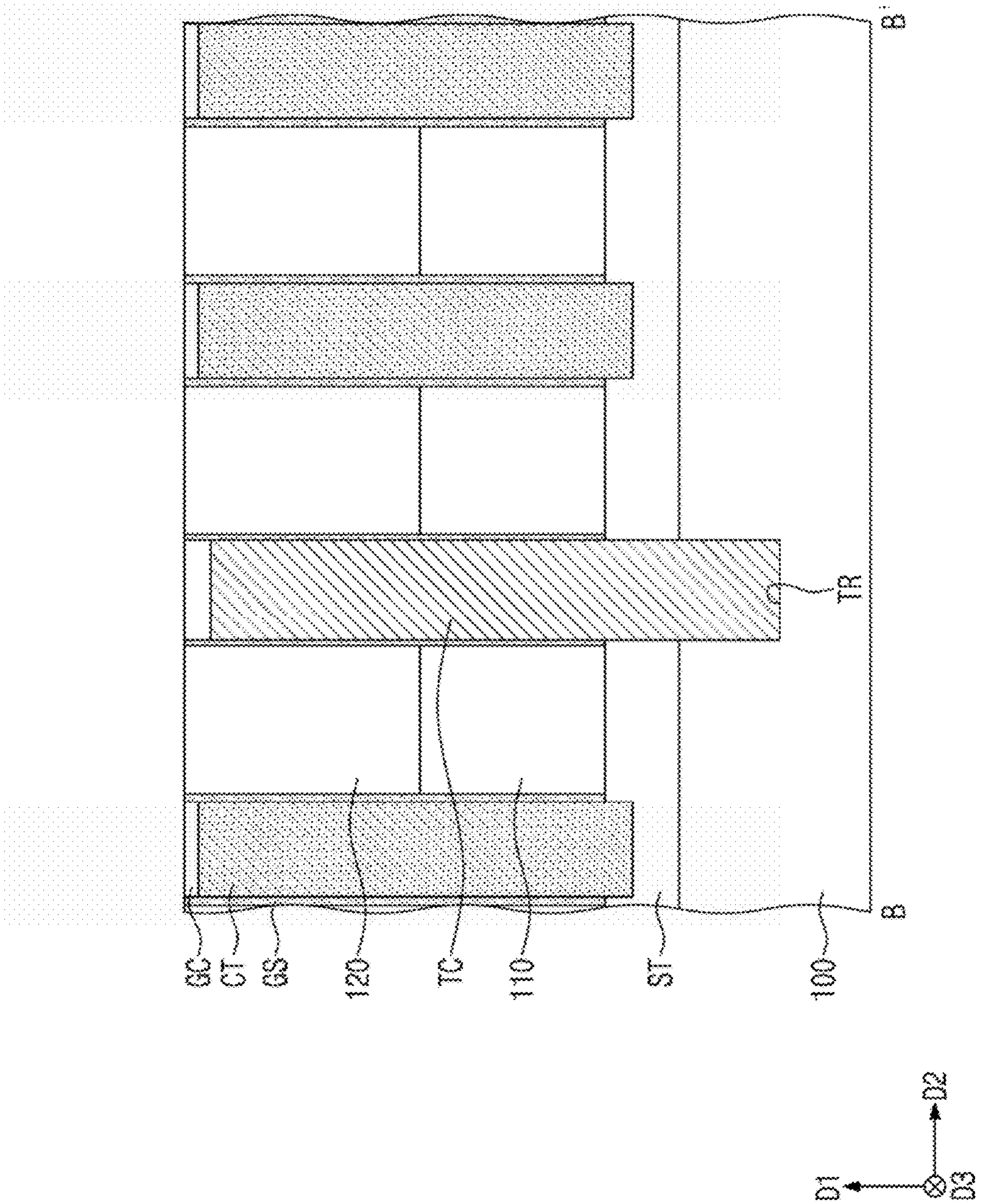
Figure 20C:
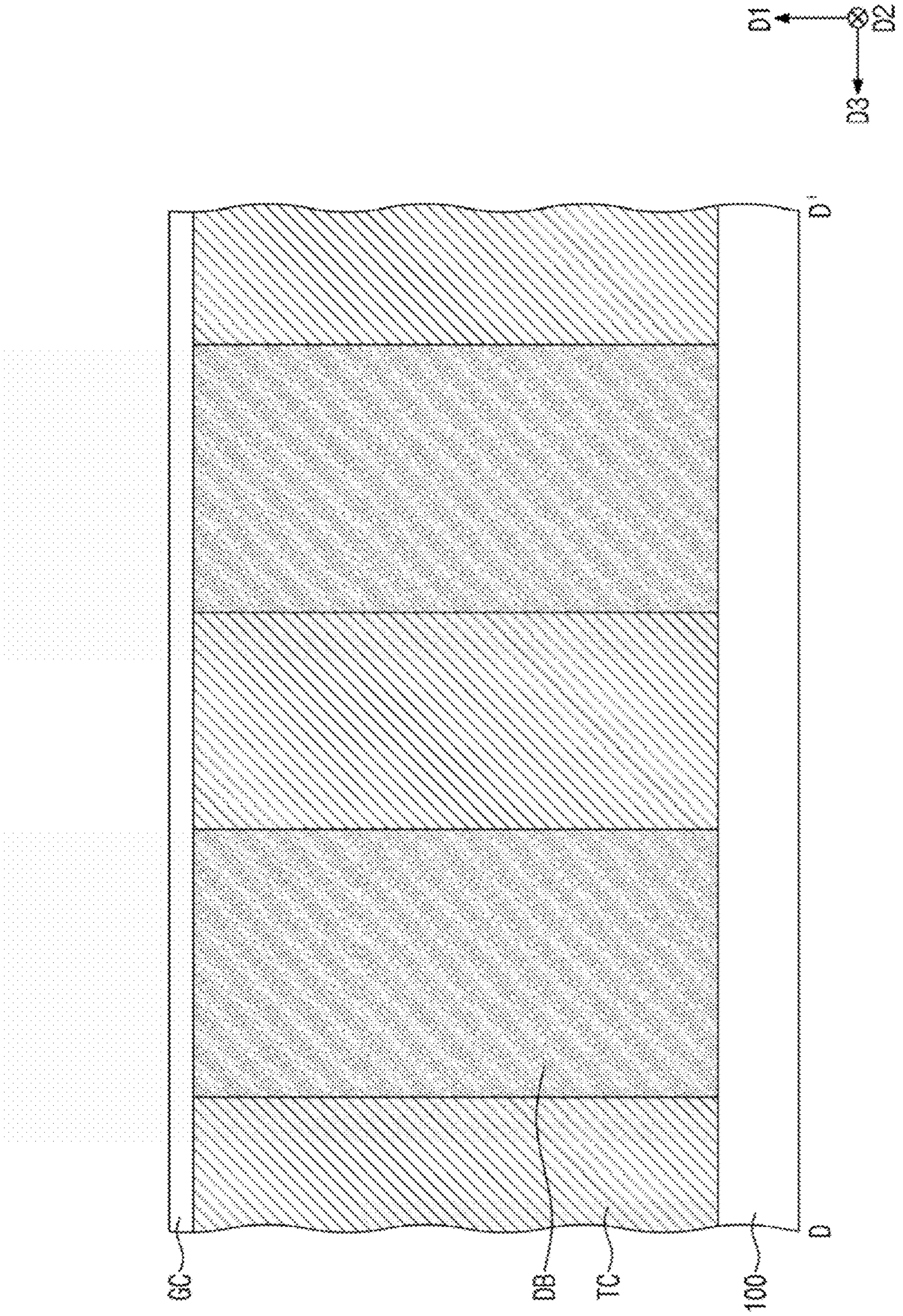

FIGS. 20A to 20C illustrate cross-sectional views of stages in a method of fabricating a three-dimensional semiconductor device depicted in FIGS. 9A and 9B.

Referring to FIGS. 20A to 20C, as discussed with reference to FIGS. 18A to 18C, the through conductive lines TCL may be formed to have recessed upper portions thereof, and the second gate electrodes GE2 may be formed to have recessed upper portions thereof. After that, a separation pattern DB may be formed to penetrate the through conductive line TCL. In addition, a through conductive pattern TC may be formed. The separation pattern DB may be formed to have a top surface located at a lower level than that of a top surface of the second interlayer dielectric layer 120.

Gate capping patterns GC may be formed on the through conductive pattern TC, the separation pattern DB, and the second gate electrode GE2. The gate capping patterns GC may cover a top surface of the through conductive pattern TC, a top surface of the separation pattern DB, and a top surface of the second gate electrode GE2. The gate capping pattern GC on the through conductive pattern TC may extend along the third direction D3 onto the separation pattern DB. The gate capping pattern GC may have a top surface located at a higher level than that of the top surface of the separation pattern DB.

Afterwards, through the fabrication process discussed with reference to FIGS. 2A to 2E, a three-dimensional semiconductor device may be fabricated as shown in FIGS. 9A and 9B.

Figure 21:
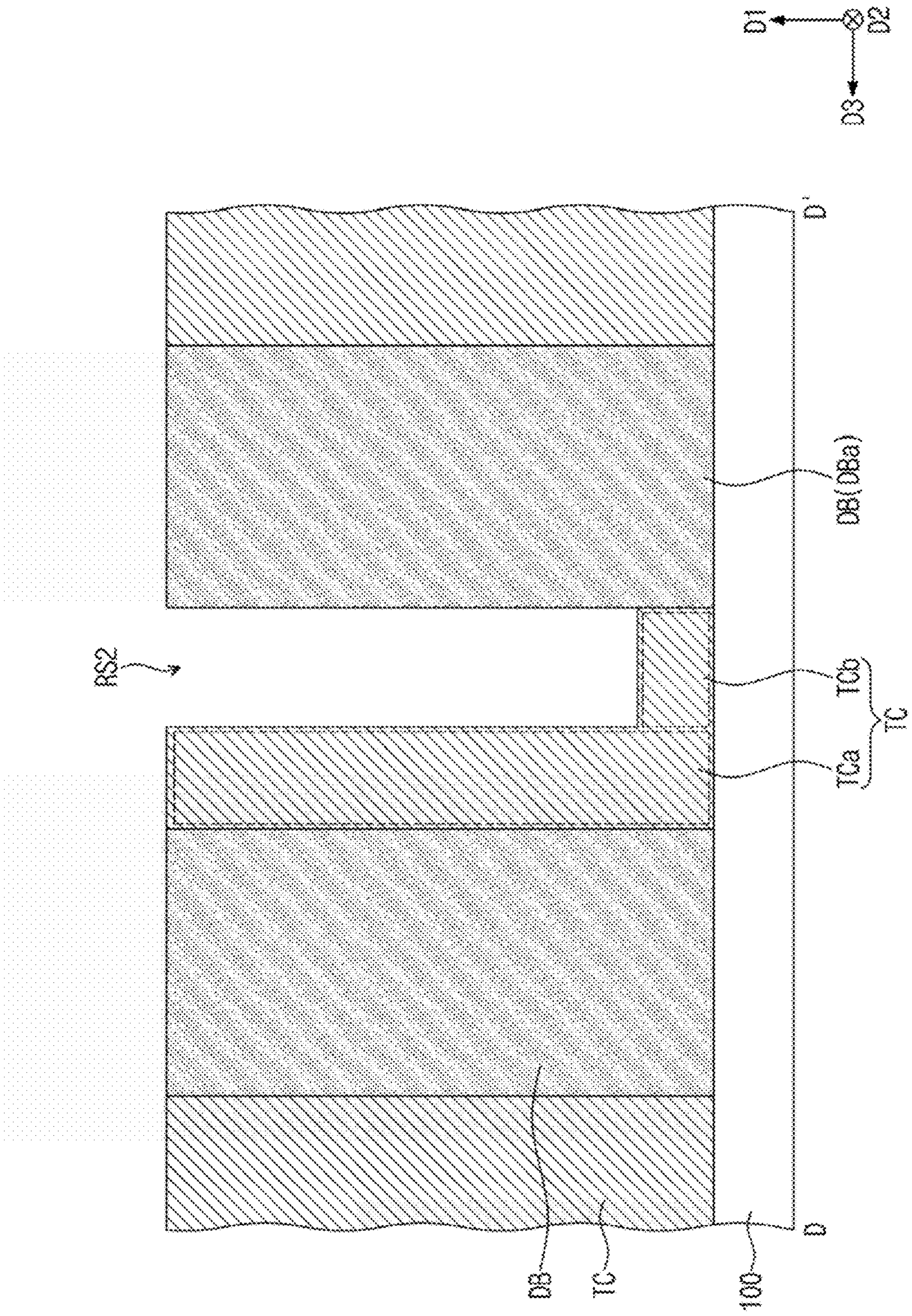
FIGS. 21 and 22 illustrate cross-sectional views of stages in a method of fabricating a three-dimensional semiconductor device depicted in FIGS. 10 and 11.
Figure 22:
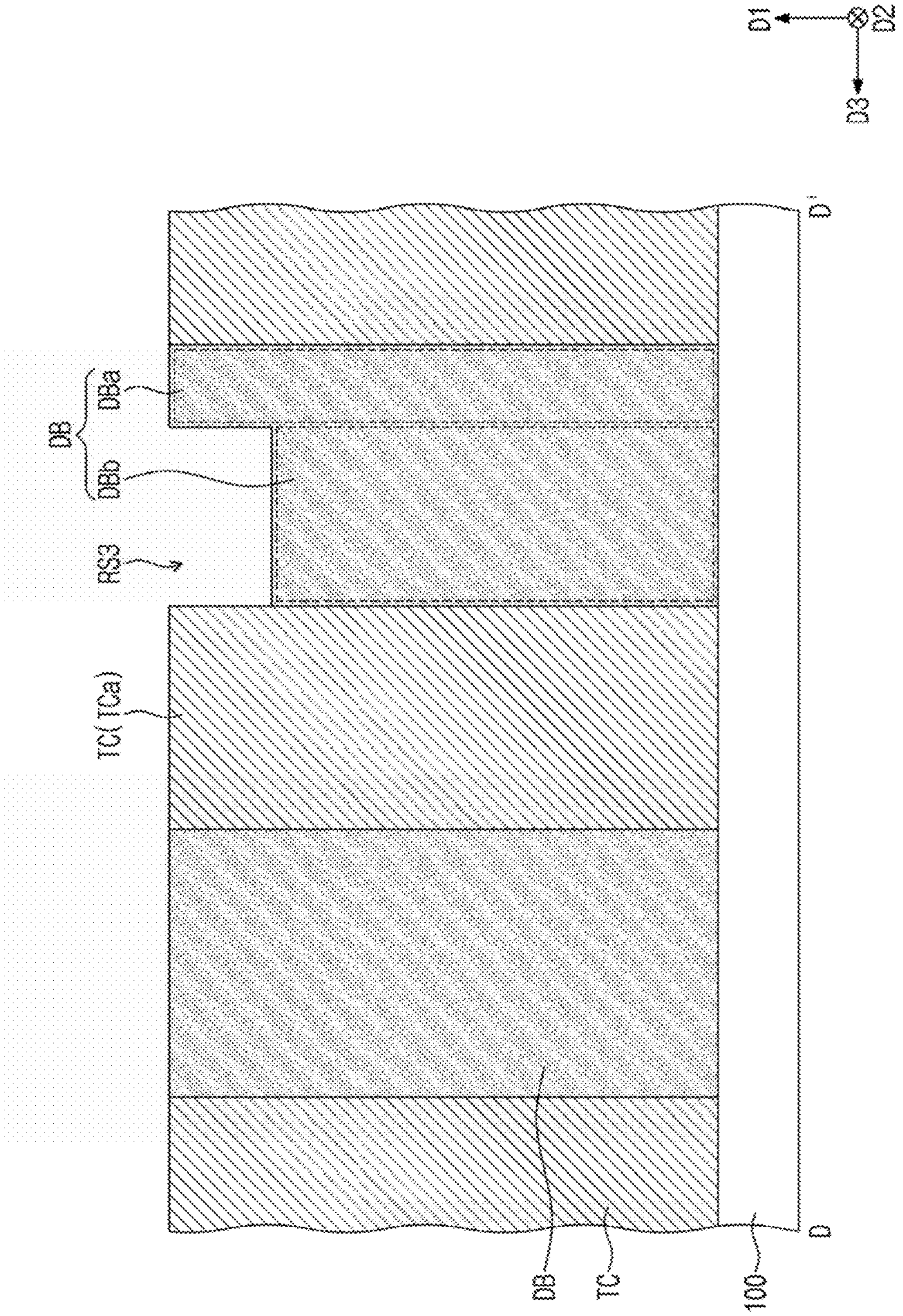

FIGS. 21 and 22 illustrate cross-sectional views showing a method of fabricating a three-dimensional semiconductor device depicted in FIGS. 10 and 11.

Referring to FIG. 21, after the formation of the separation pattern DB, a portion of the through conductive pattern TC may be removed to form a second recess RS2. The partial removal of the through conductive pattern TC may include performing an anisotropic etching process on the portion of the through conductive pattern TC. The removal process may continue until the substrate 100 is exposed. Therefore, a lower portion of the through conductive pattern TC may have a shape that protrudes toward the separation pattern DB. In an implementation, the through conductive pattern TC may include a penetration part TCa that extends along the first direction D1 and a protrusion part TCb that protrudes toward the separation pattern DB from a lower portion of the penetration part TCa.

Referring back to FIG. 10A, an additional deposition process may be performed such that the second recess RS2 may be filled with the separation pattern DB. The separation pattern DB formed before the additional deposition process may be defined as a penetration part DBa of the separation pattern DB. The separation pattern DB formed in the second recess RS2 through the additional deposition process may be defined as a protrusion part DBb of the separation pattern DB.

Referring to FIG. 22, after the formation of the separation pattern DB, a portion of the separation pattern DB may be removed to form a third recess RS3. The partial removal of the separation pattern DB may include performing an anisotropic etching process on the portion of the separation pattern DB. The removal process may continue until the substrate 100 is exposed. Therefore, a lower portion of the separation pattern DB may have a shape that protrudes toward the through conductive pattern TC. As a result, the separation pattern DB may include a penetration part DBa that extends along the first direction D1 and a protrusion part DBb that protrudes toward the through conductive pattern TC from a lower portion of the penetration part DBa.

Referring back to FIG. 11A, an additional deposition process may be performed such that the third recess RS3 may be filled with the through conductive pattern TC. The through conductive pattern TC formed before the additional deposition process may be defined as a penetration part TCa of the through conductive pattern TC. The through conductive pattern TC formed in the third recess RS3 through the additional deposition process may be defined as a protrusion part TCb of the through conductive pattern TC. The protrusion part TCb of the through conductive pattern TC may protrude toward the separation pattern DB from an upper portion of the through conductive pattern TC.

By way of summation and review, scaling down of MOSFETs could deteriorate operating characteristics of the semiconductor device. Methods of fabricating semiconductor devices having superior performances while overcoming limitations caused by high integration of the semiconductor devices may be considered.

According to an embodiment, a through conductive pattern may be connected to a stacked transistor in which source/drain patterns are stacked. The through conductive pattern may connect an upper source/drain pattern to a lower connection structure, or may connect a lower source/drain pattern to an upper connection structure. Therefore, it may be possible to minimize an area required to connect the source/drain patterns with the upper and lower connection structures and as a result to increase integration of a three-dimensional semiconductor device.

In addition, the through conductive pattern and a gate electrode may be formed from the same conductive layer. Therefore, it may be possible to simplify a process for forming the through conductive pattern and as a result to easily produce a three-dimensional semiconductor device.

One or more embodiments may provide a three-dimensional semiconductor device including a field effect transistor.

One or more embodiments may provide a three-dimensional semiconductor device having increased integration.

One or more embodiments may provide a method of fabricating a three-dimensional semiconductor device, which method can achieve easy production.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor device, comprising:

a lower connection structure including a conductive line;

a device structure; and an upper connection structure, the lower connection structure, the device structure, and the upper connection structure being sequentially disposed along a first direction, wherein:

the device structure includes:

a substrate on the lower connection structure;

a first source/drain pattern and a second source/drain pattern that are sequentially disposed along the first direction on the substrate;

a separation pattern adjacent in a second direction to the first source/drain pattern and the second source/drain pattern, the second direction being parallel to a bottom surface of the substrate; and a through conductive pattern adjacent in a third direction to the separation pattern, the third direction being parallel to the bottom surface of the substrate and intersecting the second direction, the through conductive pattern connects the conductive line of the lower connection structure and the upper connection structure to each other, and the through conductive pattern is connected either through the conductive line of the lower connection structure to the first source/drain pattern or through the upper connection structure to the second source/drain pattern.

2. The device as claimed in claim 1, wherein the first source/drain pattern is connected to the upper connection structure through the conductive line of the lower connection structure and the through conductive pattern.

3. The device as claimed in claim 1, wherein the second source/drain pattern is connected to the conductive line of the lower connection structure through the upper connection structure and the through conductive pattern.

4. The device as claimed in claim 1, wherein the through conductive pattern includes tungsten, aluminum, titanium, tantalum, or a combination thereof.

5. The device as claimed in claim 1, wherein the device structure further includes:

a channel pattern connected in the second direction to the first source/drain pattern and the second source/drain pattern; and a gate electrode crossing the channel pattern in the third direction, and wherein a bottom surface of the gate electrode is at a level higher than a level of a bottom surface of the through conductive pattern.

6. The device as claimed in claim 5, wherein the channel pattern includes a plurality of semiconductor patterns that are stacked along the first direction.

7. The device as claimed in claim 5, wherein the through conductive pattern includes a material the same as at least a portion of a material of the gate electrode.

8. The device as claimed in claim 1, wherein a top surface of the through conductive pattern is at a level the same as or different from a top surface of the separation pattern.

9. The device as claimed in claim 1, wherein the through conductive pattern includes:

a penetration part that extends along the first direction; and a protrusion part that protrudes toward the separation pattern from an upper portion or a lower portion of the penetration part.

10. The device as claimed in claim 9, wherein the separation pattern includes:

a penetration part that extends along the first direction; and a protrusion part that vertically overlaps the protrusion part of the through conductive pattern.

11. A three-dimensional semiconductor device, comprising:

a lower connection structure including a conductive line;

a device structure; and an upper connection structure, the lower connection structure, the device structure, and the upper connection structure being sequentially disposed along a first direction, wherein:

the device structure includes:

a substrate on the lower connection structure;

a source/drain pattern on the substrate;

a channel pattern connected in a second direction to the source/drain pattern, the second direction being parallel to a bottom surface of the substrate;

a gate electrode crossing the channel pattern in a third direction, the third direction being parallel to the bottom surface of the substrate and intersecting the second direction;

a separation pattern spaced apart in the second direction from the source/drain pattern; and a through conductive pattern adjacent in the third direction to the separation pattern, the through conductive pattern connects the conductive line of the lower connection structure and the upper connection structure to each other, and the through conductive pattern includes a material the same as at least a portion of a material of the gate electrode.

12. The device as claimed in claim 11, wherein:

the gate electrode includes:

a first gate electrode crossing the channel pattern; and a second gate electrode on the first gate electrode, and the through conductive pattern includes a material the same as at least a portion of a material of the second gate electrode.

13. The device as claimed in claim 11, wherein the through conductive pattern includes tungsten, aluminum, titanium, tantalum, or combination thereof.

14. The device as claimed in claim 11, wherein a bottom surface of the gate electrode is at a level higher than a level of a bottom surface of the through conductive pattern.

15. The device as claimed in claim 11, wherein the source/drain pattern is connected to the through conductive pattern through one of the conductive line of the lower connection structure and the upper connection structure.

16. A three-dimensional semiconductor device, comprising:

a lower connection structure including a conductive line;

a device structure; and an upper connection structure, the lower connection structure, the device structure, and the upper connection structure being sequentially disposed along a first direction, wherein:

the device structure includes:

a substrate on the lower connection structure;

a plurality of source/drain patterns spaced apart from each other in a second direction and a third direction that are parallel to a bottom surface of the substrate, the second and third directions intersecting each other;

a plurality of gate electrodes spaced apart from each other in the second direction and the third direction and between ones of the plurality of source/drain patterns that neighbor each other in the second direction;

a plurality of separation patterns spaced apart from each other and between other ones of the plurality of source/drain patterns that neighbor each other in the second direction; and a plurality of through conductive patterns between the plurality of separation patterns that neighbor each other in the third direction, and the plurality of through conductive patterns connect the conductive line of the lower connection structure and the upper connection structure to each other.

17. The device as claimed in claim 16, wherein the plurality of through conductive patterns are spaced apart in the second and third directions from the plurality of source/drain patterns.

18. The device as claimed in claim 16, wherein each of the plurality of through conductive patterns is connected either through the conductive line of the lower connection structure to a corresponding one of the plurality of source/drain patterns or through the upper connection structure to the corresponding one of the plurality of source/drain patterns.

19. The device as claimed in claim 16, wherein the plurality of through conductive patterns include a material the same as at least a portion of a material of the plurality of gate electrodes.

20. The device as claimed in claim 16, wherein:

the plurality of source/drain patterns are a plurality of first source/drain patterns, and the device structure further includes a plurality of second source/drain patterns that are spaced in the first direction from the plurality of first source/drain patterns.

* * * * *